US010739450B2

(12) United States Patent
Adolf

(10) Patent No.: US 10,739,450 B2
(45) Date of Patent: *Aug. 11, 2020

(54) USING PHASED ARRAYS OF WAVEGUIDE COUPLERS IN WAVEGUIDE CAVITIES TO DETECT LOADING

(71) Applicant: X DEVELOPMENT LLC, Mountain View, CA (US)

(72) Inventor: Brian John Adolf, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 274 days.

This patent is subject to a terminal disclaimer.

(21) Appl. No.: 15/837,396

(22) Filed: Dec. 11, 2017

(65) Prior Publication Data

US 2019/0179000 A1  Jun. 13, 2019

(51) Int. Cl.
*G01S 13/02* (2006.01)
*H02J 50/12* (2016.01)
(Continued)

(52) U.S. Cl.
CPC ........ *G01S 13/0218* (2013.01); *G01R 21/133* (2013.01); *G01S 11/02* (2013.01);
(Continued)

(58) Field of Classification Search
CPC ...... G01S 13/0218; G01S 13/46; G01S 11/02; G05B 15/02; H02J 50/12; G01R 21/133; H01P 5/08; H01Q 1/362
See application file for complete search history.

(56) References Cited

U.S. PATENT DOCUMENTS 4,751,515 A   6/1988 Corum
8,855,592 B2  10/2014 Belogolovy et al.
(Continued)

FOREIGN PATENT DOCUMENTS

CN   107069994 A   8/2017

OTHER PUBLICATIONS

Barlow, H.M., et al., "Surface Waves," Proceedings of the IEE—Part III: Radio and Communication Engineering, vol. 100, Issue 68, Nov. 1953.
(Continued)

*Primary Examiner* — Bryan Bui
(74) *Attorney, Agent, or Firm* — McDonnell Boehnen Hulbert & Berghoff LLP

(57) ABSTRACT

Systems and methods for detecting and locating power loads within a spherical waveguide bounded by the Earth's surface are disclosed. One or more eigenmodes of the Earth-ionosphere waveguide may be computed based on a mathematical model incorporating electrical properties of the terrestrial surface and plasma physics of the ionospheric layer. A phased array of wave guide couplers, each including an array of electrically-connected waveguide-coupling elements, may be configured at different geographic locations for coupling to the one or more eigenmodes and generating standing waves in the Earth-ionosphere waveguide. Power loads may be detected by way of power reflections, and by adjusting relative phases and/or amplitudes of the waveguide couplers, as well as frequencies, power nodes and nulls of the standing waves may be steered with respect to specified locations. Using reflections and steering, locations of power loads may be triangulated.

20 Claims, 38 Drawing Sheets

(51) Int. Cl.
    *H01P 5/08*       (2006.01)
    *G01R 21/133*    (2006.01)
    *G05B 15/02*     (2006.01)
    *G01S 13/46*     (2006.01)
    *H01Q 1/36*      (2006.01)
    *G01S 11/02*     (2010.01)
    *H01Q 21/06*     (2006.01)
    *H01Q 1/12*      (2006.01)

(52) U.S. Cl.
    CPC .............. *G01S 13/46* (2013.01); *G05B 15/02* (2013.01); *H01P 5/08* (2013.01); *H01Q 1/362* (2013.01); *H02J 50/12* (2016.02); *G01S 2013/468* (2013.01); *H01Q 1/1242* (2013.01); *H01Q 21/061* (2013.01)

(56) References Cited

U.S. PATENT DOCUMENTS

| | | | |
|---|---|---|---|
| 9,110,183 B2 | 8/2015 | Zhdanov | |
| 9,859,707 B2 | 1/2018 | Corum et al. | |
| 10,103,452 B2 | 10/2018 | Corum et al. | |
| 10,498,174 B2 * | 12/2019 | Adolf | H01P 3/08 |
| 2009/0140852 A1 | 6/2009 | Stolarczyk et al. | |
| 2011/0156494 A1 | 6/2011 | Mashinsky | |
| 2013/0338923 A1 | 12/2013 | Zhdanov | |
| 2014/0252865 A1 | 9/2014 | Corum et al. | |
| 2014/0252886 A1 | 9/2014 | Corum et al. | |
| 2017/0077616 A1 * | 3/2017 | Corum | H01Q 21/29 |
| 2018/0224490 A1 | 8/2018 | Brunel et al. | |
| 2019/0181531 A1 * | 6/2019 | Adolf | G05B 15/02 |

OTHER PUBLICATIONS

Virtual Ionosphere, Thermosphere, Mesosphere Observatory (VITMO), International Reference Ionosphere—IRI-2012 [online]. www.omniweb.gsfc.nasa.gov [retrieved on Dec. 5, 2017]. Retrieved from the Internet: <URL: https://omniweb.gsfc.nasa.gov/vitmo/iri2012_vitmo.html>.

Wikipedia, Schumann resonances [online]. www.en.wikipedia.org [retrieved on Dec. 5, 2017]. Retrieved from the Internet: <URL: https://en.wikipedia.org/wiki/Schumann_resonances>.

World Atlas of Ground Conductivities, Recommendation ITU-R P.832-4, 48 pages, 1992-1997.

Yaghjian, A.D., et al., "Electrically small supergain end-fire arrays," Radio Science, vol. 43, RS3002, doi:10.1029/2007RS003747, 13 pages, 2008.

VanVoorhies, Kurt L., and Smith, James E., "The Promises and Prospects of Worldwide Wireless Power Transfer: An Overview," Proceedings of the 26th Intersociety Energy Conversion Engineering Conference, New York, IEEE, US, vol. 4, Aug. 4, 1991, pp. 341-346.

Search Report and Written Opinion for PCT/US2018/050829 dated Jan. 4, 2019.

Velez et al., "Bessy VSR 1.5 GHz cavity design and consideration on waveguide damping", 2014, Proceedings of LINAC2014, Geneva Switzerland, p. 221-223 (Year: 2014).

Ferguson et al., "Approximate vlf/lf waveguide mode conversion model. computer applications: Fastmc and bump", 1980, NOSC TD 400 (Year: 1980).

* cited by examiner

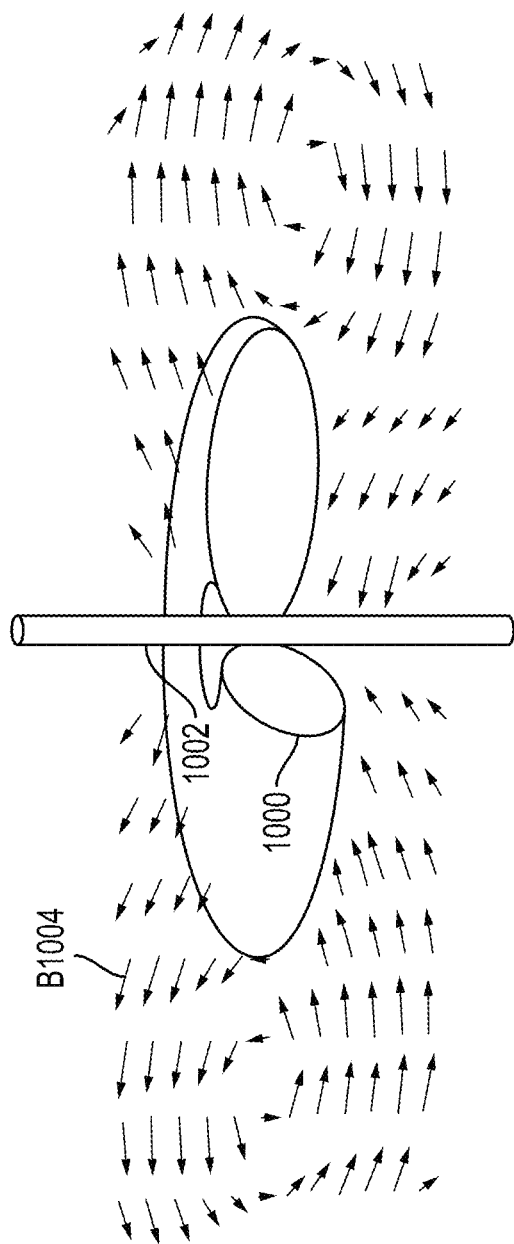

USING PHASED ARRAYS OF WAVEGUIDE COUPLERS IN WAVEGUIDE CAVITIES TO DETECT LOADING

BACKGROUND

Waveguides can be used for electromagnetic power transmission. In particular, the geometry and physical-electromagnetic properties of a waveguide may determine modes of electromagnetic propagation corresponding to persistent or semi-persistent solutions to Maxwell's Equations, subject to boundary conditions of the waveguide. Such mathematical solutions are referred to formally as "eigenmodes," and represent resonant modes of the waveguide that can give rise to standing waves within the waveguide, a volume customarily referred to as the waveguide "cavity." Introducing or injecting electromagnetic energy into a waveguide cavity in such a way that "excites" or "couples to" an eigenmode causes power to be transmitted efficiently within the waveguide, without a physical transmission medium, such as wires.

SUMMARY

In one aspect, an example embodiment presented herein provides a system comprising: a phased waveguide coupler array comprising a plurality of waveguide couplers, wherein each waveguide coupler comprises an electrically small array of waveguide-coupling elements configured for coupling to a spherical waveguide cavity bounded by the terrestrial surface of the Earth and the ionosphere of the Earth, wherein each waveguide coupler is located at a respective geographic location; and a computer apparatus having one or more processors and memory storing instructions that, when executed by the one or more processors, cause the system to carry out operations including: determining one or more eigenmodes of the spherical waveguide; generating an excitation via two or more waveguide couplers of the plurality of waveguide couplers of the phased waveguide coupler array, wherein said generating causes coupling of energy into the one or more eigenmodes of the spherical waveguide cavity; detecting a presence of a power load in a geographic region in the spherical waveguide; and determining a location of the power load by steering power towards the geographic region.

In another aspect, an example embodiment presented herein provides a system comprising: a phased waveguide coupler array comprising a plurality of waveguide couplers, wherein each waveguide coupler comprises an electrically small array of waveguide-coupling elements configured for coupling to a spherical waveguide having a waveguide cavity bounded by the terrestrial surface of the Earth and the ionosphere of the Earth, wherein each waveguide coupler is located at a respective geographic location; and a computer apparatus having one or more processors and memory storing instructions that, when executed by the one or more processors, cause the system to carry out operations including: computing one or more eigenmodes of the spherical waveguide based on a mathematical model of the spherical waveguide that incorporates electrical properties of the terrestrial surface of the Earth and the ionosphere of the Earth; coupling power into the one or more eigenmodes via generated excitations of two or more waveguide couplers of the plurality of waveguide couplers of the phased waveguide coupler array, the one or more eigenmodes forming standing waves of an electric and magnetic vector field in the spherical waveguide; and detecting a presence of a power load in a geographic region in the spherical waveguide; and determining a location of the power load by increasing a power level at the geographic region.

In yet another aspect, an example embodiment presented herein provides a method comprising: computing one or more eigenmodes of a spherical waveguide having a waveguide cavity bounded by the terrestrial surface of the Earth and the ionosphere of the Earth, the computation being based on a mathematical model of the spherical waveguide that incorporates electrical properties of the terrestrial surface of the Earth and the ionosphere of the Earth; generating an excitation via two or more waveguide couplers of a plurality of waveguide couplers of a phased waveguide coupler array, wherein each waveguide coupler comprises an electrically small array of waveguide-coupling elements, wherein each waveguide coupler is located at a respective geographic location, and wherein said generating causes coupling of energy into the one or more eigenmodes of the spherical waveguide cavity; detecting a presence of a power load in a geographic region in the spherical waveguide; and adjusting at least one of an amplitude, frequency, or phase of the generated excitation of the two or more waveguide couplers, wherein said adjusting increases a power level at the geographic region; and determining a location of the power load.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

BRIEF DESCRIPTION OF THE DRAWINGS

FIGS. 10A, 10B, and 10C each depict a conceptual illustration of a dipole field, in accordance with example embodiments.

DETAILED DESCRIPTION

Figure 1:
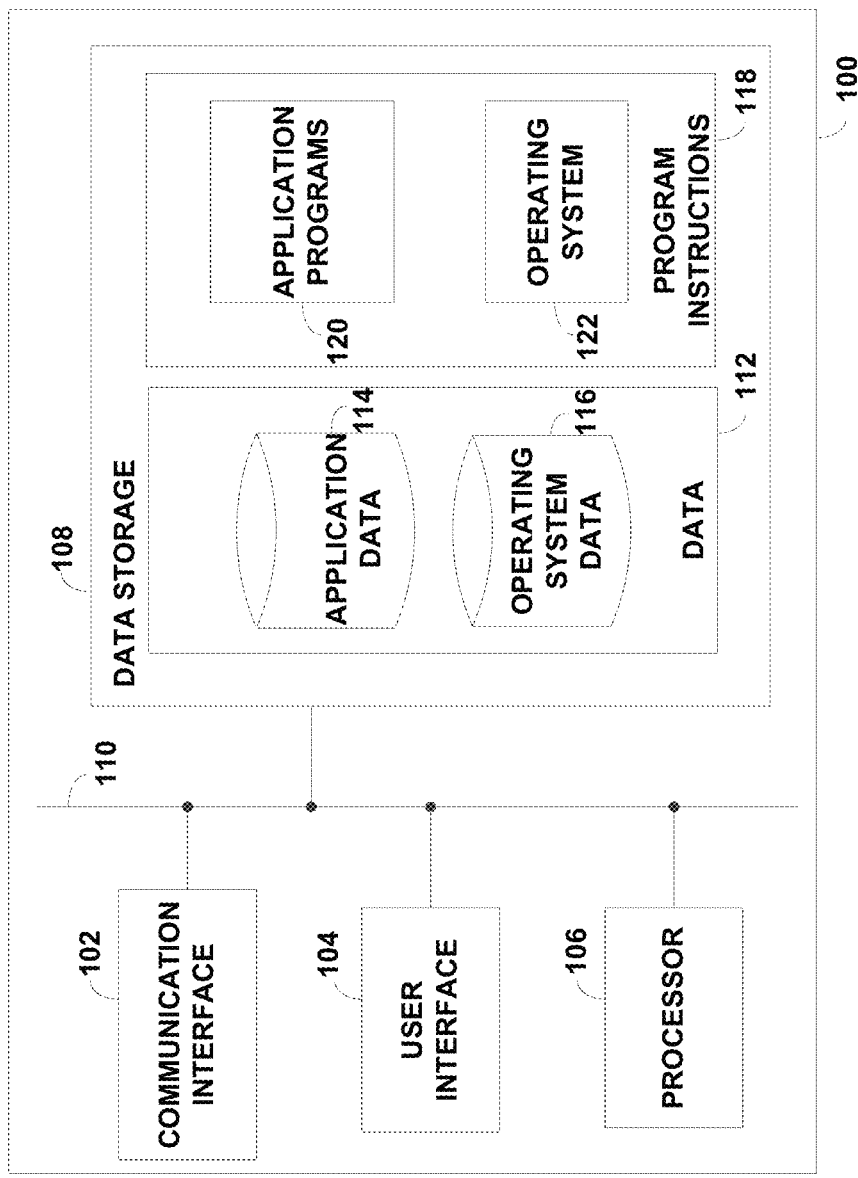
FIG. 1 is a block diagram of a computing system, in accordance with example embodiments.

Exemplary methods and systems are described herein. It should be understood that the word "exemplary" is used herein to mean "serving as an example, instance, or illustration." Any implementation or feature described herein as "exemplary" or "illustrative" is not necessarily to be construed as preferred or advantageous over other implementations or features. In the figures, similar symbols typically identify similar components, unless context dictates otherwise. The example implementations described herein are not meant to be limiting. It will be readily understood that the aspects of the present disclosure, as generally described herein, and illustrated in the figures, can be arranged, substituted, combined, separated, and designed in a wide variety of different configurations, all of which are contemplated herein.

I. Overview

Wireless transmission of electromagnetic power is generally limited by the effects of propagating electromagnetic waves in free space, which radiate power away at distances beyond roughly the wavelength of the transmission source. This makes broadly distributed wireless power transmission impractical without some means for coupling to the electromagnetic wave energy within less than about a wavelength from the source. Using waveguides can allow such coupling, while effectively extending the range of transmission by way of interaction of the wave with the waveguide, at least across the physical extent of the waveguide cavity. The physical extent of the waveguide thus represents dimensions across which power may be transmitted wirelessly. In this sense, a waveguide replaces wires for transmission, but may still be similarly limited in terms of physical distances of transmission and distribution of power by virtue of the physical extent of the waveguide.

In example embodiments, portions of the Earth itself, including the ionosphere, can be treated as a waveguide, and as such, wireless transmission of electromagnetic power may be carried out on a physical scale comparable to the entire Earth. More specifically, by accounting for electrical physical properties of the terrestrial surface of the Earth and for plasma physics of the Earth's ionosphere, the space between these two layers (i.e., the Earth's surface and the ionosphere) can be modeled as a spherical waveguide or waveguide cavity, and its electromagnetic properties analyzed. In particular, computations, including simulations, may be used to determine eigenmodes of this "whole Earth" or Earth-ionosphere waveguide. It will be appreciated that neither the Earth nor the ionosphere is perfectly spherical. As such, the Earth-ionosphere waveguide cavity also is not perfectly spherical. Geometrically, however, the deviations from perfect sphericity are generally negligible compared with the dimensions of the Earth and the ionosphere. Accordingly, references to a spherical waveguide or waveguides herein should be understood to encompass both perfect sphericity and deviations from perfect sphericity on the order of those comparable to the Earth and its ionosphere.

In accordance with example embodiments, the electrical physical properties of the Earth can be approximated and/or modeled as largely consisting of defined regions of wet and dry land, sea water, and/or fresh water, each region having specifiable permittivity and conductivity. Still other regions having different physical characteristics and/or material constituent properties and electrical properties may be incorporated into a model of the Earth's terrestrial surface as well. The model may approximate the surface as spherical (or nearly so), and may include topographical components or features as well.

Also in accordance with example embodiments, one or more existing models of the Earth ionosphere may be utilized to determine physical and behavioral properties of the ionosphere that manifest as an effective outer or upper boundary of the Earth-ionosphere waveguide cavity, at least for one or more transmission frequency ranges. Such existing models may represent the ionosphere according to appropriate plasma physics, taking into account factors such as electron collisions with neutral particles (atoms and molecules), the gyrotropic properties due to the Earth's magnetic field, and the number density of electrons and possibly other species as a function of location and time. Time and location dependencies may, at least in part, derive from diurnal variations of solar and other excitation sources that partially ionize and create the plasma out of the atmospheric gas mixture, given that gas mixture and density as a function of position. Example properties may include effective electrical conductivity and/or permittivity as a function of frequency, altitude (height above the surface), Earth's magnetic field direction and magnitude, geographic location, and time of day.

Taking the Earth-ionosphere waveguide as represented by a cavity bounded between the terrestrial surface model and the ionosphere model, one or more eigenmodes may be determined by solving Maxwell's Equations subject to the boundary conditions of the cavity. In an example embodiment, solutions to Maxwell's Equations applied to the Earth-ionosphere waveguide may be determined using one or more simulation tools. In some embodiments, the simulation tools may parameterize a physical system to derive numerical solutions of analytical equations representing the physical system. More particularly, simulation tools may be applied to the Earth-ionosphere waveguide.

In an example embodiment, simulation results may yield predicted eigenmodes that propagate with spatial periodicity (e.g., wavelengths) and electromagnetic form within the Earth-ionosphere waveguide cavity so as to give rise to low-loss standing or traveling waves. The predicted existence of these eigenmodes, as well as the techniques for making the predictions, can provide a basis for analytically-guided empirical methods and systems for exciting one or more of the eigenmodes. By exciting the one or more eigenmodes, electromagnetic power may be wirelessly transmitted within at least a portion of the Earth-ionosphere waveguide cavity. These eigenmodes are low-loss in the sense that only a relatively small portion of the power that couples to the eigenmodes is subject to electromagnetic loss processes within the Earth-ionosphere waveguide cavity, although there can be some geometric dilution of power as a function of distance from a source of excitation. Example embodiments disclosed herein of analytically-guided empirical systems and methods for exciting one or more of eigenmodes may therefore be used to wirelessly transmit electromagnetic power between any two or more points along or within the waveguide cavity. Example embodiments of excitation systems and methods also may serve to confirm the existence of one or more eigenmodes, and to discern and validate physical and quantitative properties of the eigenmodes.

The predicted eigenmodes have certain characteristics similar to those of previous solutions of Maxwell's Equations that have been derived by considering less comprehensive representations of the Earth environment, or by considering only certain aspects of the Earth environment. But the restrictions of previous analyses and modeling in terms of detail and/or physical regimes considered have left the low-loss eigenmodes undiscovered or simply beyond the realm of exploration. In this sense, the advantages of detailed modeling of the Earth-ionosphere waveguide cavity in accordance with example embodiments are therefore clearly demonstrated.

In addition to example embodiments for systems and methods for detecting and confirming low-loss eigenmodes inferred or predicted from detailed modeling techniques, example embodiments are also described herein for other aspects and applications of wireless power transmission in the Earth-ionosphere waveguide. In particular, other example embodiments are described for: configurations and use of antenna arrays to efficiently excite and couple to one or more eigenmodes of the Earth-ionosphere waveguide at one location, and to efficiently receive power from one or more eigenmodes at another location; configurations and use of arrays of antenna arrays to excite one or more eigenmodes in a globally-phased manner to generate standing or traveling waves and make the power the waves carry available on a global basis; configurations and use of arrays of antenna arrays to excite one or more eigenmodes in a globally-phased manner to detect and determine locations of loads that represent sinks/taps of power; and configurations and use of arrays of antenna arrays to excite one or more eigenmodes in a globally-phased manner to direct or "steer" nulls or other controlled levels of energy density to one or more specific locations. It will be appreciated that these specific aspects do not represent an exhaustive or limiting list of aspects of wireless power transmission in the Earth-ionosphere waveguide disclosed herein, and that other aspects, whether expressly identified or not, may be represented—explicitly or implicitly—as well.

Example Computing System and Network

Figure 2:
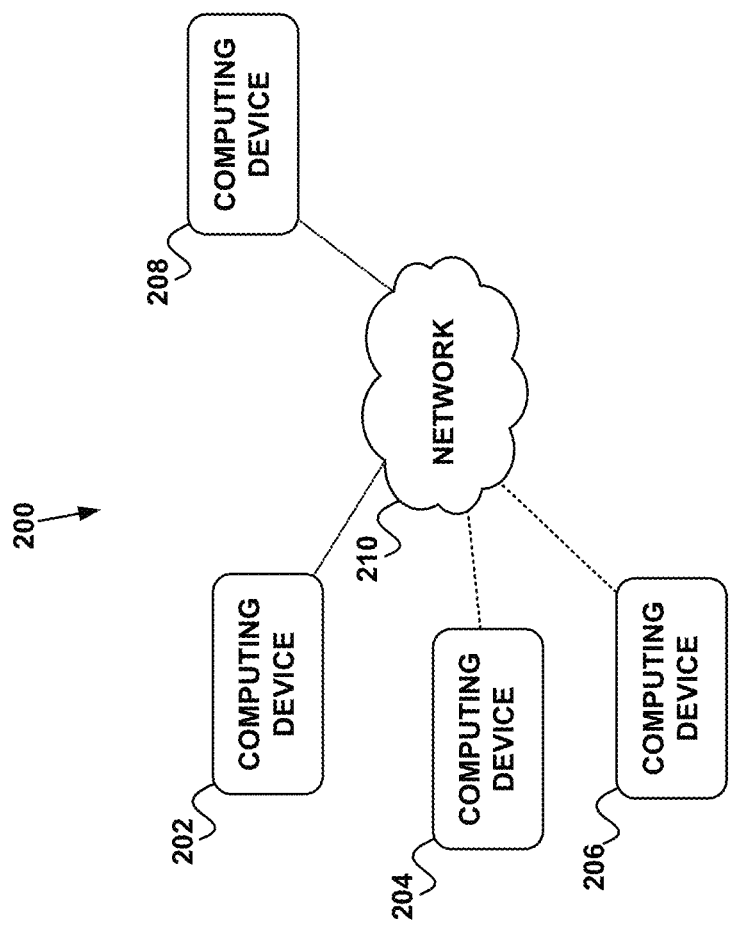
FIG. 2 is a simplified diagram or a computer network, in accordance with example embodiments.

Example methods, devices, systems and apparatuses described herein may be implemented, at least in part, with or in the context of one or more computing systems and one or more computer networks. Example computing systems and networks may be configured and/or constructed using a variety of hardware, software, and firmware components. FIGS. 1 and 2 illustrate example computing systems and networks.

FIG. 1 is a simplified block diagram showing some of the components of an example computing device 100. As shown in FIG. 1, computing device 100 may include a communication interface 102, a user interface 104, a processor 106, and data storage 108, all of which may be communicatively linked together by a system bus, network, or other connection mechanism 110.

Communication interface 102 functions to allow computing device 100 to communicate, using analog or digital modulation, with other devices, access networks, and/or transport networks. Thus, communication interface 102 may facilitate circuit-switched and/or packet-switched communication, such as POTS communication and/or IP or other packetized communication. For instance, communication interface 102 may include a chipset and antenna arranged for wireless communication with a radio access network or an access point. Also, communication interface 102 may take the form of a wireline interface, such as an Ethernet, Token Ring, or USB port. Communication interface 102 may also take the form of a wireless interface, such as a Wifi, BLUETOOTH®, global positioning satellite (GPS) system, or wide-area wireless interface (e.g., WiMAX or LTE). A GPS system could be used for example to provide precise timing and/or geolocation information for various applications or functions described herein that may use or need such information. However, other forms of physical layer interfaces and other types of standard or proprietary communication protocols may be used over communication interface 102. Furthermore, communication interface 502 may comprise multiple physical communication interfaces (e.g., a Wifi interface, a BLUETOOTH® interface, and a wide-area wireless interface).

User interface 104 may function to allow computing device 100 to interact with a human or non-human user, such as to receive input from a user and to provide output to the user. Thus, user interface 104 may include input components such as a keypad, keyboard, touch-sensitive or presence-sensitive panel, computer mouse, trackball, joystick, microphone, still camera and/or video camera. User interface 104 may also include one or more output components such as a display screen (which, for example, may be combined with a touch-sensitive panel), CRT, LCD, LED, a display using DLP technology, printer, light bulb, and/or other similar devices, now known or later developed. User interface 104 may also be configured to generate audible output(s), via a speaker, speaker jack, audio output port, audio output device, earphones, and/or other similar devices, now known or later developed. In some embodiments, user interface 504 may include software, circuitry, or another form of logic that can transmit data to and/or receive data from external user input/output devices. Additionally or alternatively, computing device 100 may support remote access from another device, via communication interface 102 or via another physical interface (not shown).

Processor 106 may comprise one or more general purpose processors (e.g., microprocessors) and/or one or more special purpose processors (e.g., DSPs, GPUs, FPUs, network processors, or ASICs). Data storage 108 may include one or more volatile and/or non-volatile storage components, such as magnetic, optical, flash, or organic storage, and may be integrated in whole or in part with processor 106. Data storage 108 may include removable and/or non-removable components.

In general, processor 106 may be capable of executing program instructions 118 (e.g., compiled or non-compiled program logic and/or machine code) stored in data storage 108 to carry out the various functions, operations, and or method steps described herein. Therefore, data storage 108 may include a non-transitory computer-readable medium, having stored thereon program instructions that, upon execution by computing device 100, cause computing device 100 to carry out any of the methods, processes, or functions disclosed in this specification and/or the accompanying drawings. Non-limiting examples of non-transitory instructions include software, firmware and hardware instructions. The execution of program instructions 118 by processor 106 may result in processor 106 using data 112.

By way of example, program instructions 118 may include an operating system 122 (e.g., an operating system kernel, device driver(s), and/or other modules) and one or more application programs 120 (e.g., address book, email, web browsing, social networking, and/or gaming applications) installed on computing device 100. Similarly, data 112 may include operating system data 116 and application data 114. Operating system data 116 may be accessible primarily to operating system 122, and application data 114 may be accessible primarily to one or more of application programs 120. Application data 114 may be arranged in a file system that is visible to or hidden from a user of computing device 100.

Application programs 120 may communicate with operating system 122 through one or more application programming interfaces (APIs). These APIs may facilitate, for instance, application programs 120 reading and/or writing application data 114, transmitting or receiving information via communication interface 102, receiving or displaying information on user interface 104, and so on.

In some vernaculars, application programs 120 may be referred to as "apps" for short. Additionally, application programs 120 may be downloadable to computing device 100 through one or more online application stores or application markets. However, application programs can also be installed on computing device 100 in other ways, such as via a web browser or through a physical interface (e.g., a USB port) on computing device 100.

FIG. 2 is a simplified block diagram of a communication system 200, in which various embodiments described herein can be employed, or which may serve one or another communication function described herein. Communication system 200 includes computing devices 202, 204, 206 and 208, each of which could be a computing device such as or similar to the computing device 100 described above. Each of these computing devices may be able to communicate with other devices (including with each other) via a network 210 through the use of wireline connections (designated by solid lines) and/or wireless connections (designated by dashed lines).

Network 210 may be, for example, the Internet, or some other form of public or private Internet Protocol (IP) network. Thus, computing devices 202, 204, 206 and 208 may communicate using packet-switching technologies. Nonetheless, network 210 may also incorporate at least some circuit-switching technologies, and computing devices 202, 204, 206 and 208 may communicate via circuit switching alternatively or in addition to packet switching.

II. Example Systems and Methods for Predicting and Detecting Eigenmodes of the Earth-Ionosphere Waveguide Achieving efficient transmission of power in a waveguide depends, at least in part, on coupling electromagnetic energy to one or more eigenmodes of the waveguide. In a typical case in which a waveguide may be constructed according to specifications, achieving such coupling can be reasonably assured by design. Additionally, when design and construction of the waveguide are possible, electrical properties of the waveguide boundaries may be controlled to help minimize transmission losses. For the endeavor of treating the volume bounded by Earth's surface and its ionosphere as a waveguide, the form and electrical properties of the waveguide occur naturally and are not subject to design. Rather, techniques and procedures are needed for realizing wireless power transmission using the Earth-ionosphere waveguide and making it practical. Accordingly, example embodiments are disclosed herein for systems and methods that implement an approach to achieving wireless transmission of electromagnetic power in the Earth-ionosphere waveguide cavity that occupies the volume bounded by Earth's surface and its ionosphere that involves an analytic aspect as well as an empirical aspect. For purposes of the discussion herein, these aspects will be generally referred to as "components" of the approach. It should be understood, however, that the description of the approach in terms of "components" is a convenience for organizing the discussion, and not intended to be limiting with respect to disclosed example embodiments. Continuing then, an analytic component provides for both predicting what the eigenmodes look like and predicting a degree of coupling between transmitted power of a given excitation source and the eigenmodes. Further, an empirical component is used for exciting and coupling to one or more of the predicted eigenmodes, detecting and receiving power from one or more of the excited eigenmodes, and validating and refining analytic descriptions of the eigenmodes based on controlled and/or observed characteristics of transmitted and received power.

The existence of low-loss eigenmodes of the Earth-ionosphere waveguide may be based, in part, on electrical properties of the Earth's surface and plasma physics of the ionosphere, as well as the known existence and/or study of other propagation modes having characteristics that suggest or indicate that electromagnetic transmission properties of the Earth would support low-loss eigenmodes as well. A brief summary review of the Earth's surface, plasma physics of the ionosphere, and some of these other propagation modes helps provide a context for the techniques for making analytical predictions of low-loss eigenmodes.

Electrical Properties of the Earth's Surface.

Electrical properties of the Earth's surface generally refer to ground conductivities, and can be presented in the form of conductivity maps. A standard source of ground conductivities is the World Atlas of Ground Conductivities (Recommendation ITU-R P.832-4). These maps, shown in units of conductivity in the report are mS/m=$10^3$ µS/m, or millisiemens per meter, apply to radio frequencies in a VLF (very low frequency range), up to 30 kHz, and a MF (medium frequency) range standardized to 1 MHz.

In the context of the present disclosure, the conductivity maps can be used to make gross estimates that treat the Earth's surface as homogeneous, having average conductivity properties. For example, a qualitative examination of the conductivity maps supports a reasonable assumption of that Earth surface is ⅔ sea water and ⅓ land, and that ⅓ of land is good conductor, ⅔ of land is bad conductor. From this, estimated "uniform" ground conductivities of 0.01-4 S/m may be inferred. This broad range provides reasonable bounds on low-end and high-end conductivities for the uniform estimate. For some of the modeling described below, a single, homogeneous conductivity value may suffice for investigative stages of the techniques described.

The conductivity maps may be used in more detailed applications of the models to determine spatial distributions of ground conductivities. For example, the models could incorporate non-uniform surface distributions. Doing so may allow the effect of land-ocean boundaries to be included in the eigenmode solutions. As described later, accounting for spatial discontinuities in ground conductivities, both in modeling and empirical measurements, can help guide operational aspects of power transmission.

Electromagnetic and Dynamical Properties of the Ionosphere.

The ionosphere is a layer of the Earth's atmosphere between about 75-1000 km above the surface that is ionized by solar and cosmic radiation. It consists predominantly of three layers, conventionally referred to as the D, E, and F layers. The layers are characterized mainly by their degree of ionization, which, in turn, depends on their exposure to the sources of ionizing radiation. The F layer, the highest and most exposed layer, has the highest degree of ionization. It is present during both daytime and nighttime. The E layer, below the F layer, receives less ionizing radiation, and is therefore less ionized. During the nighttime, it becomes weakened (its ionization decreases). The D layer, the lowest of the three layers, is the least ionized. It largely disappears during the nighttime.

Figure 3A:
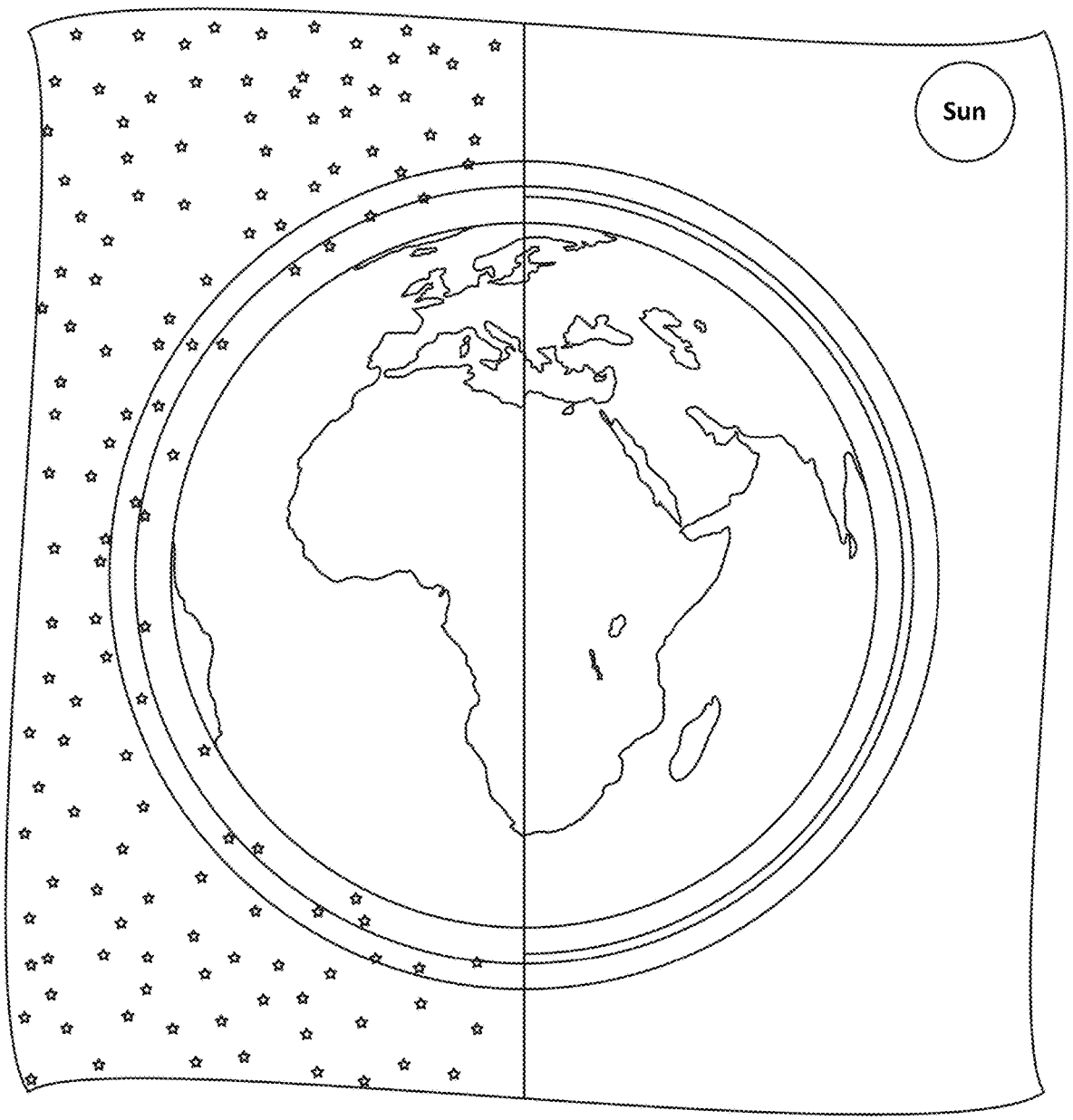
FIG. 3A is a conceptual illustration of the ionosphere, showing day and night sides of the Earth.
Figure 3B:
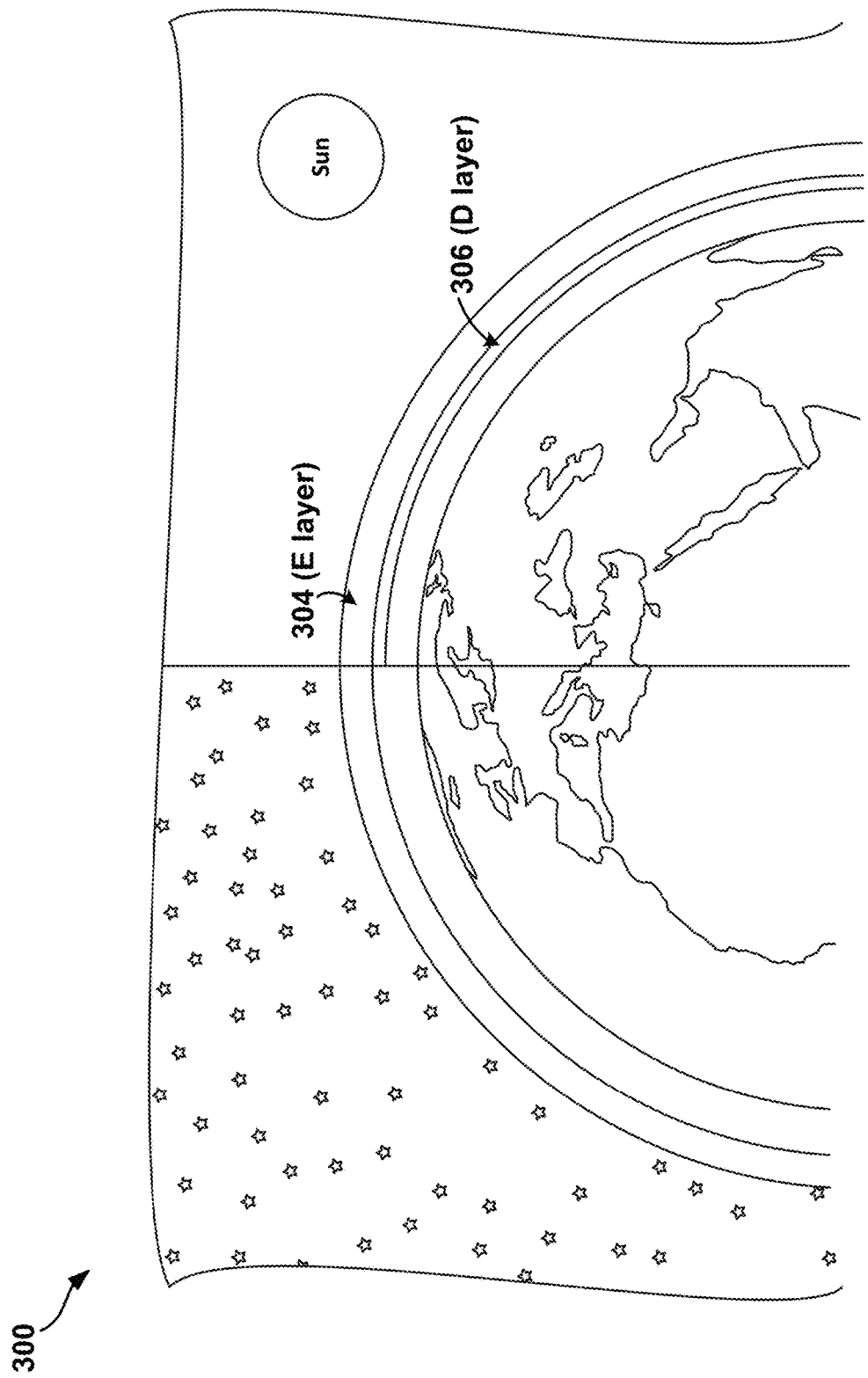
FIG. 3B is an enlarged view of a portion of the conceptual illustration of the ionosphere shown in FIG. 3A.

FIG. 3A shows a conceptual illustration of the ionosphere, depicting a daytime and nighttime side of the Earth. The daytime side shows the D and E layers, and the nighttime side shows just the E layer. F layer is omitted for clarity. FIG. 3B shows an enlarged view a portion of the illustration of FIG. 3A. In this view, the D layer 306 and E layer 304 can be clearly distinguished. The F layer has again been omitted for clarity.

The ionosphere influences radio frequency (RF) propagation between distant terrestrial locations and between the Earth's surface and satellites beyond the ionosphere. At very high radio frequencies (e.g. several MHz), radiation may propagate through the entire ionosphere with little or no attenuation. At low frequencies (LF), some or all energy of incident radiation may be lost due to interactions in the ionized plasma. Specifically, the E layer will generally reflect incident low frequency waves, thereby acting like a waveguide enabling propagation around some portion of the globe. Depending on frequency, the D layer will act to attenuate incident low frequency radiation, consuming some of its energy. Some portion of the incident radiation may make it to the E layer and reflect back for a return traversal of the D layer and further attenuation. Depending on the thickness of the D layer, which varies over the course of the day as described above, the reflected wave may then propagate back to the Earth's surface. When the D layer is thickest (roughly midday), all of the incident radiation may be lost to the D layer. When the D layer is thinnest or absent, some or most of the radiation may be reflected back.

Figure 4A:
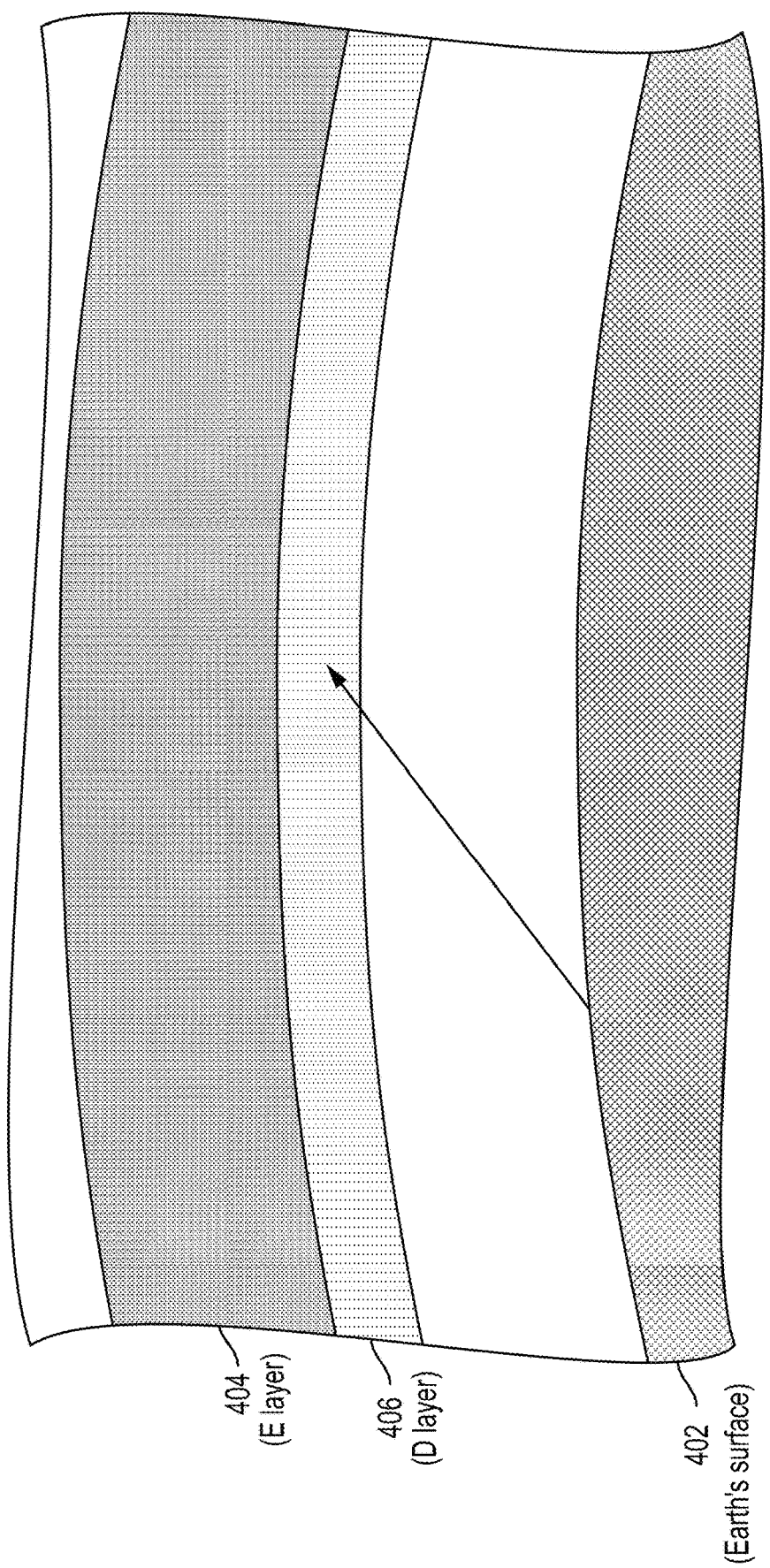
FIG. 4A is a conceptual illustration of low frequency radio propagation in the presence of the D layer of the ionosphere.
Figure 4B:
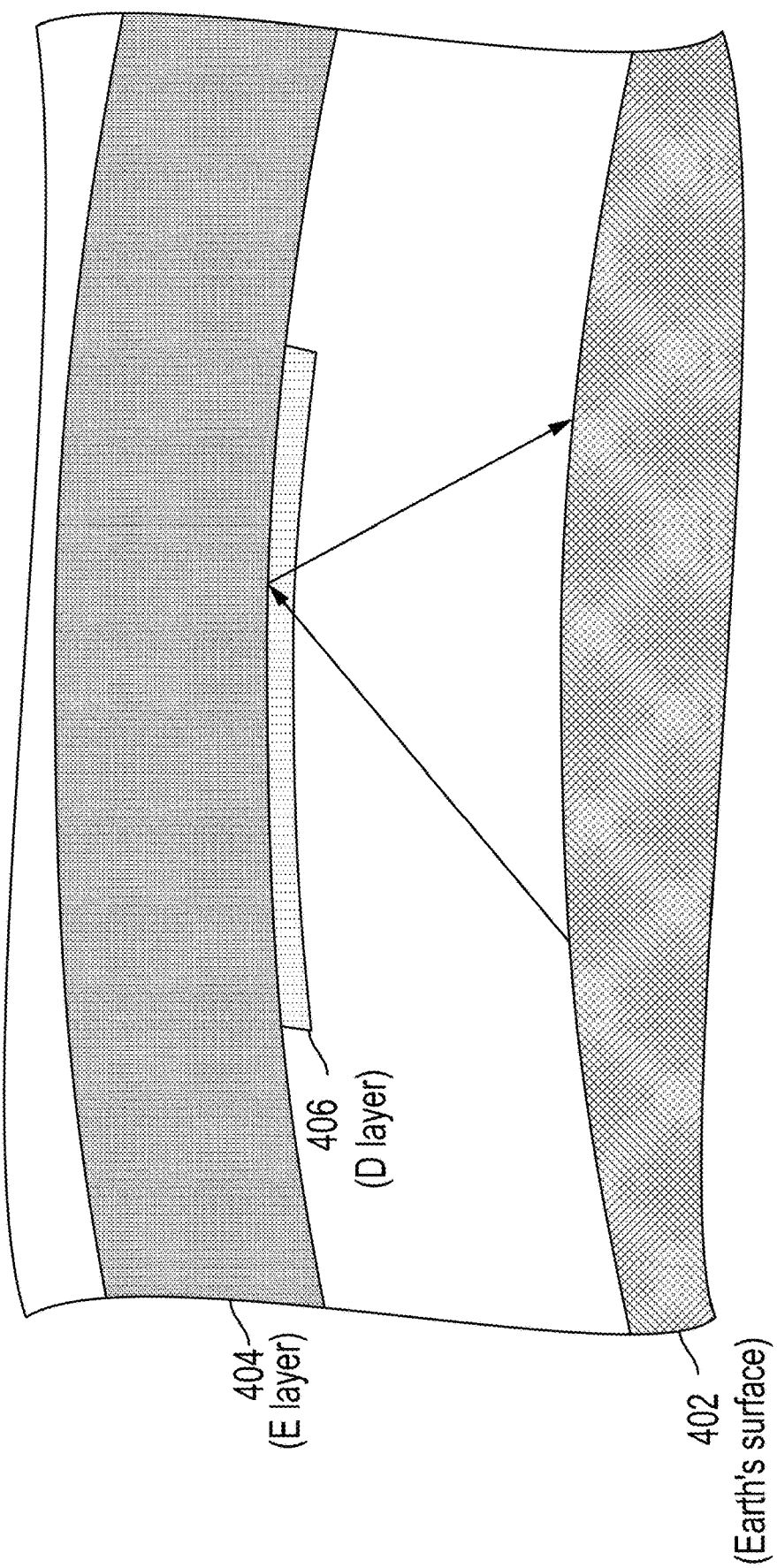
FIG. 4B is a conceptual illustration of low frequency radio propagation in the presence of a diminished D layer of the ionosphere.
Figure 4C:
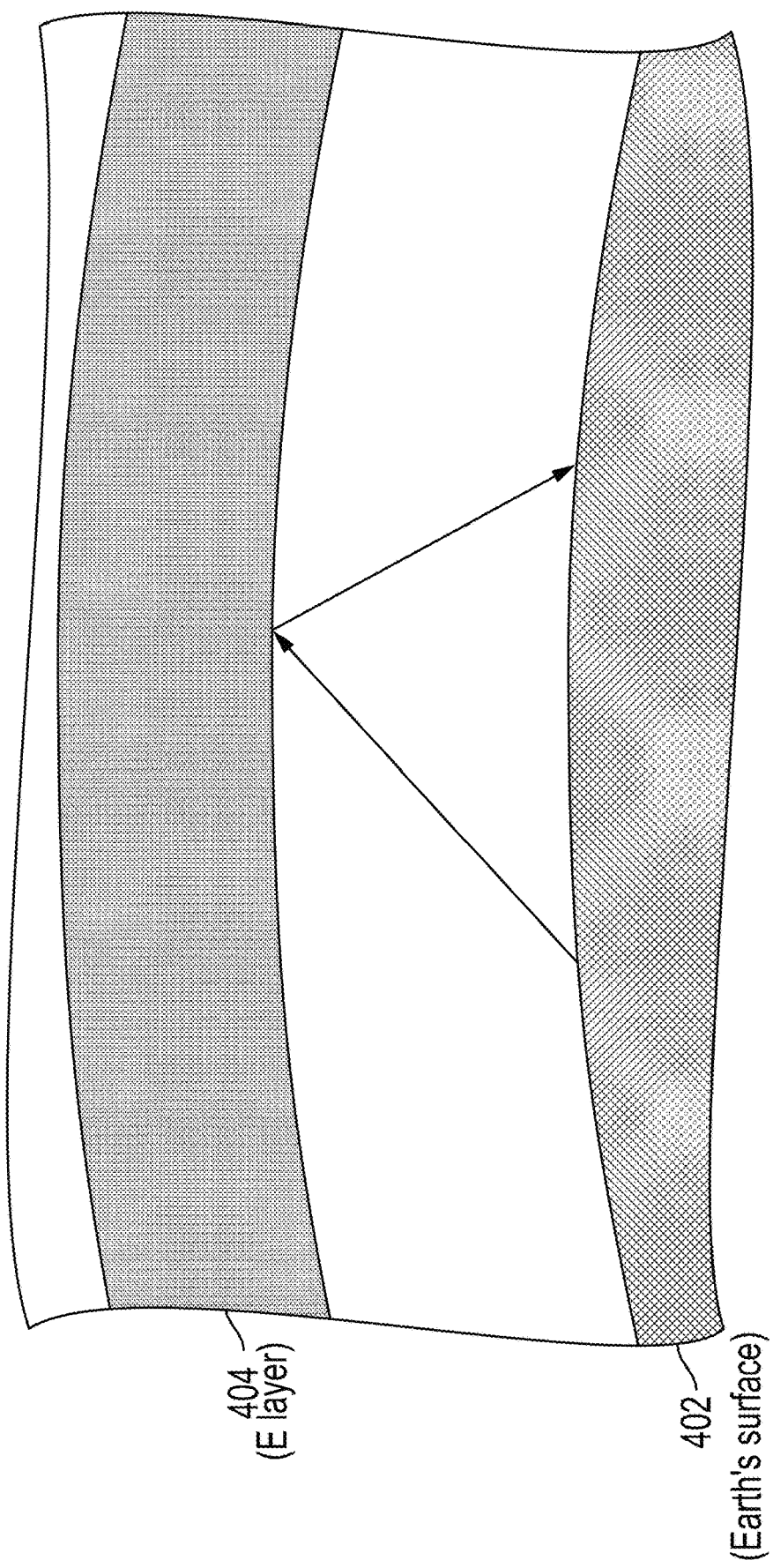
FIG. 4C is a conceptual illustration of low frequency radio propagation in the absence of the D layer of the ionosphere.

FIGS. 4A, 4B, and 4C illustrate the effects of the D and E layers on LF radiation. An arrow in FIG. 4A represents LF radiation directed from the Earth's surface 402 to the ionosphere during daytime when the D layer 406 is thickest (and extends to its lowest altitude). The LF radiation penetrates the D layer and is attenuated before reaching the E layer 404. FIG. 4B represents a time at which the D layer is thinner, though still present. In this case, the LF radiation makes it to the E layer and is reflected, though it will suffer attenuation on both its upward and downward (reflected) paths. FIG. 4C represent nighttime, when the D layer is absent. In the case, the LF radiation is reflected directly off the E layer without any losses to the D layer.

The degree of ionization in the different ionosphere layers can also be represented as different values of electrical conductivity. As such, the ionosphere can act like a waveguide boundary or wall characterized by conductivity. Depending on the frequency of the radiation and the diurnally-dependent conductivity, the waveguide wall may present different degrees of reflectivity and absorption. This dynamic behavior is governed by the plasma physics of the ionosphere, which can be mathematically modeled using various techniques. One widely used model is the International Reference Ionosphere (IRI) World Atlas of Ground Conductivities (available from https://omniweb.gsfc.nasa.gov/vitmo/iri2012_vitmo.html), which is based on electron density, electron and ion temperature, and the ionic composition. Other models may be available as well.

In the context of the present disclosure, an ionosphere model, such as the IRI model, may be included in simulations used to derive eigenmodes of the Earth-ionosphere waveguide, as described in detail below. As also discussed below, accounting for the presence and behavior of the ionosphere is advantageous to understanding how low-loss eigenmodes may manifest.

Zenneck surface wave mode.

Zenneck waves are solutions of Maxwell's Equations for wave propagation over a surface that is a boundary between a first region below the surface and a second region above. The two regions are characterized by different electrical properties, such as conductivity and permittivity. For an electrically lossy first region, an environment that is generally descriptive of the terrestrial surface of the Earth, the solutions yield electromagnetic waves that are guided along the surface as they propagate. By way of reference, a set of solutions derived by Barlow and Cullen (Barlow, H. M., and Cullen, A. L., "Surface Waves," Proceedings of the IEE—Part III: Radio and Communication Engineering, Volume 100, Issue 68, November 1953) in cylindrical coordinates $(r,z,\phi)$, where r is a radial coordinate parallel to the surface, z is a vertical coordinate, and φ is an azimuthal angle about z, can be described by Hankel functions in the radial direction and by exponential decay in the positive and negative vertical (±z) directions.

The solutions inside (below) the surface (z≤0) are given by Equations 1a, 1b, and 1c:

$$H_{\phi 1} = A e^{i\omega t} e^{u_1 z} H_1^{(2)}(-i\gamma r) \quad [1a]$$

$$E_{r1} = -A\left(\frac{u_1}{\sigma_1 + i\omega\kappa_1}\right) e^{i\omega t} e^{u_1 z} H_1^{(2)}(-i\gamma r) \quad [1b]$$

$$E_{z1} = A\left(\frac{i\gamma}{\sigma_1 + i\omega\kappa_1}\right) e^{i\omega t} e^{u_1 z} H_0^{(2)}(-i\gamma r). \quad [1c]$$

The solutions outside (above) the surface (z≥0) are given by Equations 2a, 2b, and 2c:

$$H_{\phi 2} = A e^{i\omega t} e^{-u_2 z} H_1^{(2)}(-i\gamma r) \quad [2a]$$

$$E_{r2} = A\left(\frac{u_2}{i\omega\kappa_0}\right) e^{i\omega t} e^{-u_2 z} H_1^{(2)}(-i\gamma r) \quad [2b]$$

$$E_{z2} = A\left(\frac{\gamma}{\kappa_0}\right) e^{i\omega t} e^{-u_2 z} H_0^{(2)}(-i\gamma r). \quad [2c]$$

In these equations, $H_{\phi 1}$ and $H_{\phi 2}$ are the transverse (azimuthal) components of the magnetic field H in region 1 (below the surface) and region 2 (above the surface), respectively; $E_{r1}$ and $E_{r2}$ are the radial components of the electric field E in regions 1 and 2, respectively, and $E_{z1}$ and $E_{z2}$ are the vertical components of E in regions 1 and 2, respectively. The conductivity and permittivity in region 1 are $\sigma_1$ and $\kappa_1$, respectively, and the permittivity of region 2 is taken to that of free space, $\kappa_0$. The frequency of the wave is f=ω/2π, the vertical propagation constants are $u_1$ and $u_2$ in regions 1 and 2, respectively, and the radial propagation constant is y.

From the solutions above, Zenneck waves have a Poynting vector directed slightly downward (into the surface) but mostly in the outward radial direction. The field has a transverse magnetic component, and is evanescent in the direction of propagation with a geometric factor of $1/\sqrt{r}$ due to being bound to the surface. At low frequencies (e.g., 10s of kHz) the $1/\sqrt{r}$ geometric factor dilutes the power density faster than the exponential decay attenuates it. The radial exponential decay may not be a limiting practical factor in power transmission. In the direction normal to the surface, the wave is subject to total internal reflection, and decays exponentially in the vertical direction above the surface. The exponential vertical component feeds ohmic or I²R losses so that, to the extent that the scale height of the decay is smaller than a height of an electrically lossy boundary surface, I²R losses may not be significant.

Among the characteristics of Zenneck surface wave solutions that help inform the techniques for predicting low-loss eigenmodes of the Earth-ionosphere waveguide are: (i) the indication that the terrestrial surface of the Earth can support propagation of a trapped electromagnetic surface wave, and (ii) the indication that for low-frequency Zenneck waves—the ones most subject to surface trapping—the vertical scale height of the wave extends at least to the lower layers of the ionosphere, so that I²R losses do actually become significant. The first characteristic indicates that the Earth's surface can be modeled as the inner boundary of a spherical waveguide cavity. Note that the more lossy the surface, the more constrained the wave is to the surface. This has implications when considering Zenneck waves propagating on a spherical surface. The second characteristic suggests that among various modes to which a source transmitter may couple, Zenneck waves are not likely to primarily or substantially support low-loss power transmission owing to I²R losses in the ionosphere.

Schumann Cavity Resonance.

Schumann resonance is an electromagnetic phenomenon in which atmospheric lightning discharges excite resonant modes of a waveguide cavity formed by the Earth's surface and its ionosphere. The existence of such resonant modes, first predicted mathematically by Schumann in 1952 and later detected in the early 1960s (see, for example, "Schumann resonances" at https://en.wikipedia.org/wiki/Schumann_resonances), provides confirmation that an Earth-ionosphere waveguide is more than a theoretical construct. In this sense, the existence of Schumann resonance also provides strong support for the existence of low-loss eigenmodes. But, the physical characteristics of Schumann resonances and of lightning that excites them also indicate that they are not likely to be modes that can be harnessed for wireless power transmission. Nevertheless, an understanding of Schumann resonances can be instructive and inform the analytical and empirical techniques for wireless power transmission disclosed herein.

The modes excited by lightning are predominantly the lowest resonant frequency modes derived by Schumann. For an ideal spherical waveguide cavity, the resonant frequency $f_n$ of the $n^{th}$ mode is given by $$f_n = \frac{c}{2\pi a}\sqrt{n(n+1)},$$

where a is the radius of the inner sphere (e.g., the Earth's surface in the case of Schumann resonance) and c is the speed of light. In the case of the actual Earth-ionosphere waveguide, the speed of light is lower due partly to losses in the ionosphere. As a consequence of this, among other non-ideal aspects of the real conditions, the observed resonant frequencies of Schumann resonances are lower than in the ideal case, with detections of the first few modes at extremely low frequencies (ELFs) of 7.83, 14.3, 20.8, 27.3, and 33.8 Hz.

For a resonant cavity in general, a quality factor Q may be defined as a ratio of energy stored in the cavity to energy lost per cycle in the cavity walls. As such, Q measures loss characteristics of the cavity, where losses are typically ohmic. For a low-loss cavity, Q is high, and vice versa. It can be shown in a somewhat idealized case that for a resonant mode with frequency $f_0 = \omega_0/2\pi$, $Q \sim \omega_0/\Delta\omega$, where $\Delta\omega$ is a spread about $\omega_0$ (e.g., full width at half-maximum). Thus, Q may depend on the resonant frequency as well as on physical characteristics of the cavity. Determination of Q for Schumann resonances is much more complex than in a simplified ideal case, but it can be shown that for the lowest frequencies, Q is quite low—in the single digits. While Q is higher for higher frequency modes, these modes tend to overlap with one another such that natural excitations of just one high-frequency mode by itself are rare (if they occur at all), especially when the source is lighting, which is wideband in frequency and localized in space (and therefore incoherent in both space and time). This explains why lightning tends to excite only the first few Schumann modes. The low Q values, as well as the incoherence of lightning events, explain why the energy carried in Schumann resonances is observed to dissipate fairly quickly.

In regard to low-loss eigenmodes of the Earth-ionosphere waveguide that may be suitable for efficient wireless transmission of power, Schumann resonances demonstrate the physical reality of the Earth-ionosphere waveguide cavity. But the dominant modes have values of Q too low to be useful for efficient power transmission, since too much energy is lost due to interactions in the ionosphere (ohmic losses). At higher frequencies, where Q is also higher, the overlapping modes make it difficult to excite just a single mode by itself. As a practical matter, Schumann modes are only known to be excited by lightning, so their applicability to engineered wireless power transmission may be limited. In any case, to the extent that a transmitter might couple some fraction of power to one or more Schumann modes, any resulting power transmission would not be efficient at least for the reasons above.

Whispering Gallery Mode.

Whispering gallery waves are waves that propagate along the inner surface of a sphere. Initially studied and described for sound waves, whispering gallery modes of VLF and low frequency radio frequency (RF) transmissions propagating along the underside of the ionosphere are also known to occur. Analytically, these RF modes have been described in terms of repeated reflections of waves at the underside of the ionosphere, without consideration of the presence of the Earth itself. The resulting phenomenon is a surface wave guided by the ionosphere. However, just as Zenneck waves suffer ohmic losses to the outer waveguide boundary of the ionosphere, whispering gallery waves suffer such losses to the inner waveguide boundary of the Earth's surface. So, although whispering gallery modes again demonstrate that the volume between the Earth's surface and it ionosphere can act like a waveguide cavity, the proximity of these waves to the ionosphere and the terrestrial surfaces losses they suffer appear to limit the practicality of wireless power transmission on a global scale, to the extent that a transmitter could couple any power to such modes.

Determining Eigenmodes of the Earth-Ionosphere Waveguide.

The modes and phenomena discussed above indicate that solutions of Maxwell's Equations for the Earth-ionosphere waveguide can be plausibly expected to yield low-loss eigenmodes. At the same time, the known modes summarized above do not appear to be candidates for such eigenmodes. As discussed above, the Zenneck wave modes indicate that the terrestrial surface of the Earth can serve as the inner boundary to a global waveguide, but that the ionosphere cannot be neglected. Schumann and whispering gallery modes indicate that the ionosphere can serve as the outer boundary of the global waveguide. However, the physical interactions of an electromagnetic wave with the plasma of the ionosphere are complex, frequency dependent, and anisotropic. Accordingly, systems and methods disclosed herein involve both analytical simulations and empirical verification to predict, identify, and excite low-loss eigenmodes of the Earth-ionosphere waveguide. The analytical simulations and empirical verification form the analytical and empirical components described above.

In accordance with example embodiments, simulations model the terrestrial surface of the Earth as the inner boundary of a spherical waveguide cavity and the ionosphere as the outer boundary. In the simulations, existing models of the ionosphere, accounting for plasma physics, may be used. Various computational and numerical techniques may be used to improve the speed and efficiency of the computational operations.

The simulations serve primarily two aspects of the analytic component of the disclosed approach. In accordance with example embodiments, the first aspect is determining possible eigenmodes, given various parameters or parameter ranges of the model. Non-limiting examples of parameters include Earth surface conductivities or conductivity maps, diurnal variations of ionization in the ionosphere, and atmospheric variations of the ionosphere. By initially employing a somewhat simplified model, the first aspect of simulation can help map out a solution space for one or more low-loss eigenmodes and/or identify families of low-loss eigenmodes according to expected or plausible parameter ranges, without demanding potentially impractical computing resources.

In accordance with example embodiments, the second aspect of the analytic component is predicting a degree or strength of coupling between the electromagnetic field of a simulated excitation source (e.g., transmitting antenna) and a given one of the possible eigenmodes. In an example embodiment, the predicted coupling strength can be computed as an "overlap integral" that can be expressed as an integral over an inner product (dot product) of the eigenmode electromagnetic vector field and the conjugate of the simulated electromagnetic vector field of the simulated excitation source. Equation 3 is an expression for a form of the overlap integral S, $$S = \frac{\int E_{Eigenmode} \cdot E^*_{Source}}{\sqrt{\int E_{Eigenmode} \cdot E^*_{Eigenmode}} \sqrt{\int E_{Source} \cdot E^*_{Source}}}, \quad [3]$$

where $E_{Eigenmode}$ is the field of the Eigenmode, $E_{Source}^*$ is the complex conjugate of the field of a simulated source, such as dipole antenna, and the integral is taken over a geometric region of interest (e.g., over the volume of a waveguide). The multiplication is a dot product of the field vectors at each spatial point within the waveguide, and the integral is taken over the volume of the waveguide and some specified time interval. In the normalized form shown, the overlap integral yields a dimensionless value in a range from zero to one, corresponding to no coupling to complete coupling, respectively.

In further accordance with example embodiments, the empirical verification entails coupling the electromagnetic field of an actual excitation source (e.g., a transmitting antenna) to one or more of the eigenmodes predicted by the simulation(s), detecting and measuring wireless power received from the source via coupling to the eigenmode, verifying the received power as that of the excitation source, determining the strength of the coupling to the eigenmode, refining the analytical description of the eigenmodes, and adjusting the excitation source to enhance the coupling.

Taken together, the two aspects of the analytic component help guide the empirical verification by indicating how to empirically adapt wireless power transmissions to align with characteristics of predicted eigenmodes, and therefore enhance the likelihood and effectiveness of coupling. The analytic component also helps determine an expected coupling strength that can then be compared with measurements, and in so doing provides a statistical confidence that the empirical measurements correspond to power carried in an eigenmode. The empirical measurements can then be used to improve the analytical description of the eigenmodes, improve the predictions of coupling by using the better-described eigenmodes, and further adapt and adjust transmissions to better couple to the eigenmodes.

Two examples of the analytic component as applied to Zenneck modes illustrate how simulation may be used to predict expected coupling and power propagation, and also to further quantify the evaluation of Zenneck modes discussed above. In both example applications, a radial Zenneck mode solution, such as that described above for a cylindrical surface wave, takes the place of a predicted eigenmode in the overlap integral. As such, the first aspect of the analytic component—i.e., simulation to identify eigenmodes—is bypassed, using instead a derived Zenneck mode solution. Note that use of a Zenneck wave also implicitly ignores the ionosphere, since the mathematical solution is derived in the absence of any boundary condition above the guiding surface.

Figure 5:
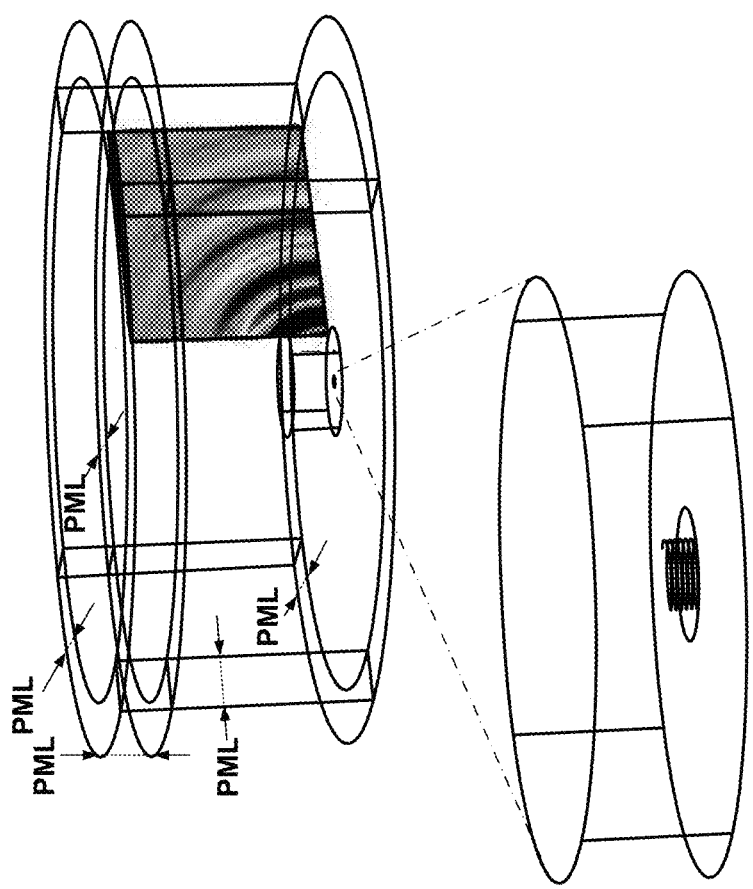
FIG. 5 is a conceptual illustration of a simulation, in accordance with example embodiments.

For the first example, the simulated source of power transmission was taken to be a 100 m tall helical antenna having a vertical axis and six turns and transmitting at a frequency of approximately 20 kHz. A full three-dimensional (3D) simulation was used, but carried out over only approximately six wavelengths in the radial direction owing to otherwise excessive computing resources that would have been needed. FIG. 5 is a conceptual illustration of the simulation configuration. The upper panel shows the simulation region, also indicating the location of perfectly matched layers (PMLs) used as a boundary matching technique (see the explanation below). The lower panel depicts a zoomed-in view of the helical antenna and the surrounding volume. The computation yielded an overlap of ~34% (or S≈0.34). A similar result was obtained by replacing the simulated helical antenna with a simulated 100 m tall vertical dipole antenna. Such a low level of overlap, which would likely be inadequate for wireless power transmission to be achieved efficiently on a large scale, may be due to the restricted distance range over which the simulation was carried out.

For the second example, the simulation was simplified by taking advantage of cylindrical symmetry to carry out the computation in two dimensions (2D), which also allowed the use of simplified sources in the simulation. For example, cylindrically symmetric sources, such as electric or magnetic dipoles, can reasonably approximate a helical source. In this case, the simulation was carried out over a geometry corresponding to a flat disk having a radius roughly equal to a meridian distance on the globe from a pole to the equator of the Earth (about $10^4$ km). The thickness of the disk was taken to correspond roughly to the height of the ionosphere (about 100 km), although the upper boundary was not modeled as the ionosphere. Instead, it was treated as a sort of artificial mathematical boundary that allowed the simulated solution to be matched to a hypothetical continuation of the solution beyond the boundary. In an example embodiment, a technique of perfectly matched layers (PMLs) may be used for the boundary matching. As is known, a PML is a mathematical technique used in numerical simulations involving wave problems having open boundaries. A PML provides an artificial layer mathematically constructed to "absorb" incident waves from an adjacent non-PML region, without reflecting them back into that region.

Figure 6:
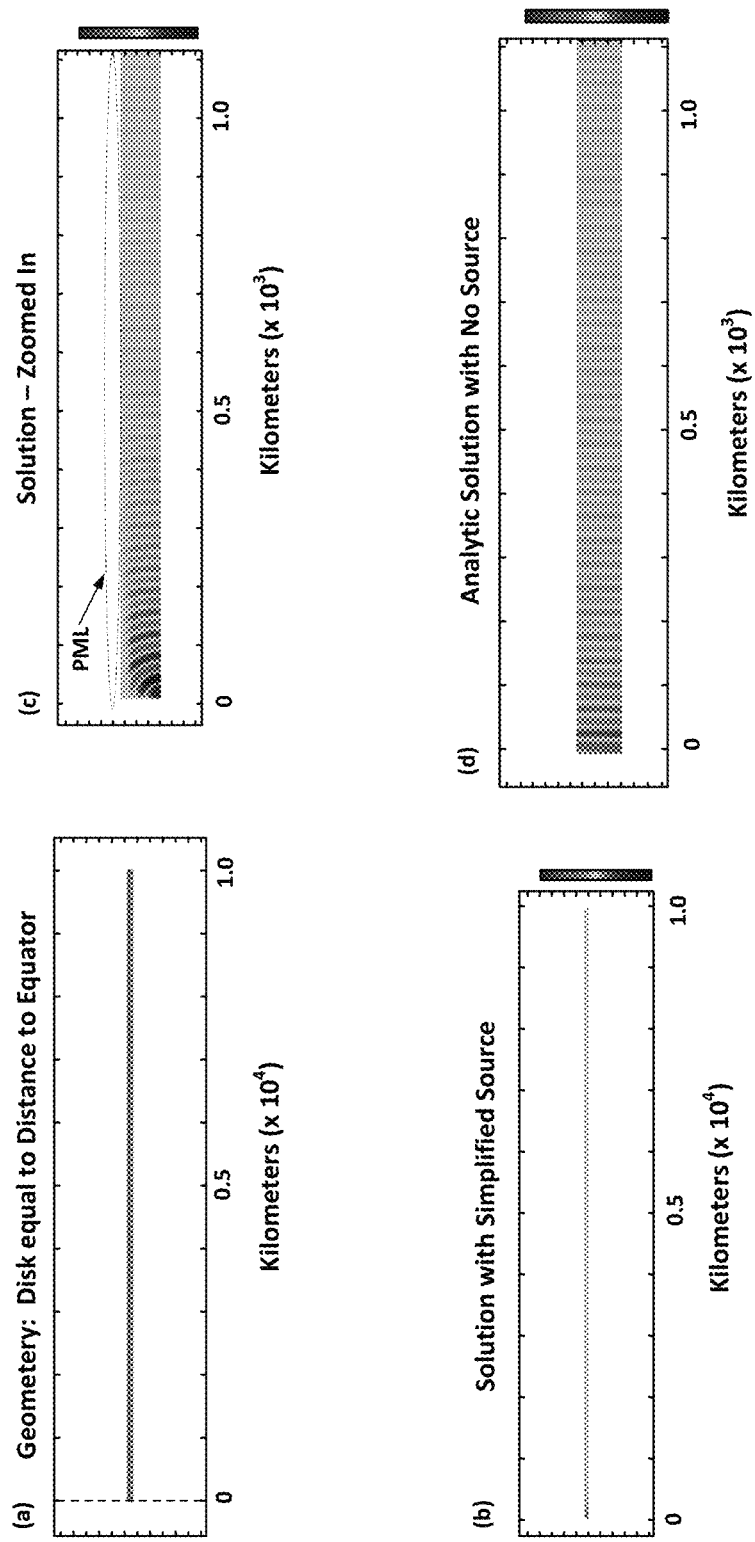
FIG. 6 is a conceptual illustration of a simulation, in accordance with example embodiments.

FIG. 6 is a conceptual illustration of the simplified simulation. The top panel (a) on left of FIG. 6 represents the 2D geometry used in the simulation, in this case just a rectangle representing an edge-on view of disk. The length is equal to disk radius and the height is equal to the layer thickness; the excitation source (e.g., a vertical dipole) is taken to be at the lower left corner of the rectangle, a point which also defines the origin of the plot. The bottom panel (b) on the left shows a simulated electromagnetic field propagated from the simulated source, a dipole radiating at ~20 kHz. The aspect ratio of the two left panels is true to the actual distances, so the disk as depicted is quite thin and the details of the simulated field may be difficult to discern.

The top panel (c) on the right side of FIG. 6 shows a zoomed-in view (magnified) of the simulated electromagnetic field, also indicating the location of the PML used in the simulation, and the bottom right panel (d) shows a zoomed-in view of the analytic solution of a Zenneck mode in the absence of any excitation source. An apparent spatial periodicity of both fields, visualized as grayscales, can be seen in the magnified views. The overlap integral is applied to the simulated field and the Zenneck mode, and carried out over the geometry of the disk. Even when including an extra loss factor of two to account for assumed hemispheric symmetry, the result of the overlap computation yields an overlap of greater than 90% (or S≈0.9). It may therefore be concluded that significant overlap or coupling may not be implausible when exciting Zenneck modes, at least for an assumed flat geometry. However, when the curvature of the Earth is incorporated into the simulation, the feasibility of Zenneck modes for wireless power transmission on a global scale diminishes significantly.

Figure 7:
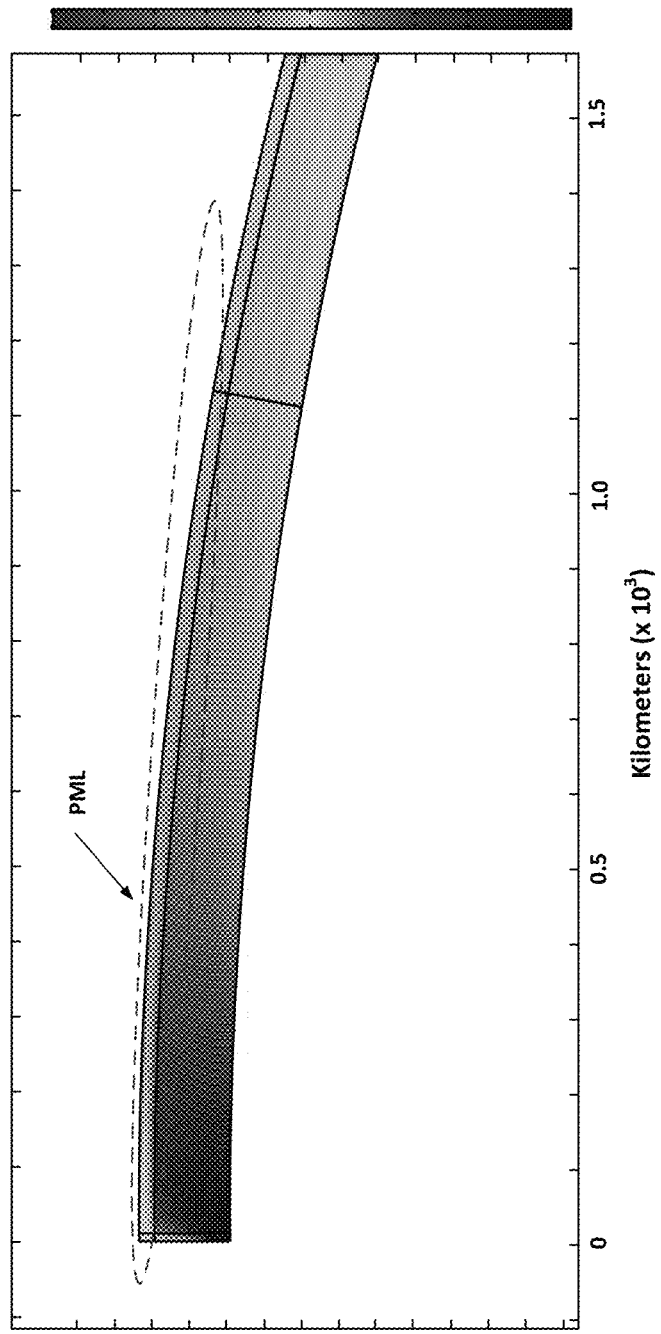
FIG. 7 is a conceptual illustration of a simulation, in accordance with example embodiments.

This can be seen in FIG. 7, which illustrates conceptually what happens in the second example when the simulation accounts for the curved surface of the Earth. For purposes of illustration, the origin of the plot is taken to be the North pole, so points 90° south line on the Equator. The location of the PML used in the simulation is also indicated. It will be appreciated that any point on a sphere can be taken as an origin and "local pole," with angular and surface distances measured with reference to this point. The same applies to other illustrations of spherical geometries discussed below.

The illustration in FIG. 7 shows about 1,500 km of the Earth's surface and an overlying mathematical boundary at a height corresponding to the ionosphere, though again, the simulation did not account for the ionosphere. A vertical dipole excitation source is taken to be at the pole, which is also the origin of the plot as described above. Here, the amplitude of the simulated field (as represented by a grayscale) appears to effectively vanish within about 1,000 km from the source, showing that the simulated field radiates away its energy as it propagates around the curvature of the Earth. This traces out how a Zenneck wave behaves on the Earth's spherical surface, with the ionosphere ignored for the moment. For the material properties of the Earth, the Zenneck solution produces a wave that decays exponentially in the vertical direction with a scale height of ~100 km, depending on the frequency of the wave. If the Earth's surface is assumed to be more lossy than it actually is, the Zenneck mode is more strongly constrained to propagate along the curved surface. But then the surface losses become significant. Zenneck modes can also be more strongly constrained to propagate along the Earth's curved surface if lower frequencies are considered, but in this case, the vertical scale height increases well beyond where the ionosphere begins. And though the ionosphere was neglected in this simulation, it cannot be in actual practice. Thus, severe $I^2R$ losses in the ionosphere would then be expected characterize the low-frequency, high-scale-height Zenneck modes.

The simulated field in FIG. 7 can also be interpreted as a sort of "probe" of possible natural modes of the Earth. For example, the behavior noted above highlights what would be expected from exciting Zenneck modes with a dipole source (and the ionosphere neglected), and reinforces the conclusion that doing so is not likely to achieve efficient wireless power transmission on a global scale. A probe field may also (or instead) couple to a low-loss eigenmode, and simulation may similarly be used to evaluate both the eigenmode and the strength of coupling that could be expected with an actual source. In accordance with example embodiments, this can be accomplished by applying the first aspect of the analytical component, namely using simulation to determine solutions of Maxwell's equations applied to the Earth-ionosphere waveguide. That is, determining low-loss eigenmodes with simulations that model both electrical properties of the Earth's surface and plasma physics of the ionosphere. As described above, analytical descriptions of low-loss eigenmodes may then be used in the overlap integral of Equation 3.

In an example embodiment, a simulation incorporates a model of the Earth's surface, including electrical properties, and a model of the ionosphere, including electrical properties and plasma physics. Given this physical model of the Earth-ionosphere waveguide, the simulation numerically searches for solutions to Maxwell's Equations, yielding one or more eigenmodes. Simulation results are generated in the form a numerical representation of each eigenmode, and corresponding eigenvalues including propagation constants and complex valued eigenfrequencies for each eigenmode. In particular, the eigenfrequency for a given eigenmode is given by $\lambda=\omega+i\delta$, where $i=\sqrt{-1}$. In this expression, $\omega=2\pi f$ is the angular frequency and $\delta$ is a damping factor. Following reasoning similar to that described above, it can be shown that the Q factor is given by $Q=\omega/2\delta$. The numerical representation of an eigenmode may take the form of electric and magnetic vector field components at discretized spatial points within the electric and magnetic vector field solution space. A simulation may be started with initial estimates for eigenvalues, and may yield just one eigenmode or multiple eigenmodes.

Figure 8:
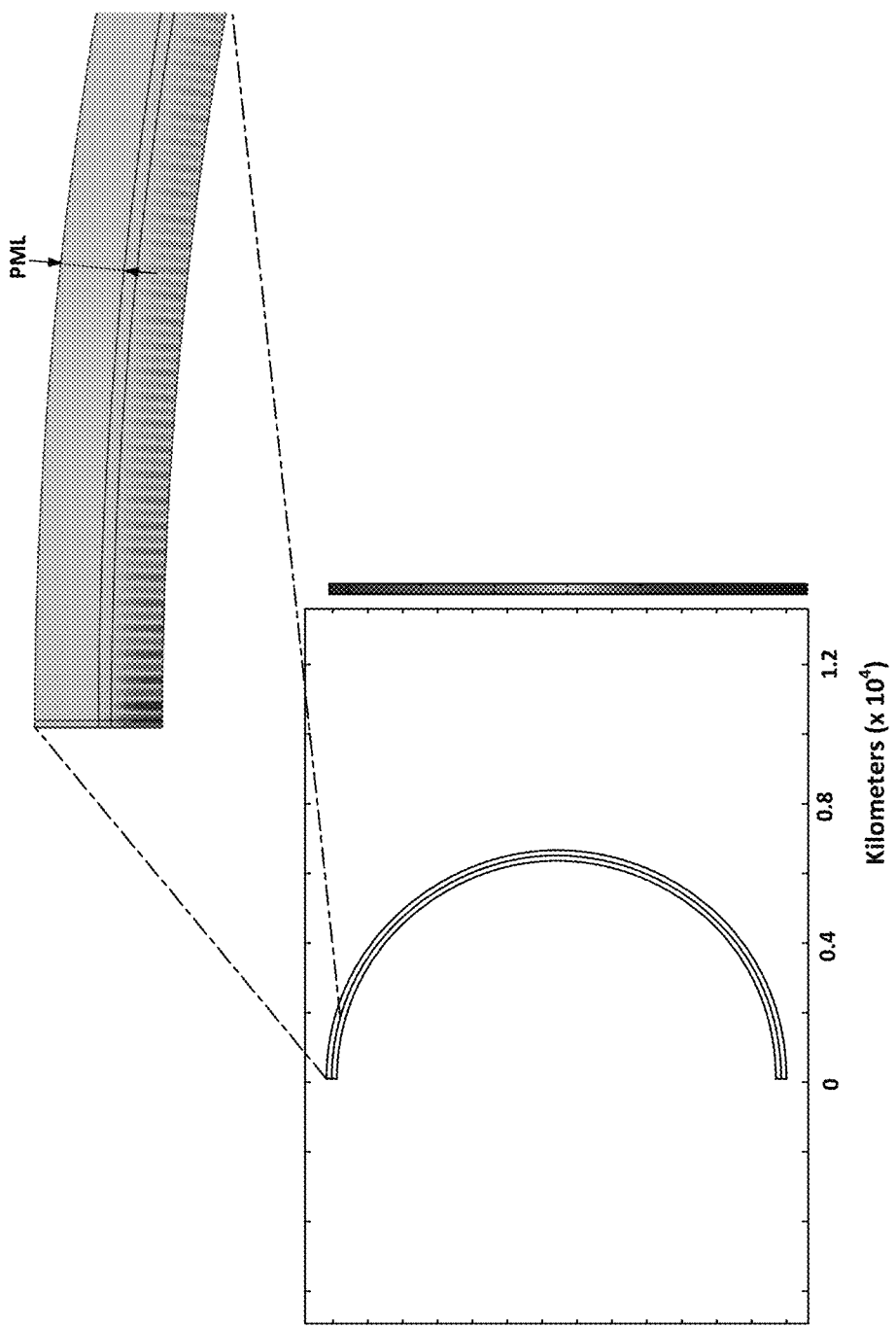
FIG. 8 is a conceptual illustration of a simulation, in accordance with example embodiments.

FIG. 8 shows an example low-loss eigenmode identified by way of a numerical simulation applied to a spherical waveguide cavity model that, for purposes of illustration, includes simplified electrical properties of the Earth's surface and simplified material-physical properties of the ionosphere. Again, the location of the PML used in the simulation is indicated. By way of example, the simulation assumed a ground conductivity of 0.001 S/m, a single ionosphere conductivity of $10^{-6}$ S/m. An initial frequency estimate of 7.5 kHz provided a starting point for the simulation. The simulation yielded an eigenmode having a complex-valued frequency $\lambda=(7.4954+0.02811i)$ kHz, from which a value of $Q\approx133$ was derived. The simulation was carried out in 2D over a meridian arc from the "north" pole (taken to be the origin) to the "south" pole (antipode), and models the ionosphere above as an overlying layer having a lower boundary and an upper boundary and characterized between the upper and lower boundaries by a single conductivity.

The example eigenmode produced by the simulation is characterized by standing waves corresponding to a resonant mode of the Earth-ionosphere waveguide. Because of the low frequency of ~7.5 kHz, the ionosphere can act to trap waves within the cavity. A semi-circle in FIG. 8 represents the geometric region over which the example eigenmode solution was simulated. The thinness of the layer as depicted in the figure may make the form of the solution difficult to discern. However, in an approximately 1,000-km portion of the region starting at the pole shown in magnification, the spatial periodicity of the eigenmode—roughly every 40 km—becomes apparent. The amplitude of the eigenmode, represented in a grayscale, appears to diminish with distance from the pole. But unlike the Zenneck wave solutions where the diminishing amplitude represents energy dissipation due to radiation into space and/or ohmic losses, the decrease seen in the eigenmode is predominantly geometric spreading or dilution. As the wave propagates past the equator toward the antipode, the intensity increases again as the geometric spreading reverses.

Viewed from above the pole, the equator would appear as a circle and the standing waves would appear as concentric rings diverging from the origin (pole), in analogy to concentric surface ripples diverging from a pebble dropped in water. Continuing with the analogy, if mechanical losses (e.g., viscosity and friction) are ignored for the surface ripples, the total energy in each ripple will remain roughly constant, but the energy density in each ripple decreases as the circumference increases with distance from the center. This corresponds to the geometric dilution of the eigenmode with distance from the pole to the equator. If the spreading surface ripples hit a concentric circular reflecting boundary, their motion will reverse and they will reconverge toward the center. As they do, the energy density dilution will also reverse. This reconvergence corresponds to the eigenmode waves past the equator and toward the antipode.

The eigenmode shown by way of example in FIG. 8 is one of several examples yielded by somewhat simplified simulations that can be used to provide general characteristics and behaviors of solutions as a function of properties of the Earth-ionosphere waveguide. For example, some eigenmodes for models with low-conductivity ionospheres and/or with an extremely high-altitude ionosphere undersurfaces share similarities with surface-hugging Zenneck modes. Solutions for models with high-conductivity ionospheres and a very low-conductivity Earth surface share similarities with whispering gallery modes. Solutions for models with high-conductivity upper and lower "hard" boundaries share characteristics with ionosphere-hugging Schumann modes. Although solutions that resemble Zenneck waves, Schumann modes, and/or whispering gallery modes lack characteristics making them suitable for global power distribution, they illustrate how even relatively simple configurations of the physical model used in the simulations can begin to map out an eigenspace at a coarse level.

Simulations that incorporate more realistic—if still overly simplistic—models of the ionosphere yield low eigenvalues having Q values on the order of ~200 or greater. As such, these eigenmodes may be considered low-loss in the sense that relatively little of their energy is lost to the waveguide boundaries—i.e., the Earth's surface and the ionosphere. Thus, a low-loss eigenmode may be subject to geometric dilution with distance from the origin (and geometric re-concentration towards the antipode), but only a relatively small amount of total energy is lost to the ionosphere or other loss processes. To the extent that a source can couple at least a fraction of its power to such an eigenmode, that coupled fraction of power may be transmitted around the globe with little loss.

Figure 9:
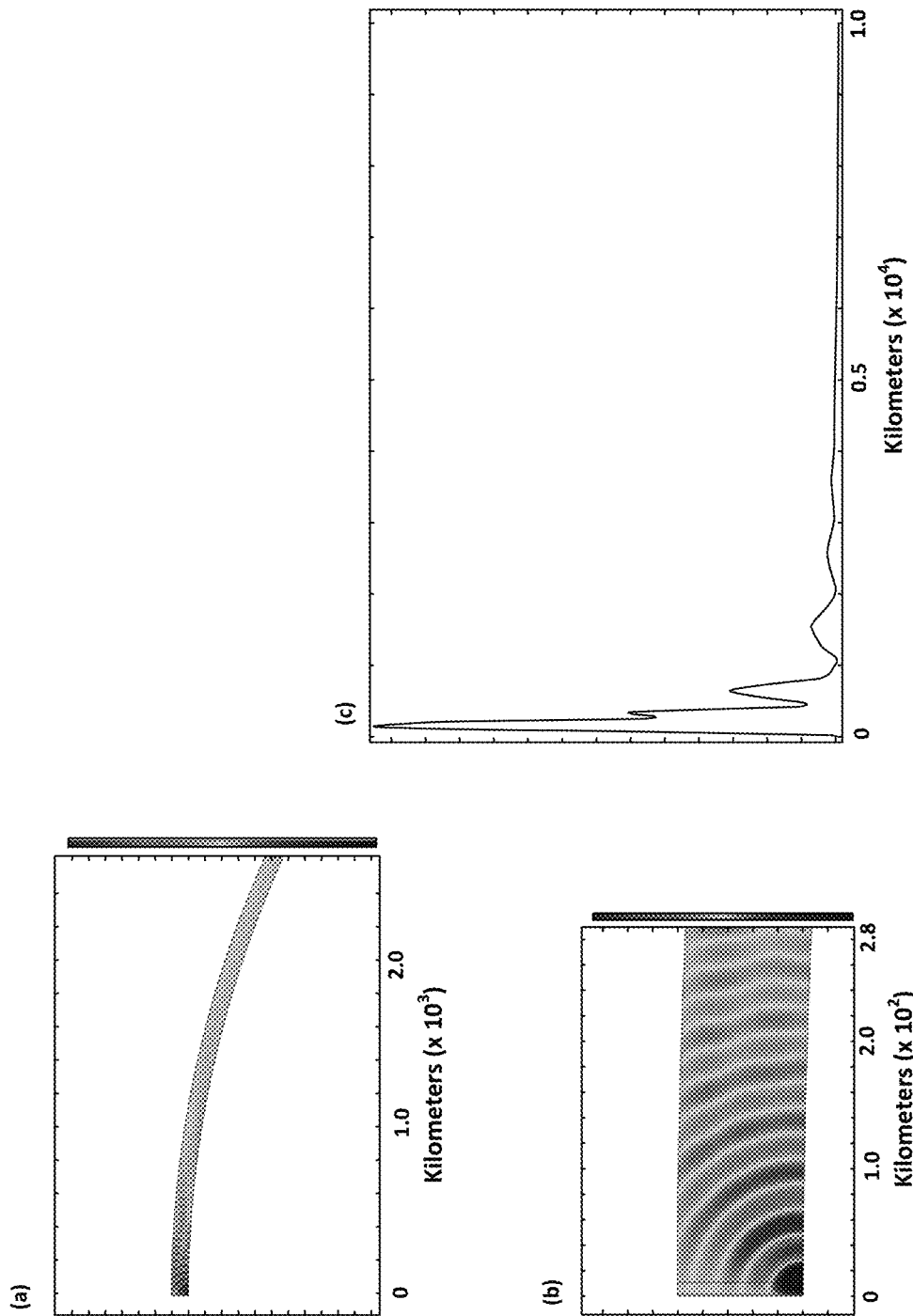
FIG. 9 is a conceptual illustration of a simulation, in accordance with example embodiments.

This is shown in FIG. 9, which illustrates the field pattern of a simulated dipole emitting in the Earth-ionosphere waveguide, and where simulation is carried in just two dimensions out over the upper hemisphere of the geometry of FIG. 8. In order to extend both to the lower hemisphere and beyond the ionosphere, mathematical boundaries were imposed at the equator and above of the ionosphere layer to match the solutions within the solution volume with hypothetical continuations of the solutions beyond the boundaries. In an example embodiment, a technique of perfectly matched layers (PMLs) may be used for the boundary matching.

The upper left panel (a) in FIG. 9 spans approximately the first 2,500 km from the simulated source, and the inset panel (b) below zooms in on the first ~250 km from the source. As expected for dipole radiation, the pattern is roughly circular near the source, so that a large proportion of the energy near the source is directed toward the ionosphere. Consequently, within ~200-300 km from the source, a large fraction of the initial power is lost to interactions between the field and the partially ionized plasma. However, at increasing distance from the source, the direction of energy propagation is predominantly parallel to the Earth's surface and the ionosphere. This radiation pattern is customarily referred to as "broadside" with respect to the axis of the dipole source. Although the broadside portion of the field in this simulation accounts for only a small fraction of the initial energy—most of which is lost to the ionosphere—its power propagates nearly without any further loss across the globe and within the Earth-ionosphere waveguide. Thus, in the top left panel, the broadside radiation pattern can be seen to continue past the right edge. The apparent decrease in intensity with distance is due primarily to geometric dilution, as explained above. However, ohmic losses in the ionosphere have largely leveled off by about 1,000 km from the source.

This is shown by way of example in the right panel (c) of FIG. 9, which is a plot of ohmic losses in the ionosphere with distance from the source. While nearly about 99% of the initial power is dissipated in the ionosphere by 1,000 km from the source, the remaining 1% remains relatively unchanged beyond this distance.

The simulation illustrated in FIG. 9 indicates that the simulated dipole field has coupled with one or more low-loss Eigenmodes, although most of its initial energy is lost to the ionosphere. Thus, while evidently not an efficient coupling source in terms of injected energy, the simulated dipole nevertheless acts as a probe of eigenmodes, demonstrating their existence—at least as predicted by simulation. The apparent inefficiency of coupling in terms of injected power is not necessarily unexpected in this example, and is more indicative of the prevalence of ionosphere-directed energy flow (and resultant losses) near the dipole source than of any characteristic of low-loss eigenmodes or the feasibility of constructing an excitation source better suited for efficient coupling.

Exciting and Detecting Eigenmodes of the Earth-Ionosphere Waveguide.

One approach to coupling power into an eigenmode at one location and receiving some portion of the power at another location is to operate a low-frequency dipole transmitter at relatively high power and deploy one or more receivers at remote locations. This approach is analogous to the simulated dipole illustrated in FIG. 9, and may therefore be suboptimal in terms of coupling efficiency. However, by measuring the received power and adjusting the transmitter properties based on the measurements, transfer properties of the transmission path from transmitter to receiver could be determined empirically. Accordingly, this approach could be considered an empirical determination of a transfer function of the Earth-ionosphere waveguide. The transfer function could then be used to inform and guide design and construction of more optimal transmitter and receiver systems.

Alternative or additional approaches may take advantage of simulations by using predicted properties of eigenmodes to introduce some degree of optimization from the start.

In accordance with example embodiments, properties of predicted eigenmodes may be used to infer characteristics of a simulated and/or actual excitation source that make coupling of the source field to the eigenmodes efficient. More particularly, simulation of an excitation source characterized by significant broadside radiation indicates increases in the efficiency of coupling in the context of simulations. Computing the overlap integral for such a simulated source with one or more predicted eigenmodes may then provide a parameter space of expected power level measurements that may be used to empirically validate the predicted eigenmodes and help guide design and construction of actual excitation sources.

The solution for the simulation of FIG. 8 illustrates just one eigenmode for a simplified model of the Earth-ionosphere waveguide. In accordance with example embodiments, multiple runs of the simulations may be carried out to cover a range of terrestrial (ground) conductivities and ionospheric conductivities. Simulations may further be carried out in 3D using detailed models for the ionosphere that include detailed plasma physics to account for anisotropic and inhomogeneous conductivities, as well as diurnal variations (e.g., daytime/nighttime variations). From these multiple simulation runs, an eigenspace may be mapped out representing eigenmodes that sample basis vectors of solutions to Maxwell's Equations for the Earth-ionosphere waveguide. Simulations of sources may then be used to determine physical characteristics of emitted electromagnetic fields that most efficiently couple with one or more low-loss eigenmodes among those identified from the eigenmode simulations.

For example, the source simulation represented in FIG. 9 suggests that replacing the simulated dipole with a more broadside emitter would lead to better coupling. Also, the source frequency needs to be low enough so that waves are largely trapped (e.g., reflected) by the ionosphere. In accordance with example embodiments, this type of analysis may be expanded with a set of low-loss eigenmodes from simulations to determine source configurations that yield large predicted overlap integrals. The determined source configurations can also be translated into desirable electrical properties of actual sources for deployment in empirical determination of coupling. In practice, any source may couple to multiple eigenmodes at differing levels of efficiency. As such, the overlap integral may represent the total amount of source coupling to the multiple eigenmodes, with any uncoupled portion, R=S−1, representing losses and/or coupling to eigenmodes that are not included in the overlap integral. Selectively omitting particular eigenmodes from the simulated overlap integral may allow individual contributions (i.e., coupling strengths) to be deduced. By further accounting for properties of omitted eigenmodes, such as possible spatial rates of decay, their effect on overall coupling modalities may be determined. This can be used to further explore and design desirable properties of actual (empirical) sources.

Figure 10A:
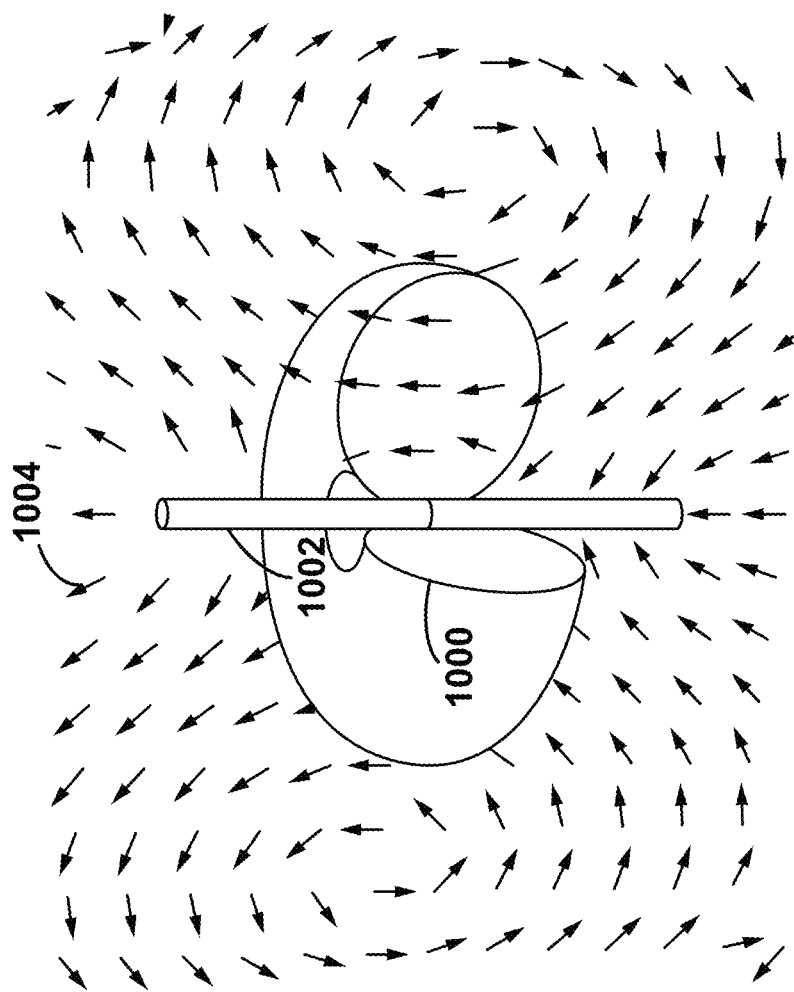
Figure 10B:
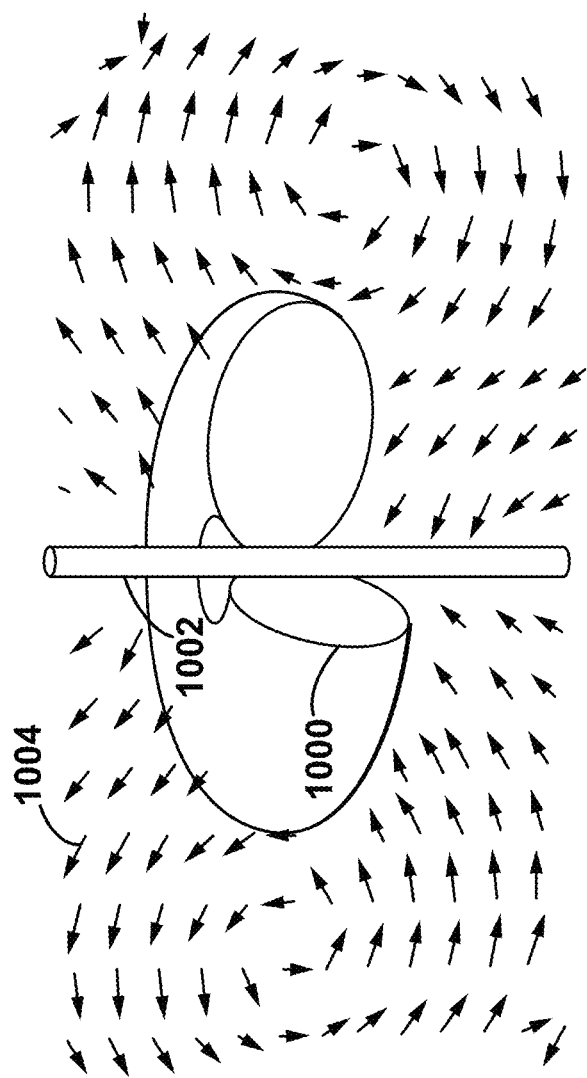

FIGS. 10A, 10B, and 10C conceptually illustrate "flattening" of an electric field, such as dipole field. A radiation pattern of the form produced by a vertical dipole, such as a dipole antenna, is shown in FIG. 10A. In line with the discussion of FIG. 9, a high proportion of the field vectors have large vertical components, so that the overall vector field similarly has a substantial upward component. As described, the relatively large proportion of vertical vector field components leads to substantial $I^2R$ losses in the ionosphere (and somewhat less so in the Earth's surface). FIG. 10B shows a slightly flattened version of the dipole field. In this case, the field vectors have an increased amount of horizontal (broadside) components. Consequently, there is less loss to the ionosphere and more energy that can couple to a low-loss eigenmode. FIG. 10C shows still more flattening, and thus an even better prospect for coupling to a low-loss eigenmode. The simplified depictions in FIGS. 10A, 10B, and 10C illustrate conceptually how characteristics of an empirical source might be adapted to enhance coupling to an actual low-loss eigenmode. As described later, a directed, flattened field pattern may be achieved using an array of antennas. Some alternative physical array configurations are first considered, leaving aside theoretical details of how field flattening (and other forms of shaping) may be achieved in practice.

In accordance with example embodiments, an empirical source deployment may take the form of a multiplicity of commonly located RF transmitter elements configured to operate at tunable frequencies, tunable amplitudes, and tunable relative phases so as to generate a directed radiation pattern at one or more specified frequencies. In particular, the tunable amplitudes and relative phases may be adjusted so that, in concert, the multiplicity produces a substantially flattened radiation pattern with respect of a vertical axis and having power directed radially outward from the common location. The flattened radiation pattern may be parallel to a local horizon such that little to no power is radiated toward the ionosphere or into the ground. Further, the amplitude and phase adjustments may be made such that the radiation pattern is isotropic with respect to an azimuthal angle measured about the vertical axis. Alternatively, the radiation pattern may be arranged to have phase and/or amplitude be a function of the azimuthal angle.

In an example embodiment, each RF transmitter element may include a waveguide-coupling element, such as an antenna, and an electrically connected driving circuit. Each transmitter element may have its own driving circuit, or some or all of the transmitter elements may be connected to one or more common driving circuits, where each connection allows the amplitude and phase of each transmitter element to be individually controlled. In an example embodiment, the antenna may be an electric dipole antenna or a helical (magnetic dipole) antenna. Other configurations of RF transmitter element are possible as well.

Figure 11:
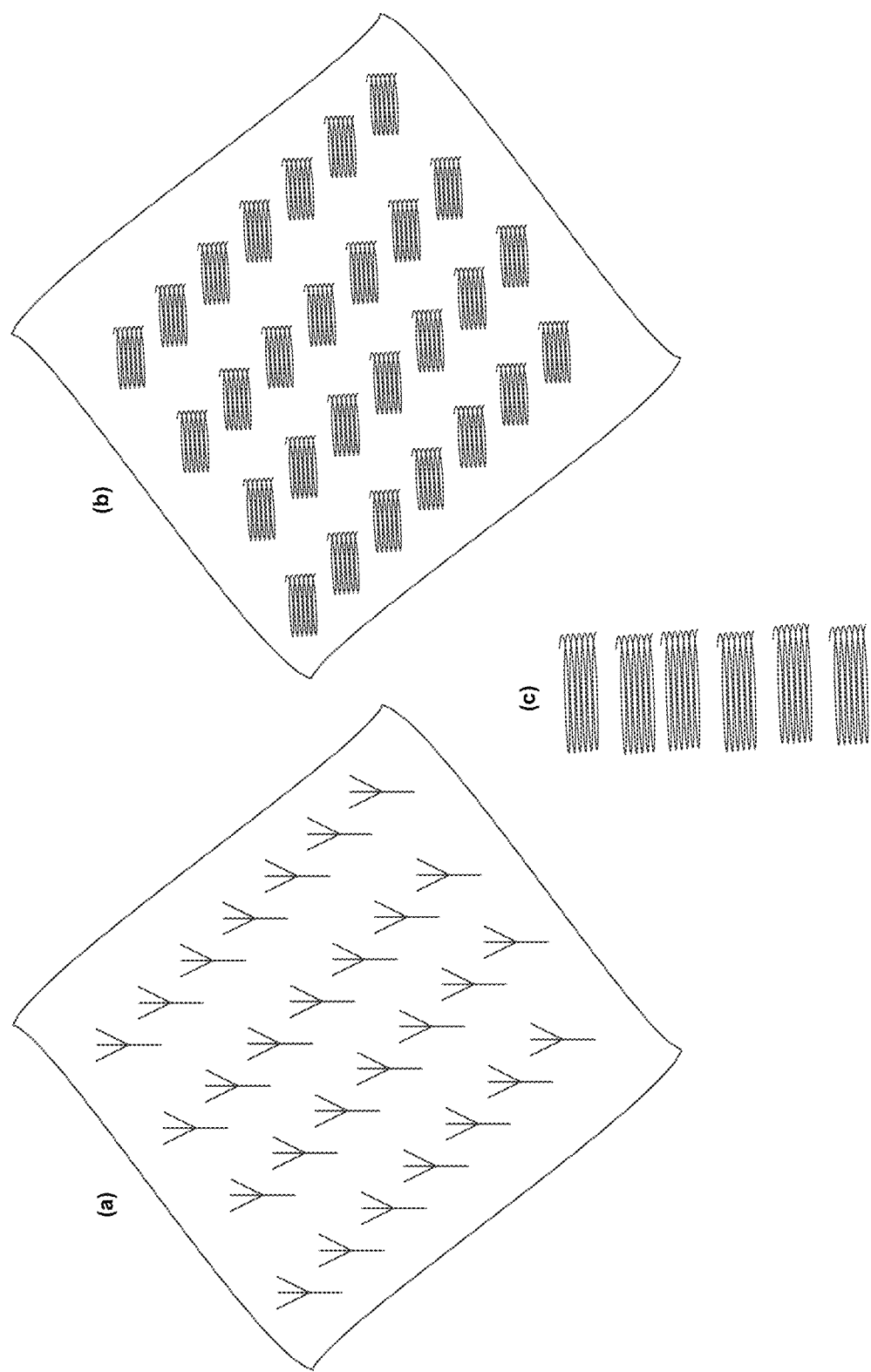
FIG. 11 is a simplified illustration of a transmitter antenna array, in accordance with example embodiments.

In accordance with example embodiments, the multiplicity of RF transmitter elements at a common location may take the form of an array of electrically connected RF transmitter elements distributed over an area. Illustrative examples of arrays of antennas are shown in FIG. 11. Panel (a) is an illustration of a spatial (e.g. rectangular) array of dipole antennas; panel (b) is an illustration of spatial (e.g. rectangular) array of helical (magnetic dipole) antennas; panel (c) is an illustration of a vertical (stacked) array of helical antennas. Other configurations could include both types of antennas and/or other types of transmitter elements. In an example, the area may be roughly the size of a football field or similarly sized footprint.

The electrical connections to and among the transmitter elements of the array may include controllable elements that enable the frequency, amplitude, and phase of transmitter elements to be dynamically adjusted. In an example, the controllable elements may include adjustable active and/or passive circuit components. The frequency may be adjusted to be within a range of expected eigenfrequencies of low-loss eigenmodes. Further, the phase adjustments may enable the relative phases of some or all pairs of transmitter elements to be adjusted according to specified amounts. In accordance with example embodiments, amplitudes and relative phases of transmitter elements may be adjusted so as to generate a substantially broadside radiation pattern. As discussed above, such a radiation pattern can enhance coupling efficiency to low-loss eigenmodes by suppressing radiation directed toward the ionosphere and concentrating it in a broadside direction where it may couple with one or more eigenmodes.

Also in accordance with example embodiments, by making appropriate adjustments, the array of transmitter elements may present an electrical aperture significantly larger than its physical size. In particular, the aperture size may be made large enough in comparison to the range of wavelengths corresponding to the range of eigenfrequencies so that a significant portion of the emitted power may be concentrated within the near field of the eigenmodes. In this way, non-radiative, near-field coupling with one or more eigenmodes may be achieved.

In accordance with example embodiments, an operational frequency range of 5-100 kHz may be used, corresponding to a wavelength range of approximately 3-60 km. Transmissions in this range can generally be expected to reflect off the ionosphere, particularly if the transmissions are predominantly broadside with respect to the vertical direction. Also within this frequency range, an array of electrically connected transmitter elements within an area characterized by a football field or similar facility will be well within the near field of RF transmissions. As such, relatively precise control of phases and amplitudes of the transmitter elements will typically be needed to contain the power against reactive electromagnetic forces among the transmitter elements. In the given example frequency range, the timing requirements of electrical control elements for achieving this precise control can generally be met with existing and/or available hardware and software devices for implementing the electrical control elements. For example switching speeds of active circuit elements such as transistors and integrated circuits typically well exceed timing corresponding to the example operational range.

In accordance with example embodiments, adjustments of electrical connections to and among the transmitter elements may be controlled by one or more computing systems, such as those discussed above. Such systems may include one or more processors or controllers, and memory for storing instructions that when executed by the one or more processors carry out operations including control of the electrical connections so as to achieve target and/or desired frequencies, amplitudes, and phases of the transmitter elements. The operations may also include computations for determining frequencies, amplitudes, and phases of the transmitter elements given one or more sets of operational criteria. For example, operational criteria could specify one or more eigenmodes to which coupling is desired. The one or more computing systems may also include a user interface for user control and monitoring. Further, the one or more computing systems may be connected to a communications network providing a communicative connection to one or more other computing systems, including one or more that control another, remotely located array of transmitter elements, and/or one or more that control one or more remotely located wireless power receiving devices.

As discussed above, the conductivity of the ionosphere is generally inhomogeneous and anisotropic. In addition the height of the D layer—the lowest layer—above the terrestrial surface varies over the course a day, being lowest during daytime, when direct solar energy increases the level ionization, and highest during nighttime when the level of ionization decreases in the absence of direct solar energy. As a result, the conductivity of the ionosphere is typically non-uniform and time-dependent. In accordance with example embodiments, dynamic control of frequencies, amplitudes, and phases of the transmitter elements of the array may be used compensate for non-uniformity and time-dependence of the ionosphere. For example, during times when the D layer is lowest (i.e., daytime), adjustments may be made to generate a more flattened radiation pattern so as to avoid directing power into the D layer.

In practice, power transmitted with a system or apparatus such as the example array of transmitter elements may couple to more than one eigenmode, and even at some level to other possible modes, such as some of those discussed above. This may be particularly the case for initial empirical trials at a stage when the eigenmodes and eigenvalues have only been identified by simulations. Accordingly, a receiver device may be configured for coupling power in from one or more eigenmodes.

In accordance with example embodiments, one or more receiver devices or systems may be deployed at one or more locations remote from a transmitter system in order to detect and measure transmitted power. By confirming that the detected power is from the transmitter system, and by measuring the strength of the detected power, properties of the received power may be evaluated to determine the strength of coupling of the transmitted power to one or more eigenmodes, and to further refine quantitative descriptions of the eigenmodes beyond what is provided by the simulations alone. Properties of the detection and the refined quantitative descriptions may then be used to further adjust the transmitter system to better couple to the one or more eigenmodes.

In accordance with example embodiments, a receiver device may include a reception element, such as an antenna, and an electrically connected receiving circuit. The receiving circuit may include adjustable elements for tuning to a range of frequencies. In an example embodiment, the antenna may be an electric dipole antenna or a helical (magnetic dipole) antenna. Other configurations of a receiver device are possible as well.

Figure 12:
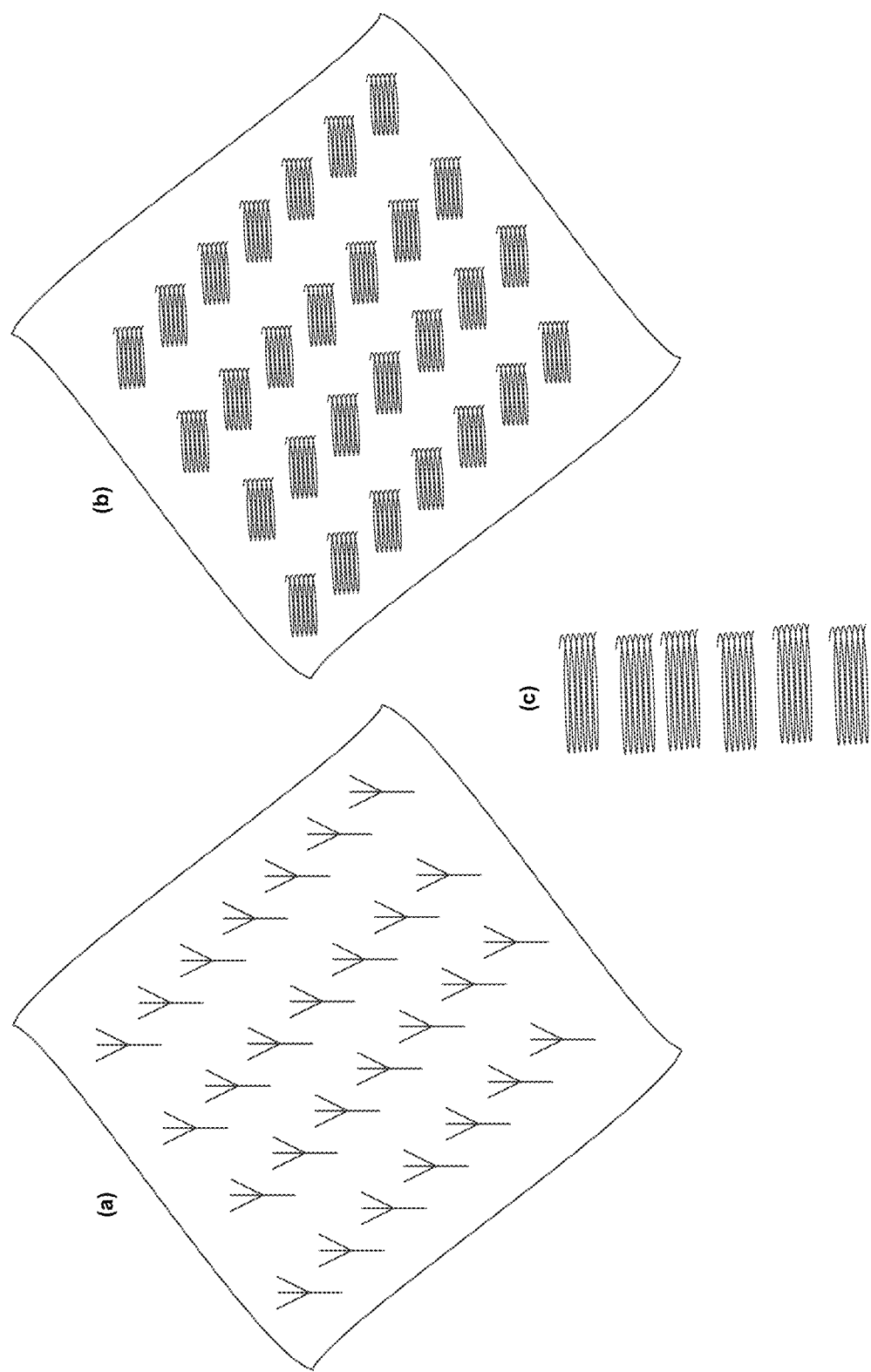
FIG. 12 is a simplified illustration of a receiver antenna array, in accordance with example embodiments.

In accordance with example embodiments, a receiver device can be used in a standalone mode, or be one element in an array of electrically connected receiver elements distributed over an area. An illustrative example of an array of receiving antennas is shown in FIG. 12. Panel (a) is an illustration of a spatial (e.g. rectangular) array of dipole antennas; panel (b) is an illustration of spatial (e.g. rectangular) array of helical (magnetic dipole) antennas; panel (c) is an illustration of a vertical (stacked) array of helical antennas. Other configurations could include both types of antennas and/or other types of radiating elements. In an example, the area may be roughly the size of a football field or similarly sized footprint.

In an example embodiment, a receiver device may measure 3D vector components of electric field and magnetic field components of the transmitted electromagnetic field. The vector field components may further be measured as a function of time. For example, a receiver device measure $E(t)=\{E_x(t), E_y(t), E_z(t)\}$ and $H(t)=\{H_x(t), H_y(t), H_z(t)\}$, where x, y, and z are local rectangular coordinates and t is time. Other coordinate systems could be used as well, such as spherical coordinates. Measurements of $E(t)$ and $H(t)$ over time may then be used compute received power at the location of the receiver device.

In an example embodiment, power transmitted by a transmitter apparatus, such as an array or transmitter elements, may be encoded with information such that a receiver system or apparatus may affirmatively identify the received power as according to the encoded information. For example, the transmitted power may take the form of a known pulse sequence that a receiver device may recognize. Other forms of information encoding could be used as well. Upon detecting power and identifying the encoded information, the receiver device can then confirm that the received power originates from the transmitting apparatus. As such, measurements of the received power may then be used to evaluate the strength of coupling to one or more eigenmodes.

In accordance with example embodiments, simulations may be used to predict an overlap integral between a simulation of the transmitting apparatus and one or more predicted low-loss eigenmodes. As described, the overlap integral is taken over a specified time duration and over the entire volume of the Earth-ionosphere waveguide. Measurements of detected power by a receiver device represent just a portion of the computed overlap integral, and possibly just a portion of the specified time duration. As such, measurements from one receiver device may be considered a sample point of an actual overlap integral, and therefore correspond to an analytically derivable fraction of the predicted overlap integral.

Figure 13:
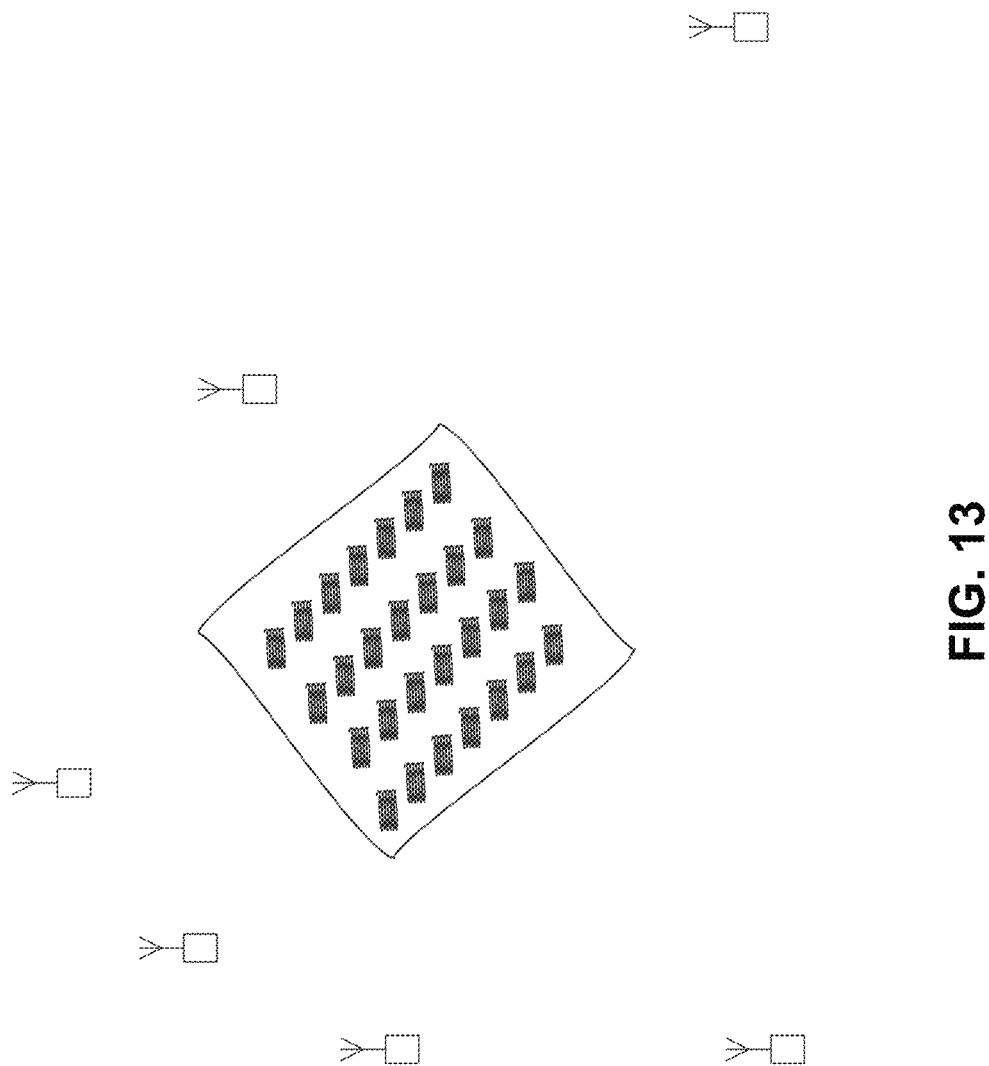
FIG. 13 is a simplified illustration of a transmitter antenna array and a distribution of remotely located receiver devices, in accordance with example embodiments.

In accordance with example embodiments, a multiplicity of receiver devices may be deployed at multiple, different remote locations from a transmitter apparatus. A conceptual illustration of multiple, distributed receiver devices is shown in FIG. 13. Measurements of received power at these receiver devices may then be summed together to form a partial discrete overlap summation that can be compared with a portion of the overlap integral. That is, S is approximated by a finite sum of discrete dot products that represents a fraction of the total volume integral. The partial sum of measured points may then be compared with a corresponding proportion or fraction of the computed overlap integral from simulations. In carrying out the partial discrete summation, adjustments may be made for a relative time delays between the transmitter apparatus and the receiving devices. Computationally, this adjustment may be achieved by taking a Fourier transform of local measurements of $E(t)$ and $H(t)$ and then carrying out the partial discrete summation in frequency space.

In accordance with example embodiments, simulations may also provide predicted values, or ranges of values, of $E(t)$ and $H(t)$ at one or more remote locations relative to the transmitter apparatus. Actual measurements of $E(t)$ and $H(t)$ by a receiver device as one or more of the remote locations may then be compared with the predicted values. Analysis of measured values may thereby provide confidence estimates for confirming that received power was carried by one or more eigenmodes.

By deploying multiple receiver devices remotely from a transmitter apparatus, a spatial mapping of $E(t)$ and $H(t)$ may be determined and compared with predicted field values from the transmitter apparatus. In this way, receiver measurements may be analyzed to provide statistical confidence estimates for confirming coupling of the transmitter apparatus with one or more eigenmodes. Further, the parameters of the simulation-based eigenmodes in the discretized computation of S may be adjusted to obtain a best fit to the spatially diverse measurements of $E(t)$ and $H(t)$, for example in a least-squares sense. Doing so can improve the physical description of the eigenmodes and further improve the accuracy of the derived overlap integral.

In practice, initial measurements—those of eigenmodes identified largely or only by simulations—may provide relatively low-confidence estimates of coupling. However, such measurements may be used to refine analytic descriptions of the one or more eigenmodes. The refined descriptions could then be used determine adjustments to the transmitter apparatus so as to better (e.g., more efficiently) couple to the eigenmodes. Further measurements by receiver devices could then provide increased confidence of coupling confirmation. This process could be repeated iteratively to improve operational capability of the transmitter apparatus in coupling with one or more eigenmodes.

In accordance with example embodiments, an iterative process may also be applied to empirically detecting eigenmodes without necessarily refining their analytic descriptions. In this approach, initial simulation-based estimates may again be used for initial detection of eigenmodes. But instead of refining analytic descriptions, iterative measurements may be used to determine an effective response function of the propagation path from the transmitter apparatus to the receiver devices. The response function may then be applied as a sort of "black box" system, such that properties of the transmitter apparatus and receiver device may be adjusted for efficient wireless power transmission, without necessarily deriving a detailed analytical description of the underlying eigenmodes.

In accordance with example embodiments, an iterative process may be developed in the form of a real-time feedback loop between the transmitter apparatus and one or more receiver devices. In particular, real-time feedback may allow dynamic physical properties of the Earth-ionosphere waveguide to be incorporated into operation of transmitter apparatuses and receiver devices. For example, operational aspects of transmitters and receivers could be adapted to diurnal changes in the ionosphere. In an example embodiment, ancillary measurements may be made with an ionosonde device configured, as is known, for probing the height of the ionosphere as a function of frequency. The ionosonde device could be incorporated in a transmitter apparatus and/or in a receiver device, or could be a separate device. Measurements from the ionosonde could be used to determine real-time conditions of the ionosphere, which could be made part of a feedback loop for controlling the transmitter apparatus and/or one or more receiver devices.

In accordance with example embodiments, a receiver device may take the form or a portable, deployable device that may be relocated to a variety of locations with respect to a transmitter apparatus. Multiple portable devices may be deployed such that their locations with respect to a transmitter apparatus may be adapted and reconfigured according to predicted or expected spatial properties of one or more eigenmodes. For example, an eigenmode determined from simulation may have predicted wave nulls and/or wave peaks at particular locations. While such predictions could have relatively large uncertainties associated with the accuracy of one or more locations, mobile deployment of multiple portable devices may enable empirical spatial properties of standing waves of eigenmodes to be mapped out.

In an example embodiment, a portable receiver device could be small enough to be hand-held. In another example, portable receiver devices could be deployed using one or more types of mobile vehicles. Non-limiting examples of mobile vehicles for deployment of portable receiver devices includes autonomous, semi-autonomous, and/or human-operated terrestrial and/or aerial vehicles. Aerial vehicles could include airplanes, drones, and balloons. Terrestrial vehicles could include cars, trucks, and trains. Other examples are possible as well.

Figure 14A:
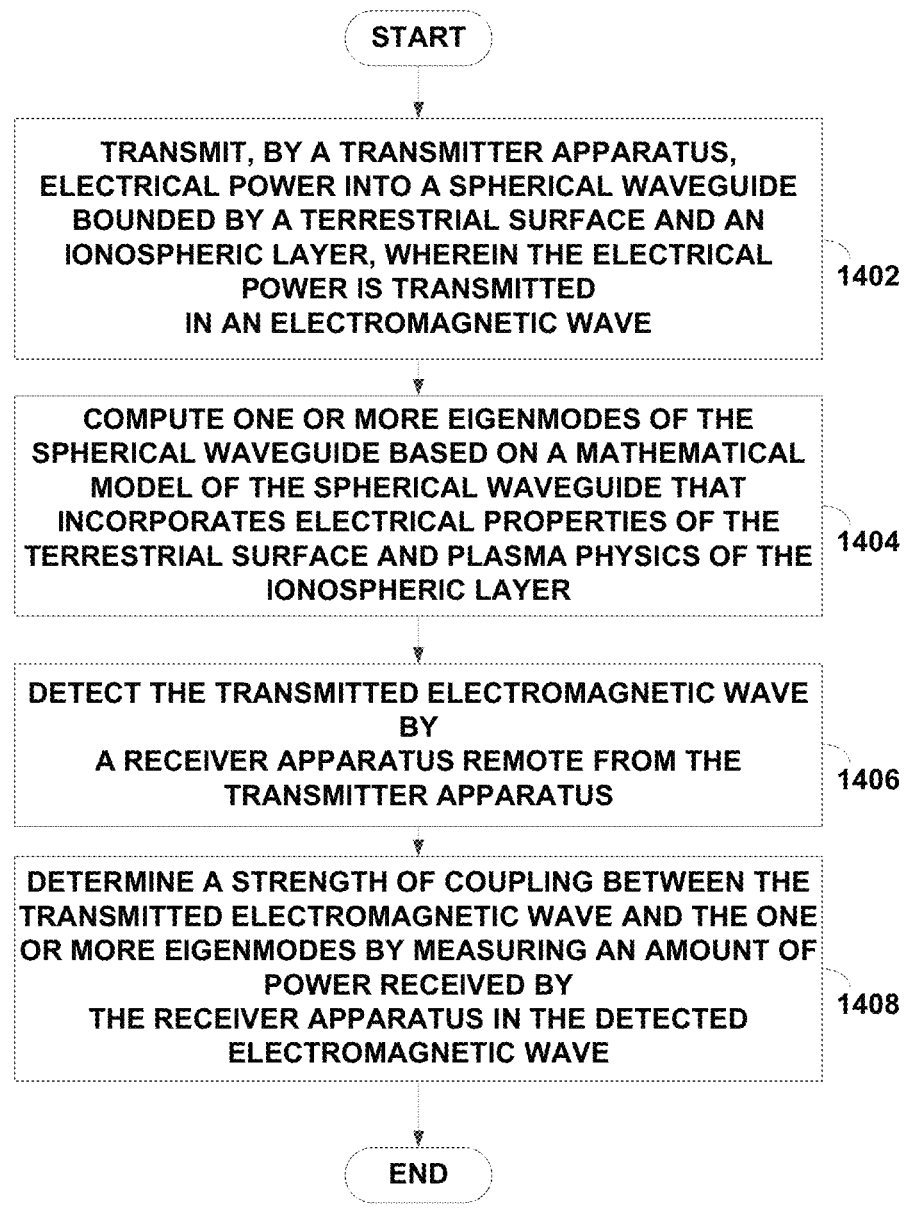
FIG. 14A is flowchart of one example method of determining and coupling to an eigenmode, in accordance with example embodiments.
Figure 14B:
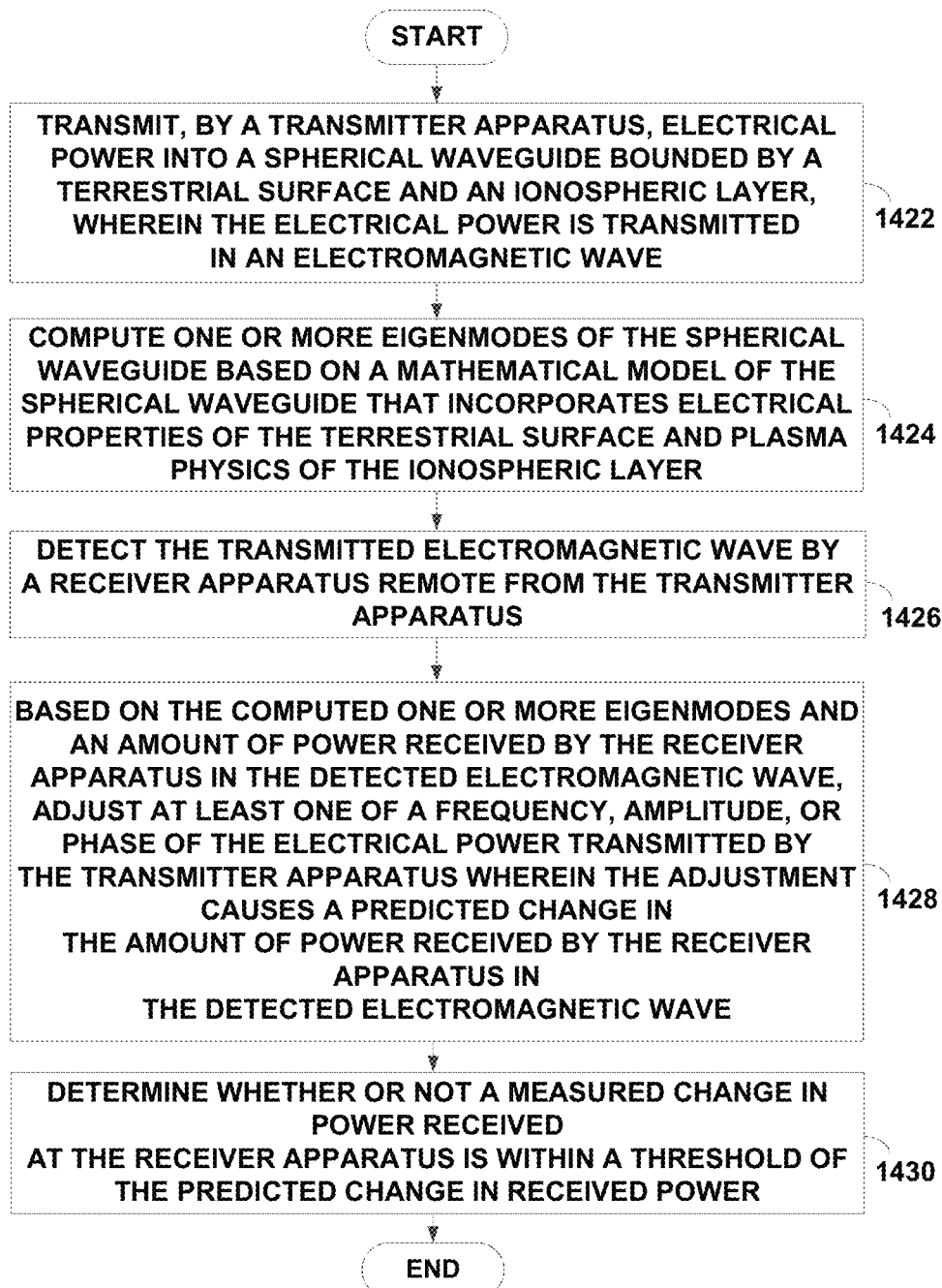
FIG. 14B is flowchart of another example method of determining and coupling to an eigenmode, in accordance with example embodiments.

FIGS. 14A and 14B are flowcharts illustrating example methods for predicting and detecting eigenmodes of the Earth-ionosphere waveguide. In accordance with example embodiments, the methods can be implemented using one or more transmitter apparatuses or devices, one or more receiver apparatuses or devices, and one or more computing systems configured for executing instructions for carrying out various steps and functions described herein. The computing system 100 illustrated in FIG. 1 is an example of a computing system that could carry out steps and functions of the example methods. Instructions for execution by one or more processors of the computing system could be stored as software, hardware, and/or firmware in a non-transitory computer-readable medium. Thus, steps, operations, and/or functions described herein may be carried out by the computing system when the instructions are executed by one or more processors of the one or more computing systems.

The method illustrated in FIG. 14A entails determining a strength of coupling between a transmitted electromagnetic wave and one or more eigenmodes of the Earth-ionosphere waveguide. At step 1402, a transmitter apparatus transmits electrical power into a spherical waveguide bounded by a terrestrial surface and an ionospheric layer, wherein the electrical power is transmitted in an electromagnetic wave. In an example embodiment, the terrestrial surface is the surface of the Earth and the ionospheric layer is the ionospheric layer of the Earth, and the spherical waveguide is the Earth-ionosphere waveguide. As described earlier, the waveguide formed by the Earth and its ionosphere is not precisely spherical. As such, it may be understood that the term "spherical waveguide" applied to the Earth-ionosphere waveguide may be taken to mean approximately spherical. That is, there should be no ambiguity to the term "approximately spherical" as it applies to the Earth-ionosphere waveguide.

At step 1404, one or more eigenmodes of the spherical waveguide are computed based on a mathematical model of the spherical waveguide that incorporates electrical properties of the terrestrial surface and plasma physics of the ionospheric layer.

At step 1406, the transmitted electromagnetic wave is detected by a receiver apparatus remote from the transmitter apparatus.

Finally, at step 1408, a strength of coupling is determined between the transmitted electromagnetic wave and the one or more eigenmodes by by measuring an amount of power received by the receiver apparatus in the detected electromagnetic wave. In accordance with example embodiments, the determined strength of coupling may be used to calculated a statistical confidence that the detected electromagnetic wave was coupled to the one or more eigenmodes during a time interval in which it was detected by the receiver apparatus.

In accordance with example embodiments, computing the one or more eigenmodes of the spherical waveguide (in step 1404) may entail numerically solving Maxwell's Equations applied to the mathematical model of the spherical waveguide and determining the one or more eigenmodes from the numerical solution in the form of computed electric and magnetic field vectors at discrete spatial points of the mathematical model of the spherical waveguide. In addition, eigenfrequencies and propagation constants for the one or more eigenmodes may also be determined from the numerical solution. Numerically solving Maxwell's Equations applied to the mathematical model of the spherical waveguide may also entail computing a numerical simulation in two spatial dimensions and/or three spatial dimensions.

In further accordance with example embodiments, transmitting the electrical power into the spherical waveguide (in step 1402) may entail transmitting the electrical power at one or more of the eigenfrequencies. In an example embodiment, eigenfrequencies from simulations may be in a range of 5-100 kHz. It should be understood that eigenfrequencies outside of this example range are also possible, as are one or more other ranges of eigenfrequencies.

In accordance with example embodiments, transmitting the electrical power into the spherical waveguide (in step 1402) may entail encoding particular information into the transmitted electromagnetic wave. Detecting the transmitted electromagnetic wave by the receiver apparatus may then entail detecting the encoded particular information. In further accordance with example embodiments, the particular information could be a timing signature. For example, a timing signature could be, or include, one or more particular pulses or pulse sequences. Other types encoding could be used as well. Non-limiting examples include amplitude modulation and/or phase modulation.

In accordance with example embodiments, determining the strength of coupling between the transmitted electromagnetic wave and the one or more eigenmodes (in step 1408) may entail measuring electric and magnetic field vectors of the detected electromagnetic wave, and then comparing the measured electric and magnetic field vectors with computed electric and magnetic field vectors of the one or more eigenmodes in the mathematical model of the spherical waveguide. The computed field values would be determined at a spatial location in the mathematical model that corresponds (at least as closely as possible within the localization supported in the model) to the location of the receiver apparatus.

In accordance with example embodiments, the one or more eigenmodes may form standing waves of an electric and magnetic vector field. Further, the receiver apparatus may be configured as plurality of receiver devices, each at a different remote location from the transmitter apparatus. Determining the strength of coupling between the transmitted electromagnetic wave and the one or more eigenmodes (in step 1408) may then entail predicting relative strengths of coupling among the plurality of receiver devices at each of the different remote locations based on standing waves, and comparing relative power measurements among the plurality of receiver devices with the predicted relative strengths of coupling.

In further accordance with example embodiments, predicting relative strengths of coupling among the plurality of receiver devices at each of the different remote locations based on standing waves may entail computing a numerical simulation of the transmitted electromagnetic wave based on a mathematical model of transmission properties of the transmitter apparatus. A discretized overlap integral may be computed between the one or more eigenmodes and the simulated transmitted electromagnetic wave at simulated locations corresponding to the different remote locations of the plurality of receivers. The discretized overlap integral can then be compared with an empirical overlap integral derived from measurements of electric and magnetic field vectors at the plurality of receiver devices.

In accordance with example embodiments, the transmitter apparatus may be configured as a plurality of electrically connected waveguide coupling elements. With this configuration, transmitting electrical power into the spherical waveguide by the transmitter apparatus (in step 1402) may entail transmitting electrical power by two or more waveguide coupling elements of the plurality while maintaining relative phases between the two or more waveguide coupling elements. The example method of FIG. 14A may then further entail predicting a relative change in the coupling strength between the transmitted electromagnetic wave and the one or more eigenmodes that would result from one or more given changes in the relative phases between the two or more waveguide coupling elements, and also entail predicting a change in the amount of power received by the receiver apparatus in the detected electromagnetic wave based on the predicted relative change in coupling strength. The relative phases between the two or more waveguide coupling elements may then be adjusted by the one or more given changes in the relative phases during transmission. A determination could thus be made as to whether or not a measured change in power received at the receiver apparatus is within a threshold of the predicted change in received power.

The method illustrated in FIG. 14B involves using measured power and information about computed eigenmodes to adjust properties of transmitted power. At step 1422, a transmitter apparatus transmits electrical power into a spherical waveguide bounded by a terrestrial surface and an ionospheric layer, wherein the electrical power is transmitted in an electromagnetic wave.

At step 1424, one or more eigenmodes of the spherical waveguide are computed based on a mathematical model that incorporates electrical properties of the terrestrial surface and plasma physics of the ionospheric layer. Again, in an example embodiment, the terrestrial surface is the surface of the Earth and the ionospheric layer is the ionospheric layer of the Earth, and the spherical waveguide is the Earth-ionosphere waveguide.

At step 1426, a receiver apparatus measures at least a portion of power from the transmitted electrical power.

At step 1428, an amplitude and phase of the electrical power transmitted by the transmitter apparatus are adjusted based on the computed one or more eigenmodes and the measured power, so as to cause a predicted change in the measured power.

Finally, at step 1430, a determination is made whether a measured change in power detected at the receiver apparatus is within a threshold of the predicted change in measured power.

In accordance with example embodiments, computing the one or more eigenmodes of the spherical waveguide (in step 1424) may entail numerically solving Maxwell's Equations applied to the mathematical model of the spherical waveguide and determining the one or more eigenmodes from the numerical solution, as well as eigenfrequencies and propagation constants for the one or more eigenmodes. Numerically solving Maxwell's Equations may be done by computing a numerical simulation in two spatial dimensions and/or three spatial dimensions. Transmitting could be done at one or more of the eigenfrequencies. Again, non-limiting example eigenfrequencies from simulations may be in a range of 5-100 kHz.

In accordance with example embodiments, the transmitter apparatus may be configured as a plurality of electrically connected waveguide coupling elements. With this configuration, transmitting electrical power into the spherical waveguide by the transmitter apparatus (in step 1422) may entail transmitting electrical power by two or more waveguide coupling elements of the plurality while maintaining relative phases between the two or more waveguide coupling elements. With this arrangement, adjusting the at least one of the frequency, amplitude, or phase of the electrical power transmitted by the transmitter apparatus (in step 1428) could entail predicting a relative change in the coupling strength between the transmitted electromagnetic wave and the one or more eigenmodes that would result from one or more given changes in the relative phases between the two or more waveguide coupling elements, and also entail predicting a change in the amount of power received by the receiver apparatus in the detected electromagnetic wave based on the predicted relative change in coupling strength. The relative phases between the two or more waveguide coupling elements may then be adjusted by the one or more given changes in the relative phases during transmission.

In further accordance with example embodiments, the one or more eigenmodes may form standing waves of an electric and magnetic vector field. Predicting the change in the amount of power received by the receiver apparatus in the detected electromagnetic wave based on the predicted relative change in coupling strength could then entail predicting relative changes in the electric and magnetic field vectors of the standing waves at the receiver apparatus.

In further accordance with example embodiments, the receiver apparatus may be configured as a plurality of receiver devices, each at a different remote location from the transmitter apparatus. With this arrangement, determining whether or not the measured change in power received at the receiver apparatus is within a threshold of the predicted change in received power (in step 1430) could entail computing a first empirical overlap integral derived from measurements of electric and magnetic field vectors at the plurality of receiver devices prior to adjusting the relative phases between the two or more waveguide coupling elements. A second empirical overlap integral could also be computed based on measurements of electric and magnetic field vectors at the plurality of receiver devices after adjusting the relative phases between the two or more waveguide coupling elements. A ratio of the first and second empirical overlap integrals could then be compared with the predicted relative change in coupling strength between the transmitted electromagnetic wave and the one or more eigenmodes.

III. Example Systems and Methods for Coupling to Low-Loss Eigenmodes of a Waveguide The discussion so far has focused on example systems and methods for determining, detecting, and validating properties of low-loss eigenmodes of the Earth—ionosphere waveguide. In accordance with example embodiments, the principles and techniques described above may be extended and expanded to enable low-loss eigenmodes to be used practically for global signal transmission, and in particular wireless power distribution on a global scale. In line with the disclosure above, a system for wireless power distribution needs to include a structure that can launch or generate electromagnetic fields that can couple to the one or more low-loss eigenmodes. Additionally, the system must include a structure that can receive power carried by the electromagnetic fields. In some examples, an identical structure can operate either as a transmitter or receiver. In the context of waveguides, a structure that can couple to a waveguide (either as a transmitter or receiver) can be referred to as a waveguide coupler.

Accordingly, a waveguide coupler is disclosed that can excite low-loss eigenmodes of the Earth-ionosphere waveguide. To do so, the waveguide coupler can launch an electromagnetic excitation that overlaps (i.e., mode-matches) one or more low-low loss eigenmodes of the Earth-ionosphere waveguide. Note that although the waveguide coupler disclosed herein is described in the context of coupling to the Earth-ionosphere waveguide, the disclosed waveguide coupler can also be used to couple to other types of waveguides (e.g., waveguides with different shapes, different boundary materials, and/or different dielectric materials than the Earth-ionosphere waveguide).

In accordance with example embodiments, the waveguide coupler may be configured excite low-loss eigenmodes of a waveguide by incorporating design characteristics based on properties of the waveguide. By way of example, the characteristics of a waveguide that can couple to the Earth-ionosphere waveguide can depend on properties of the Earth-ionosphere waveguide such as (i) properties of the ionospheric layer, (ii) properties of the terrestrial layer, and (iii) properties of the eigenmode solutions of the Earth-ionosphere waveguide, as well as properties of other known modes, such as those discussed above.

Based on these properties of the Earth-ionosphere waveguide, it can be determined that desired characteristics of a waveguide coupler that can excite low-loss eigenmodes of the Earth-ionosphere waveguide include that the coupler: (i) can generate an excitation that does not result in radiative losses outside of the ionosphere by penetrating through the ionosphere or by being overly attenuated by it; (ii) can generate an electromagnetic excitation that can overlap with at least one low-loss eigenmode of the Earth-ionosphere waveguide; (iii) has a Q value that is at least as great as a threshold; and (iv) can operate without a complex impedance matching network (in part because a complex impedance matching network can be lossy and can diminish otherwise high efficiency)

Figure 15:
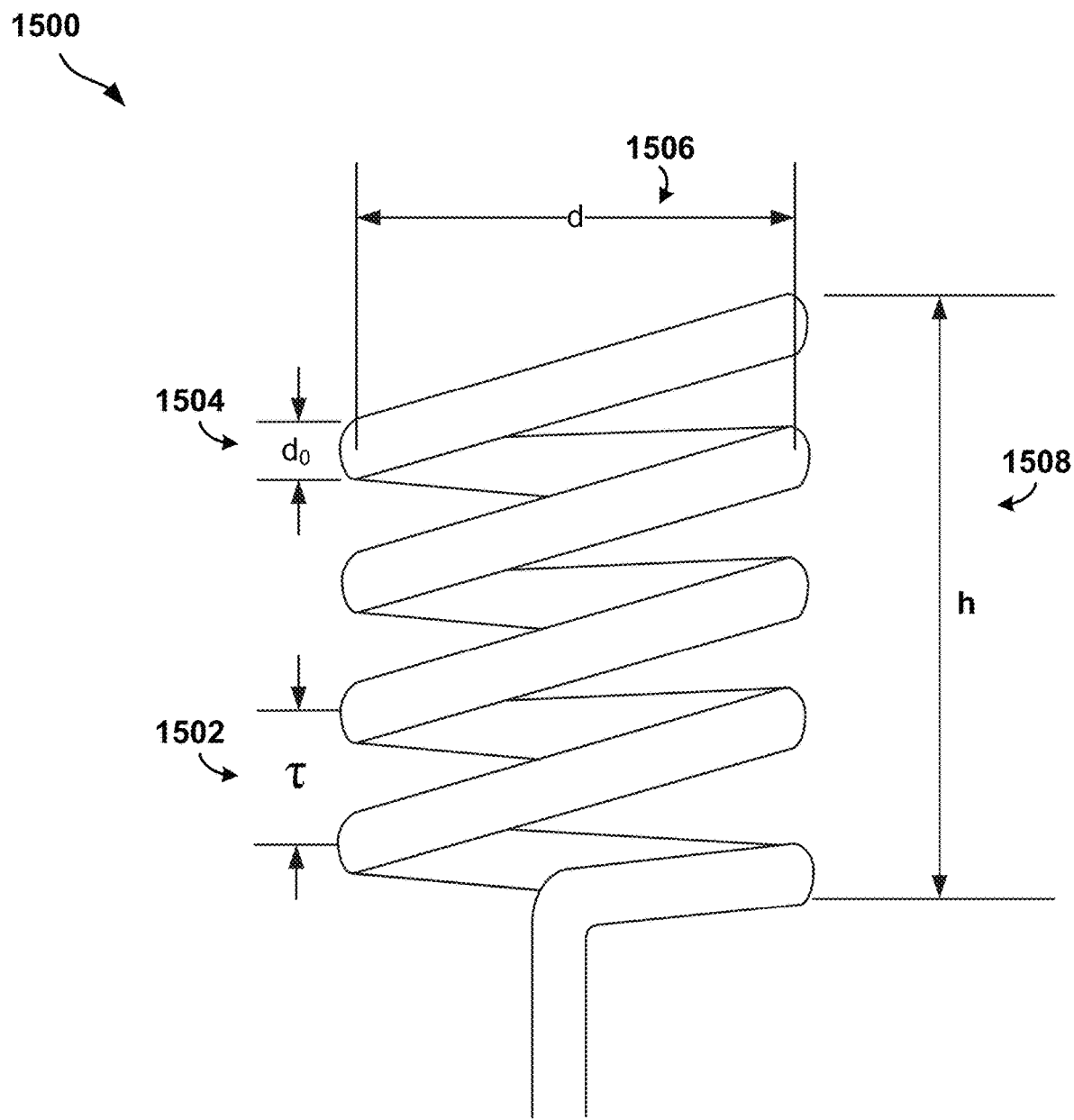
FIG. 15 is a simplified illustration of a helical antenna, in accordance with example embodiments.

FIG. 15 illustrates a waveguide coupler 1500 that can excite low-loss eigenmodes of the Earth-ionosphere waveguide, according to an example embodiment. As illustrated in FIG. 15, the waveguide coupler 1500 can be a vertically oriented helical coupler that includes a plurality of turns of coil. FIG. 15 also illustrates parameters of the helical coupler 1500 including (i) a height 1502 of each turn of coil (also referred to as a pitch □ of the helical coupler 1500), (ii) a wire diameter 1504 (also labelled as diameter "$d_0$" in FIG. 15) of each turn of coil, (iii) a winding diameter 1506 (also labelled as diameter "d" in FIG. 15), and (iv) a height 1508 (also labelled as height "h" in FIG. 15) of the helical coil coupler 1500. As discussed below, values for the parameters of the helical coupler 1500 can be determined such that the properties of the helical coupler 1500 satisfy the desired waveguide coupler characteristics described above, including the ability to excite one or more eigenmodes of the Earth-ionosphere waveguide.

In an embodiment, one or more of the desired waveguide coupler characteristics can be achieved by designing the helical coupler 1500 such that the coupler can achieve "supergain." Supergain describes a phenomenon in which a radiating array of N elements can achieve increased gain in comparison to a non-supergain array of N elements. In a supergain array, the gain can grow linearly with the number of antennas N, and can approach a magnitude of $N^2$ as the separation distance between the antennas approaches 0. A gain of $N^2$ is a significant increase in comparison to the maximum possible gain, N, for isotropic radiators spaced a half wavelength apart (i.e., a non-supergain array).

In an embodiment, achieving supergain can help the helical coupler 1500 excite low-loss eigenmodes of the Earth-ionosphere waveguide. As explained above, some eigenmodes of the Earth-ionosphere waveguide can extend into the ionosphere, and thus an electromagnetic excitation that overlaps such an eigenmode can be attenuated by the ionosphere. However, by achieving supergain (e.g., increased directivity), the helical coupler 1500 can decrease the attenuation by generating an electromagnetic excitation that has a suppressed vertical component and increased horizontal directivity. The vertically suppressed electromagnetic excitation can avoid interaction with the ionosphere, and therefore can decrease the attenuation by the ionosphere.

Returning again to FIGS. 10A, 10B, and 10C, each depicts a three-dimensional (3D) radiation pattern, according to an example embodiment. These figures can help illustrate the utility of supergain waveguide couplers by showing the effect that achieving supergain can have on a radiation pattern of a waveguide coupler.

FIG. 10A illustrates a radiation pattern 1000 of a radiating array 1002, which for the sake of simplicity, is depicted as a rod in FIG. 10A. FIG. 10A also illustrates vectors, such as vector 1004, that represent the fields that result in the radiation pattern 1000. In this example, the elements of the radiating array 1002 are not closely spaced, and therefore the array 1002 does not achieve supergain. In FIG. 10B, the elements of the radiating array 1002 are brought closer together. As illustrated, bringing the elements closer together compresses the radiation pattern 1000. Additionally, the field vectors are more horizontally directed than the field vectors in FIG. 3A. In FIG. 10C, the elements of the array 1002 are brought even closer together such that the array 1002 achieves supergain. As illustrated, the achieving supergain further compresses the radiation pattern 1000. Additionally, the field vectors are more horizontally directed than the field vectors in FIG. 10B.

Figure 16A:
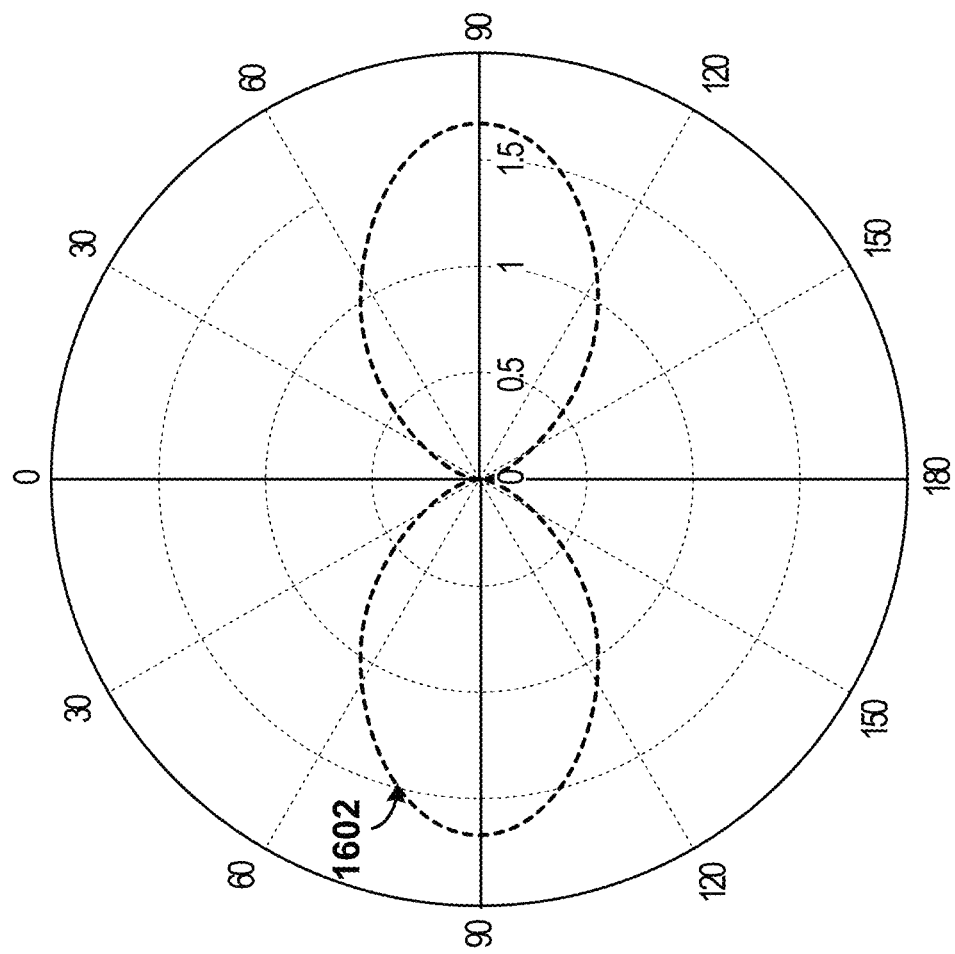
FIG. 16A is an illustration of an antenna pattern, in accordance with example embodiments.
Figure 16B:
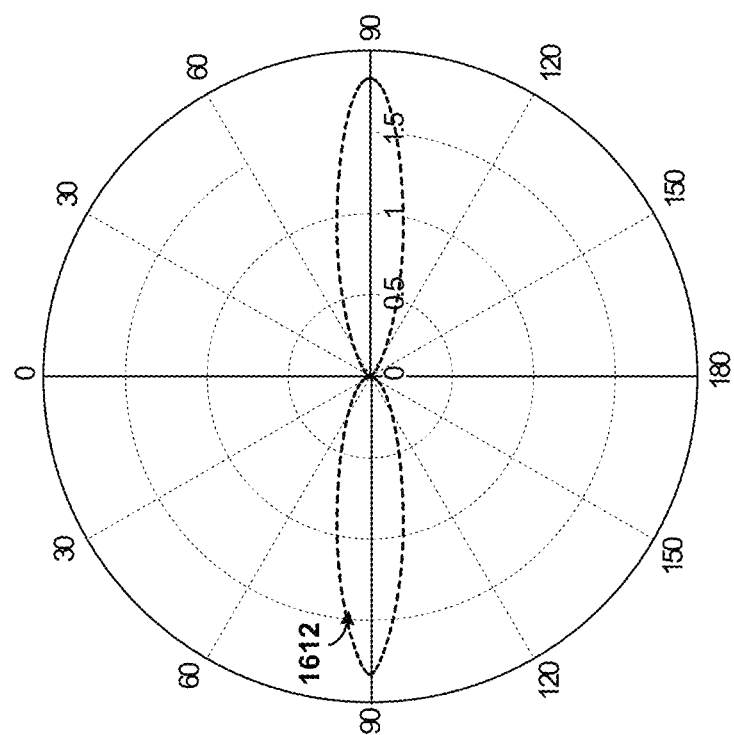
FIG. 16B is an illustration of a different antenna pattern, in accordance with example embodiments.

FIGS. 16A and 16B each depict a polar radiation plot, according to example embodiments. Like FIGS. 10A-10C, FIGS. 16A and 16B figures can help illustrate the utility of supergain waveguide couplers by showing the effect that achieving supergain can have on a radiation pattern of a waveguide coupler. FIG. 16A illustrates a polar radiation plot 1600 of a non-supergain waveguide coupler, and FIG. 16B illustrates a polar radiation plot 1610 of a supergain waveguide coupler. Both figures illustrate the polar radiation plot in complete 360 degrees in the azimuth plane. As illustrated in FIG. 16A, the radiation plot 1600 includes a main lobe 1602, and the radiation plot 1610 includes a main lobe 1612. As shown by comparing the main lobe 1602 and the main lobe 1612, the radiation pattern 1610 of the supergain antenna has a larger gain and more directivity than the radiation pattern 1602 of the non-supergain antenna.

In an embodiment, supergain can be achieved by arranging the elements in close proximity to one another. It may be counterintuitive to do so since bringing the elements of the array close together can reduce the array's gain due to an increase in mutual coupling between the elements. However, according to supergain antenna theory, the gain of the array can actually be increased by controlling a phase and/or magnitude of the radiation generated by each element.

In an embodiment, to apply supergain theory to the helical coupler 1500, the helical coupler 1500 can be modeled as an array where each turn of coil represents a radiating element. The helical coupler 1500 can also be viewed as equivalent to a stacked array of individual electric dipoles with magnetic dipoles disposed between the electric dipoles. In this representation, the spacing between the dipoles is equal to the turn-to-turn spacing of the helical coupler 1500.

In embodiment, the helical coupler 1500 can achieve supergain by arranging the turns of the helical coupler 1500 at a threshold distance with respect to one another. The threshold distance between the turns can be a function of a wavelength of a low-loss eigenmode solution of the Earth-ionosphere waveguide. For instance, the turns of coil can be spaced at intervals much less than the wavelength of an eigenmode of the Earth-ionosphere waveguide, perhaps at intervals equal to or less than a quarter wavelength of the eigenmode solution. In an example, the elements can be arranged on distance scales between $0.01\lambda$ and $0.0001\lambda$, where $\lambda$ is the eigenmode wavelength of a particular eigenmode solution.

To overcome the reactive forces that result from the close proximity of the turns, the helical coupler 1500 can be operated as a phased array in which the relative phases of the electromagnetic excitations generated by each turn can be controlled. In an embodiment, the phase and/or magnitude of the electromagnetic excitation generated by each turn can be controlled by controlling the phase and/or magnitude of power that drives each turn. In an example, each driven element can be coupled to an amplifier that can control the phase and/or magnitude of the power provided to each driven element. Additionally and/or alternatively, the helical coupler 1500 can include capacitor and/or inductor banks that can be used to control the phase and/or magnitude of the power that is provided to each driven element.

To further increase the gain of the supergain helical coupler 1500, the supergain helical coupler 1500 can include parasitic elements that can shape the electromagnetic excitation generated by the helical coupler 1500. Parasitic elements are not driven by a power source (i.e., not electrically coupled to another element or source) to generate an electromagnetic excitation, but rather can direct or modify an electromagnetic excitation that is generated by another element (e.g., a driven element). By including parasitic elements, the supergain helical coupler 1500 can operate like a Yagi-array that includes a driven element, a reflector, and several directors. Like in a Yagi-array, the parasitic elements can operate as directors or reflectors that can shape the electromagnetic excitation generated by the helical coupler 1500. It could be demonstrated using theory, simulation, and/or measurement that the gain could be increased using the helical coupler 1500 where at least one element of the coupler is acting as a reflector or director. In particular, to increase the gain of the supergain helical coupler 1500, the parasitic elements can further shape the electromagnetic excitation to be more directed.

In an embodiment, a length of a parasitic element, an orientation of the parasitic element, and/or the parasitic element's distance from the driven element can determine how the parasitic element shapes the electromagnetic excitation. Accordingly, the properties of a parasitic element can be determined such that the parasitic element can increase the directivity of the helical coupler 1500. For instance, it can be determined that the electromagnetic excitation of the helical coupler 1500 can include electromagnetic excitations that are e.g. 180° out of phase with respect to one another. To generate these excitations, rather than driving two elements separately, one element can be a parasitic element with parameters such that when placed near a driven element, the parasitic element can generate an electromagnetic excitation that is 180° out of phase with respect to the electromagnetic excitation generated by the driven element. That is, the parasitic element is driven at anti-resonance sympathetically from the driven element.

In an example, the parasitic elements can be turns of the helical coupler 1500 that are not directly driven by a power source. In another example, the parasitic elements can be stand-alone elements that are disposed near one or more turns of the helical coupler 1500. Other examples of parasitic elements are also possible.

In an embodiment, the efficiency of the supergain helical coupler 1500 can be increased by designing the helical coupler as an electrically small array. Generally, a radiating array is electrically small if the array's dimensions are small compared to the wavelength. More specifically, a radiating array can be considered electrically small if k×a<1.0, where k=2π/λ, and "a" is a radius of a sphere that circumscribes the radiating element as its "maximum dimension" measured from its center.

In an implementation of the electrically small helical coupler 1500, the turns of the helical coupler 1500 can be electrically small. In another implementation, in addition to being electrically small, the turns of the helical coupler 1500 can be resonant elements. Using electrically small resonant elements increases the efficiency of the helical coupler 1500 because the driven elements of the coupler can be driven without the use of large tuning reactances that can cause losses. This is due to the fact that when two electrically small resonant elements are placed in close proximity of one another, their input reactances are smaller in magnitude than the input reactances of below-resonance electrically small electric dipole antennas, and the resulting circulating currents cause an increase in $I^2R$ losses.

Another benefit of using resonant elements is the fact that they can be used as an effective passive director or reflector. In particular, shorting the input terminals of a resonant electrically small element allows the element to operate as a passive director or reflector. As such, in an embodiment, the electrically small helical coupler 1500 can also include one or more resonant elements with shorted input terminals. In an example, one or more turns of the helical coupler 1500 can be electrically small resonant elements with shorted input terminals. Thus, the helical coupler 1500 can be an electrically small supergain array that includes one or more electrically small resonant driven elements and one or more electrically small parasitic elements In an embodiment, in order to achieve resonance, the helical coupler 1500 can include one or more active and/or passive elements that can adjust the electrical length of the helical coupler 1500. For instance, in order to achieve resonance, the electrical length of the waveguide coupler can be a fraction of the wavelength of the eigenmode to which the helical coupler 1500 is coupling. In an example, the electrical length of the antenna may be half of the wavelength of the eigenmode. However, given that the desired eigenmodes for wireless power coupling are low modes with lower frequencies (e.g., on scale of 10s of KHz), it may not be physically feasible to build a helical coupler where the electrical length and the physical length are comparable. Accordingly, the helical coupler 1500 can use the one or more active and/or passive elements to adjust the electrical length of the helical coupler 1500 such that the electrical length is much larger than the physical structure of the helical coupler 1500.

In an embodiment, the helical coupler 1500 can be a slow-wave structure in order to physically shorten the length of the structure while maintaining the electrical length of the element. In particular, in a slow-wave structure, the phase velocity of the a wave that is propagating along the helical coupler 1500 is less than the speed of light in a vacuum, which results in the structure having a physical size that is different than the structure's electrical size. In an embodiment, the slow-wave structure can be designed such that the electrical size is larger than the physical size.

In an embodiment, the helical coupler 1500 can account for effects of the ionosphere on an electromagnetic excitation. For example, the effects of the ionosphere that can affect an electromagnetic excitation include the Faraday effect in which the ionosphere can cause a planar wave to rotate, which results in the wave having a circular polarization. Generally, a plane wave doesn't couple most of the power to a mode that is circularly polarized, which decreases the efficiency of the radiation. However, the electromagnetic excitation that is generated by the helical coupler 1500 can be elliptically polarized or approximately elliptically polarized (e.g., circularly polarized). Thus, the excitation does not lose energy to the Faraday effect when interacting with the ionosphere.

Additionally, the helical coupler 1500 can account for the dynamic, inhomogeneous, and anisotropic nature of the Earth-ionosphere waveguide. In an example, the helical coupler 1500 can account for the dynamic and anisotropic nature of the ionosphere. As explained above, the status of the ionosphere (e.g., level of ionization) can depend primarily on solar activity. Thus, the status of ionosphere can be location and time dependent. The helical coupler 1500 can also account for other elements in the waveguide that can be affected by or affect the electromagnetic generation generated by the helical coupler 1500, such as the climate, existing large electronic structures, and/or structures and transmissions. Other examples are also possible.

In an embodiment, to account for the dynamic, inhomogeneous, and anisotropic nature of the waveguide, the helical coupler 1500 can be implemented as a variable helical coil. Within examples, the variable helical coupler 1500 can dynamically adjust one or more of its parameters. The parameters that the variable coupler can adjust include (i) a height of each turn of coil, (ii) a wire diameter of each turn of coil, (iii) a winding diameter, (iv) a height of the helical coupler 1500, (v) a number of turns N in the helical coupler 1500, (vi) conductor material, and (vii) the cross-section of the coils. Other features that the variable helical coupler 1500 can adjust include the shielding and orientation of the connections between the elements of the helical coupler 1500.

In addition to adjusting the physical parameters of the helical coupler 1500 to account for the current nature of the Earth-ionosphere waveguide, the helical coupler 1500 can also use discrete elements in order to change the electric magnitude and/or phase relationships of the power that is provided to each turn of coil of the helical coupler 1500, which, in turn, can adjust the electromagnetic excitation to account for the status of the Earth-ionosphere waveguide.

In an embodiment, the variable helical coupler 1500 can determine one or more properties of the waveguide in order to determine how to adjust to account for the dynamic, inhomogeneous, and anisotropic nature of the waveguide. For instance, as explained above, the helical coupler 1500 can continually or periodically determine the status of the ionosphere in order to account for any changes in the ionosphere when generating the electromagnetic excitation. Based on the status of the ionosphere, the helical coupler 1500 can adjust one or more parameters of the helical coupler 1500 in order to account for the status of the ionosphere. Additionally and/or alternatively, the helical coupler 1500 can determine to adjust the electric magnitude and/or phase relationships of the power that is provided to each turn of coil. The resulting helical coupler 1500 will have strategically-differing coil diameters and/or strategically-differing inter-loop spacing.

Figure 17:
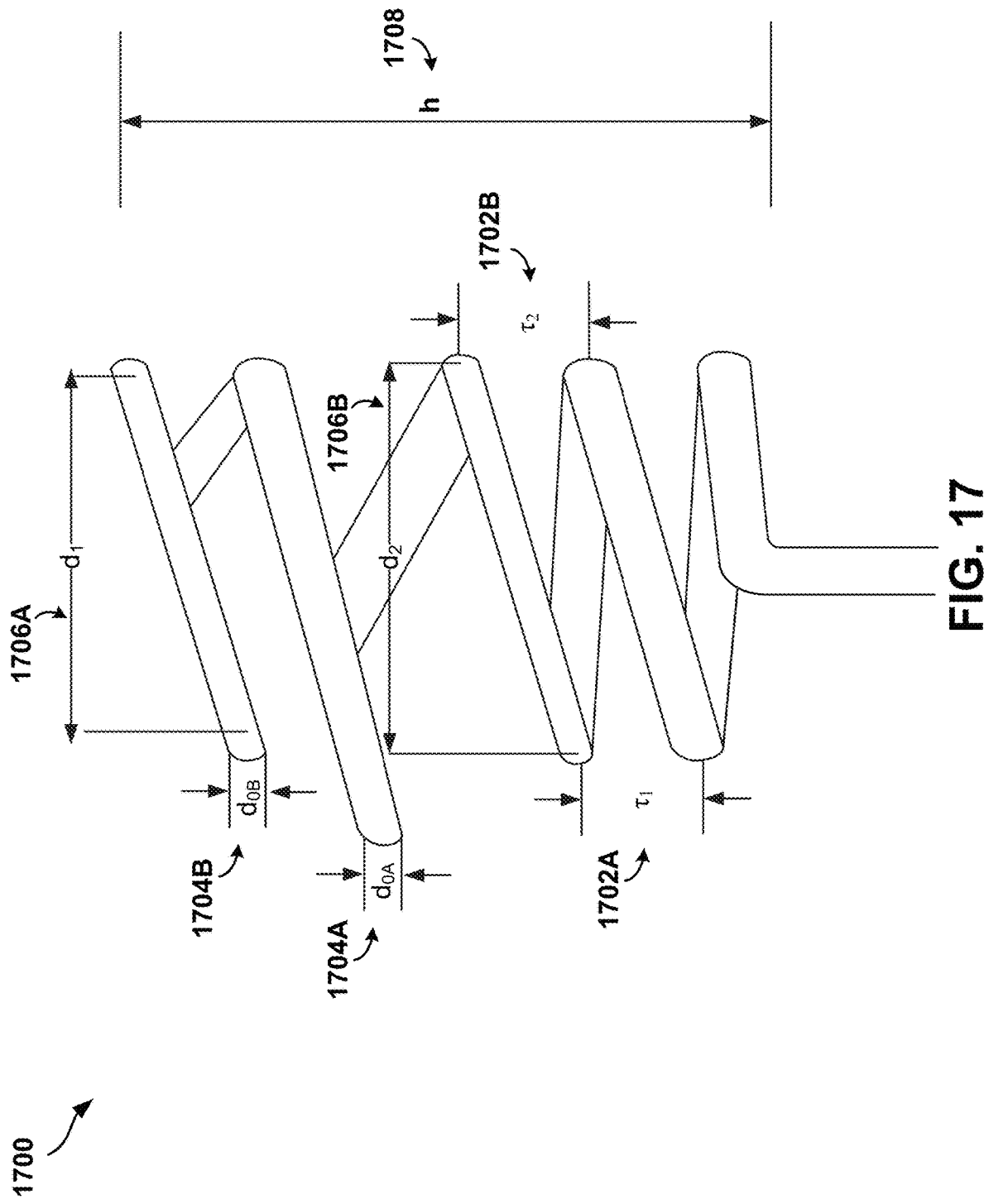
FIG. 17 is a simplified illustration of a helical antenna having variable dimensional parameters, in accordance with example embodiments.

FIG. 17 illustrates a variable helical coupler 1700, according to an example embodiment. As illustrated in FIG. 17, the helical coupler 1700 can have strategically-differing parameters including (i) differing pitches, e.g., pitches 1702A and 1702B, (ii) differing wire diameters, e.g., wire diameters 1704A and 1704B, and (iii) differing winding diameters, e.g., wire diameters 1706A and 1706B. As also illustrated in FIG. 17, the helical coupler 1700 can also have a height 1708.

In an embodiment, an excitation source may be used to provide the helical coupler 1500 with energy with which the coupler can generate the electromagnetic excitation. The excitation source can be electrically coupled to the helical coupler 1500 either directly or indirectly. In an example, the excitation source can be directly coupled to the helical coupler 1500 via one or more feed lines that directly drive one or more turns of coil. In another example, the excitation source can be electrically coupled to the helical coupler 1500 via magnetic and/or capacitive coupling. For instance, to couple to the helical coupler 1500 magnetically, the excitation source can include a resonant inductor that can inductively couple to the helical coupler 1500.

Figure 18A:
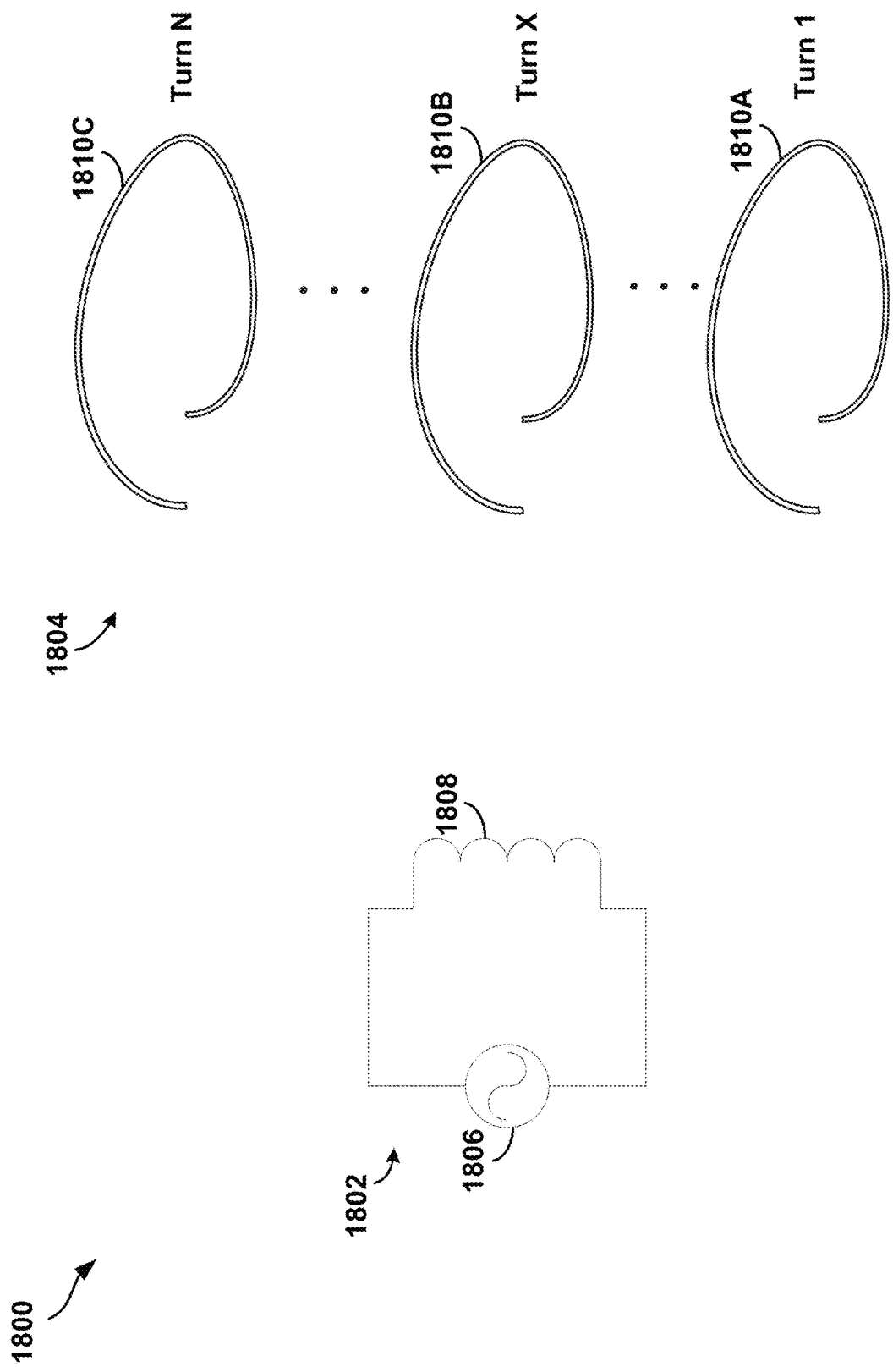
FIG. 18A is an example transmitter helical coupler, in accordance with example embodiments.

FIGS. 18A, 18B, 18C, and 18D illustrate different configurations of a helical coupler coupled to one or more excitation sources, according to example embodiments. FIG. 18A illustrates a first configuration 1800 of a helical coupler. As illustrated in FIG. 18A, a helical coupler 1804 is coupled to an excitation source 1802. In this configuration, the excitation source 1802 includes a power source 1806 and an inductor 1808. In an example, the inductor 1808 can be a coil of wire. As also illustrated in FIG. 18A, the helical coupler 1804 can include N turns of coil, such as turns E10A, E10B, and E10C. In this configuration, the turns of coil 1810A-1810C have identical dimensions.

Figure 18B:
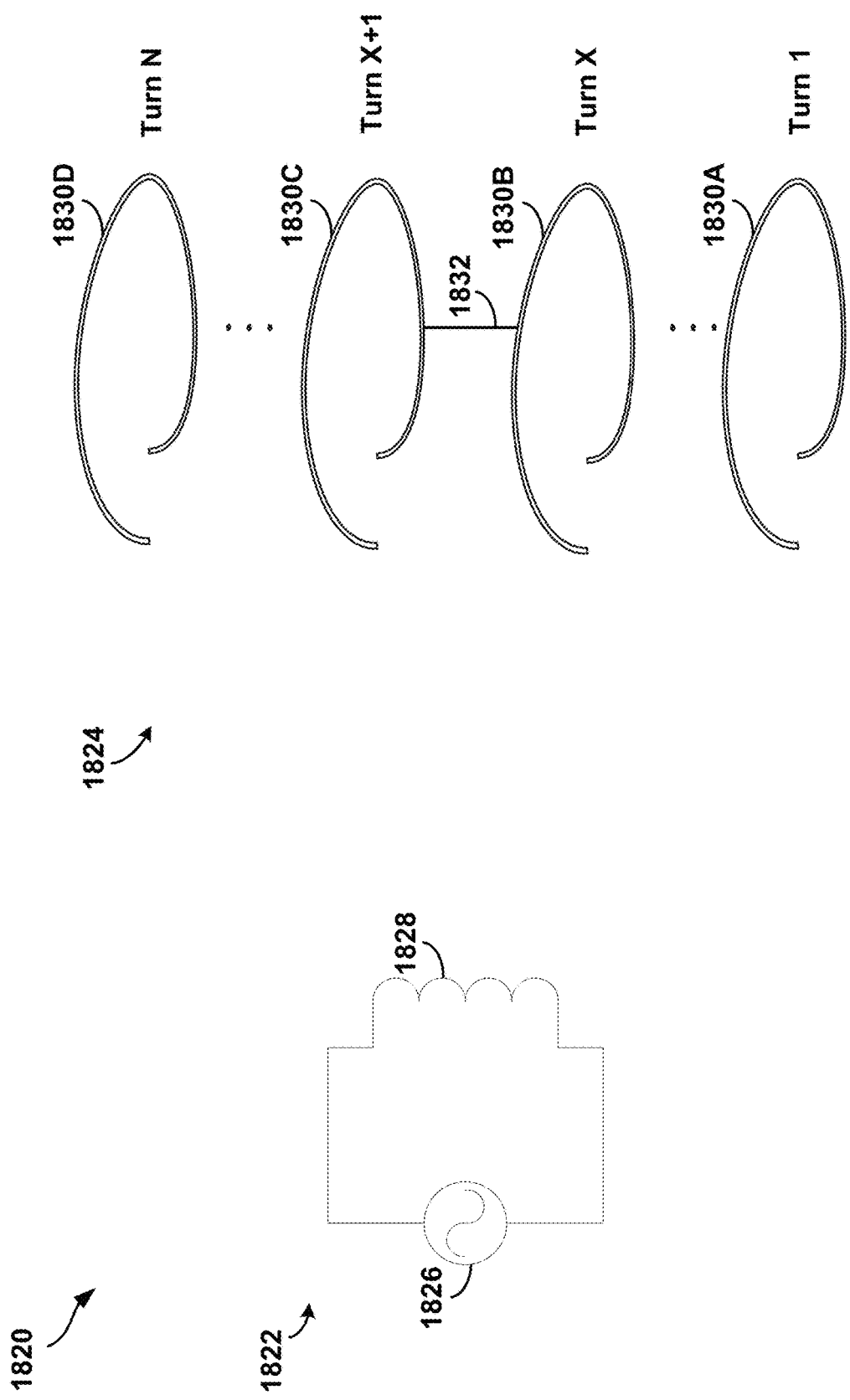
FIG. 18B is another example transmitter helical coupler, in accordance with example embodiments.

FIG. 18B illustrates a second configuration 1820 of a helical coupler. As illustrated in FIG. 18B, a helical coupler 1824 is coupled to an excitation source 1822. Like the configuration in FIG. 18A, the excitation source 1822 includes a power source 1826 and an inductor 1828, and the helical coupler 1824 includes N turns of coil. As also illustrated in FIG. 18B, the helical coupler 1824 includes a wire segment 1832 between turns 1830B and 1830C. The wire segment is a straight wire connection that connects between two turns of coil, and can be used to adjust the electrical phase of the power provided to coils, adjust the phase velocity, and/or be used for phase matching. In an example, the wire segment can have a length on the range of sub-feet, feet, tens of feet, hundreds of feet, etc.

Figure 18C:
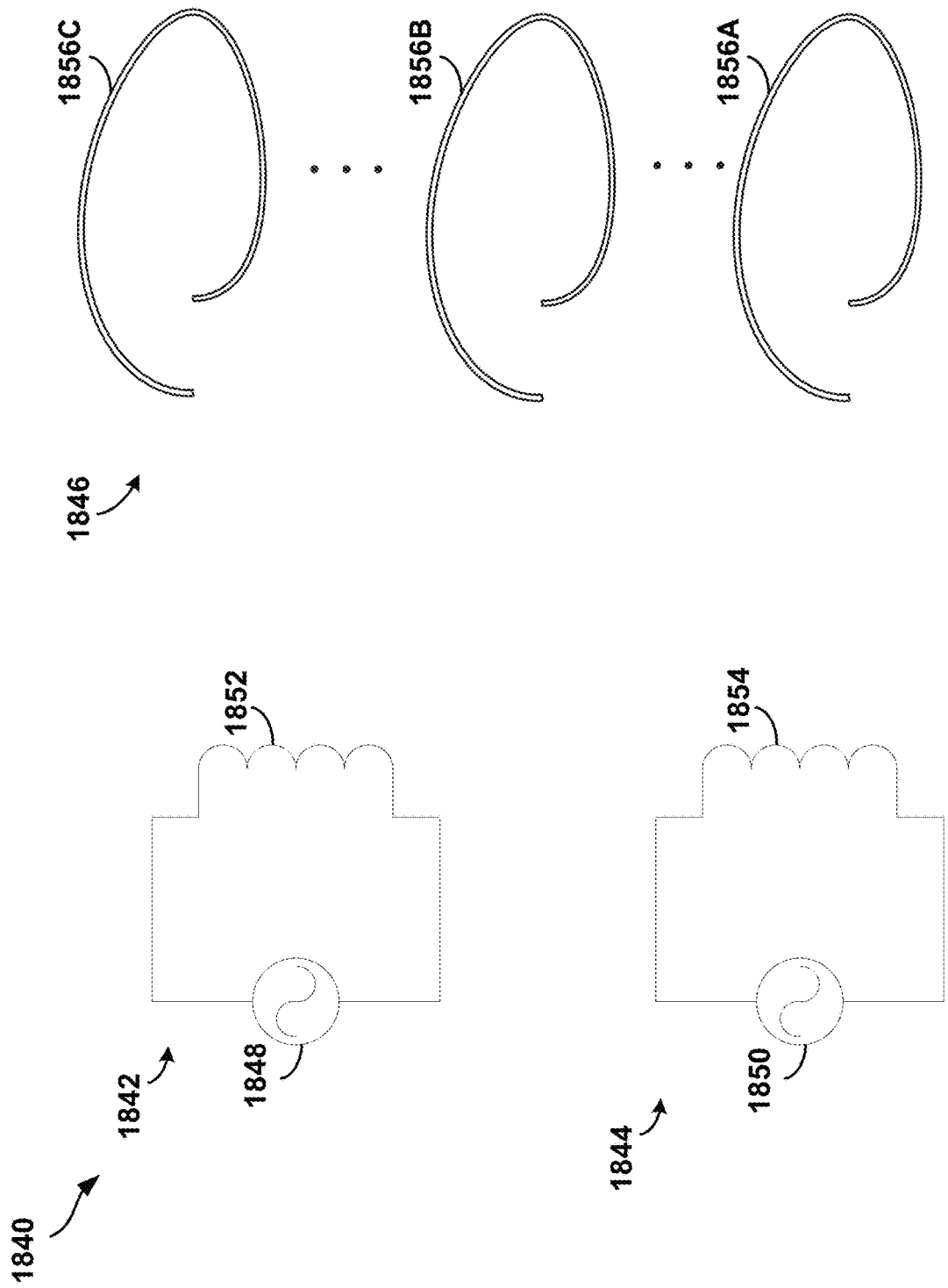
FIG. 18C is still another example transmitter helical coupler, in accordance with example embodiments.

FIG. 18C illustrates a third configuration 1840 of a helical coupler. As illustrated in FIG. 18C, a helical coupler 1846 is coupled to excitation sources 1842 and 1844, where each of the excitation sources includes a power source (1848 and 1850 respectively) and an inductor (1852 and 1854 respectively). As also illustrated in FIG. 18C, the helical coupler includes N turns, e.g., turns 1856A, 1856B, and 1856C.

Figure 18D:
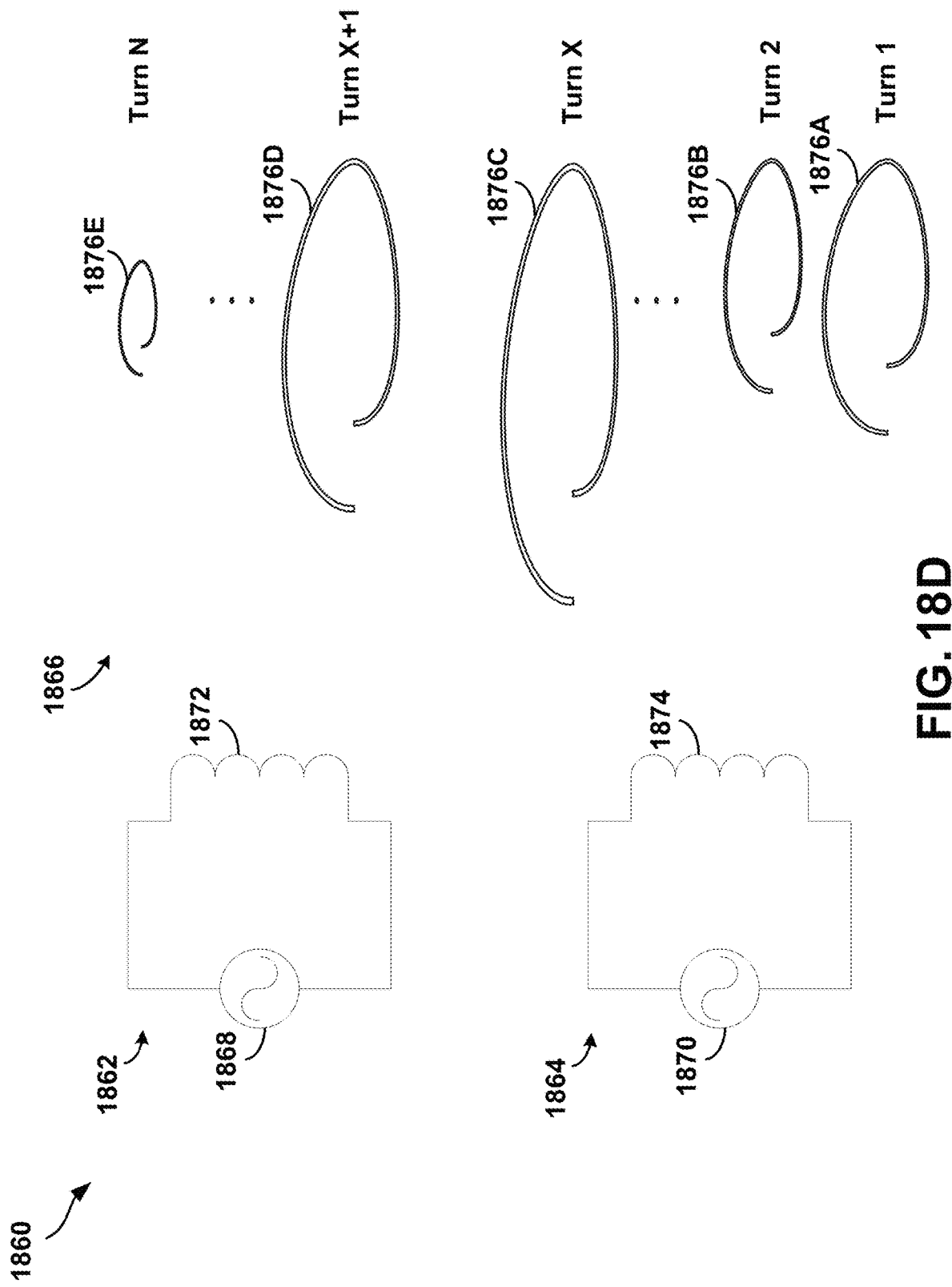
FIG. 18D is yet another an example transmitter helical coupler, in accordance with example embodiments.

FIG. 18D illustrates a fourth configuration 1860 of a helical coupler. As illustrated in FIG. 18D, a helical coupler 1866 is coupled to excitation sources 1862 and 1864, where each of the excitation sources includes a power source (1868 and 1868 respectively) and an inductor (1872 and 1874 respectively). Within examples, the helical coupler 1866 is a variable helical coupler that has variable parameters. As illustrated in FIG. 18D, the variable helical coupler 1866 has includes N turns, e.g., turns 1876A, 1876B, 1876C, E76D, and 1876E, where the turns have strategically-differing pitch, wire diameters, and winding diameters. For instance, each of the turns 1876A-1876E has a different wire diameter.

The example configurations of the excitation source and the helical coupler provided in FIGS. 18A, 18B, 18C, and 18D, and the accompanying description herein is for illustrative purposes only and should not be considered limiting. In an implementation, more than two excitation sources can be coupled to the helical coupler 1500.

Figure 19:
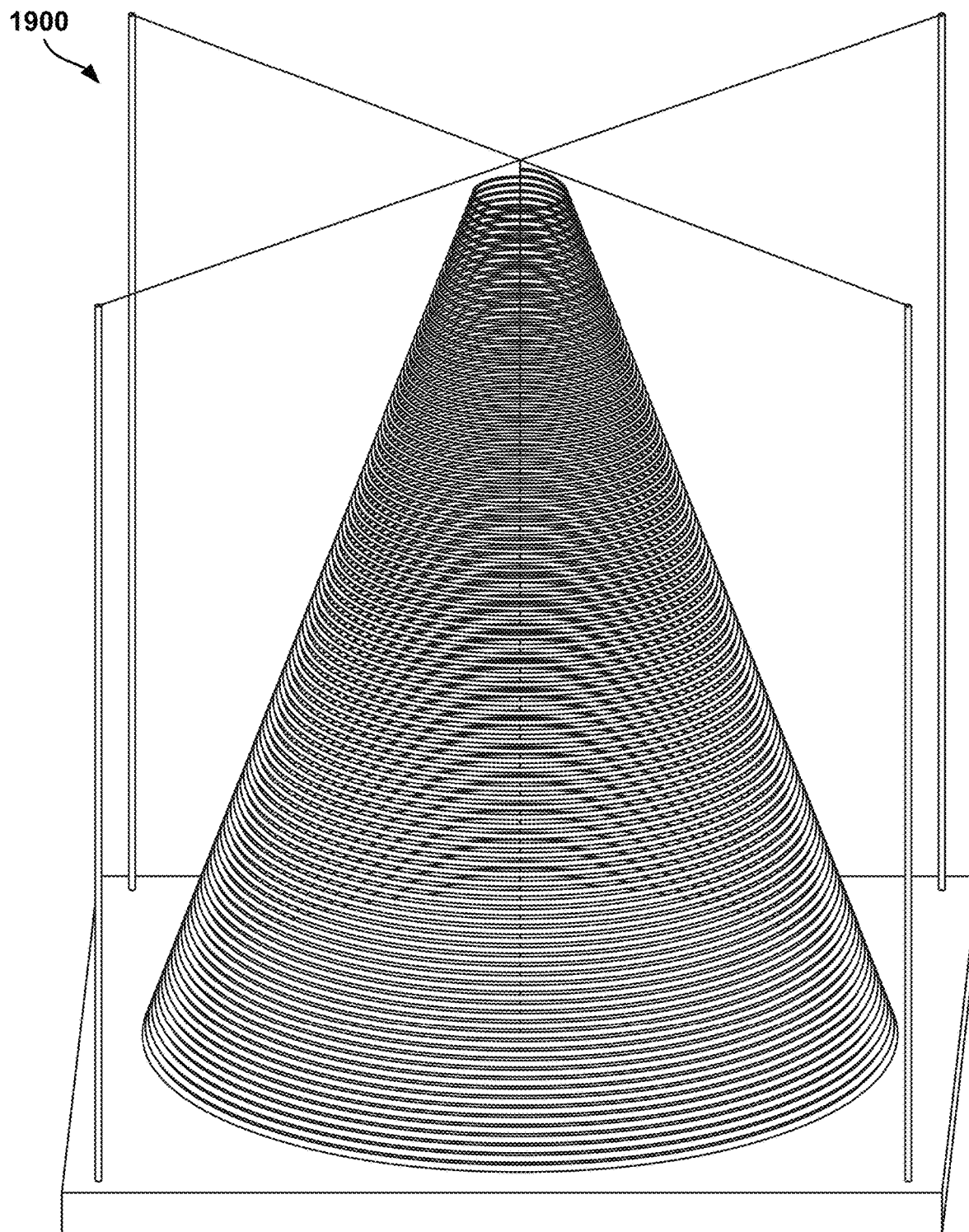
FIG. 19 is a simplified illustration of a helical supergain antenna, in accordance with example embodiments.

FIG. 19 illustrates an isometric view of a helical coupler 1900, according to an example embodiment. As illustrated in FIG. 19, the helical coupler 1900 is a variable helical coupler 1900 that includes strategically-varying parameters. For instance, as illustrated in FIG. 19, the turns of the helical coupler 1900 has varying diameters.

In an embodiment, the helical coupler 1900 can include supporting infrastructure that allows the helical coupler 1900 to operate as a transmitter or receiver. For instance, the supporting infrastructure can include a power source that can provide electrical energy to a transmitter helical coupler 1900. An example power source can include a renewable energy source such as a solar or wind farm that can provide the helical coupler 1900 with electric energy. In another example, the supporting infrastructure can include grid connections that transport energy between an electric grid and helical coupler 1900. The grid connections can include power or substation circuits that can align the phase and/or control the magnitude of the power that is provided to the grid.

Additionally and/or alternatively, the supporting infrastructure can include an earth ground connection. The earth ground connection can comprise an interconnected network of wires arranged on the surface of the Earth. The network of wires can extend radially from the base of the helical coupler 1900, perhaps for a distance nearly equal to or equal to the height of the helical coupler 1900. For example, the earth ground connection can include conductors that are arranged in a spider-like layout or that are arranged in fractals such that the conductors cover a large amount of surface area with Earth. Increasing the amount of surface area that the conductors share with the Earth can decrease the impedance of the earth ground connection, which decreases losses by improving the quality of the earth ground connection. Other methods of decreasing the impedance of the earth ground connection can include increasing the depth to which the earth ground connections are driven, increasing the number of earth ground connections, increasing the moisture content of the soil, and improving the conductive mineral content of the soil. Additionally and/or alternatively, a counterpoise that is supported above ground can be used as a ground plane.

Figure 20:
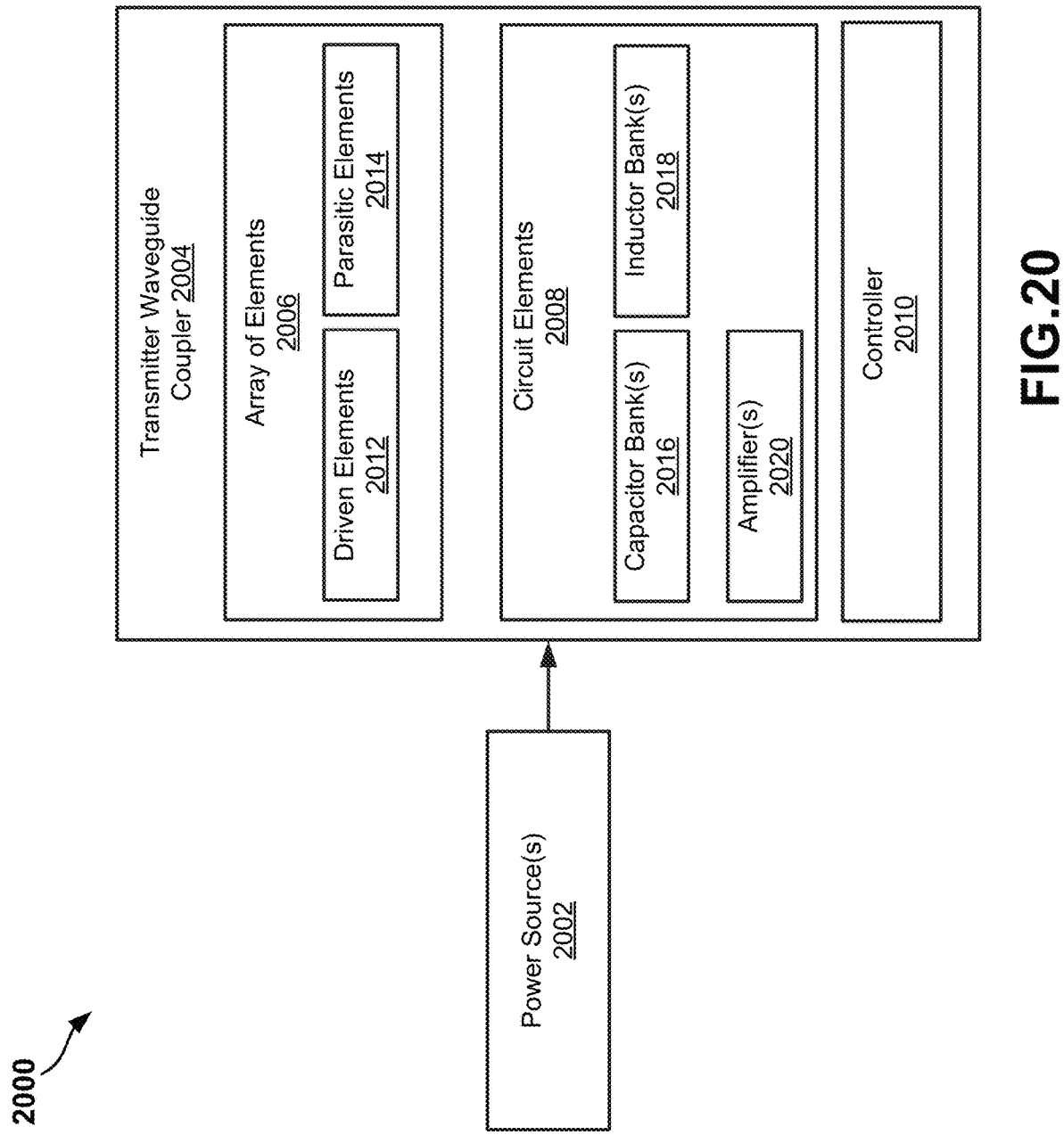
FIG. 20 is block diagram of a waveguide coupler, in accordance with example embodiments.

FIG. 20 is a simplified block diagram illustrating a transmitter waveguide coupler 2004 coupled to a power source 2002, according to an example implementation. The transmitter waveguide coupler 2004 can be configured to generate an electromagnetic excitation that can couple to an eigenmode of a waveguide. As illustrated in FIG. 20, the waveguide coupler 2004 can include an array of elements 2006 that can include driven elements 2012 and parasitic elements 2014. The array of elements 2006 can include resonators and/or coils that operate as an array of deep sub-wavelength spaced arrays of electric and magnetic dipole sources, connected with specific amplitude and phase relationships between the array elements.

As also illustrated in FIG. 20, the transmitter waveguide coupler 2004 can include circuit elements 2008 that include, but are not limited to, capacitor banks 2016, inductor banks 2018, and amplifiers 2020. Within examples, the circuit elements 2008 may be arranged in the transmitter waveguide coupler 2004 to achieve specific functionality such as impedance matching, adjusting the electrical length of the waveguide coupler, adjusting the magnitude and/or phase of the power provided to each element, among other examples. Furthermore, the circuit elements 2008 can be arranged to compensate for any inefficiencies (e.g., radiation losses) in the transmitter waveguide coupler 2004. For example, if the load impedance and output impedance of an amplifier are different, the utilization of the available energy may not be very efficient. To compensate for the difference in impedance, one or more circuit elements 2008 can be arranged to form an impedance matching circuit. Other possible circuit elements include but are not limited to include switches (e.g., solid state switches, vacuum tubes, mercury switches, etc.), transmission lines, open or short circuited stubs, transformers, strongly or weakly coupled magnetic or electric resonators.

Within examples, the power source 2002 may include a source of power such as a generator. As explained above, the power source 2002 can be directly or indirectly coupled to the waveguide coupler. Additionally, the power source 2002 can include one or more resonant elements that allow the power source 2002 to wirelessly, via its near field, couple energy inductively and/or capacitively to the transmitter waveguide coupler 2004.

In an embodiment, in order to generate an electromagnetic excitation, the transmitter waveguide coupler 2004 can substantially synthesize currents on lossy conducting mediums (e.g., the ionosphere and the terrestrial layer). By doing so, the transmitter waveguide coupler 2004 can generate an electromagnetic excitation that is not a radiated wave, but rather is a guided wave in the Earth-ionosphere waveguide.

The waveguide coupler 2004 can excite a single eigenmode of the Earth-ionosphere waveguide or can excite a specific set of eigenmodes without exciting others. Additionally, the electromagnetic excitation of the waveguide coupler 2004 can overlap or substantially overlap an eigenmode of the Earth-ionosphere waveguide. An electromagnetic excitation that substantially overlaps an eigenmode has a threshold overlap integral with the eigenmode. The threshold overlap integral can be expressed as a percentage or ratio. For example, the threshold overlap integral may be 50%. Other examples are possible.

Figure 21:
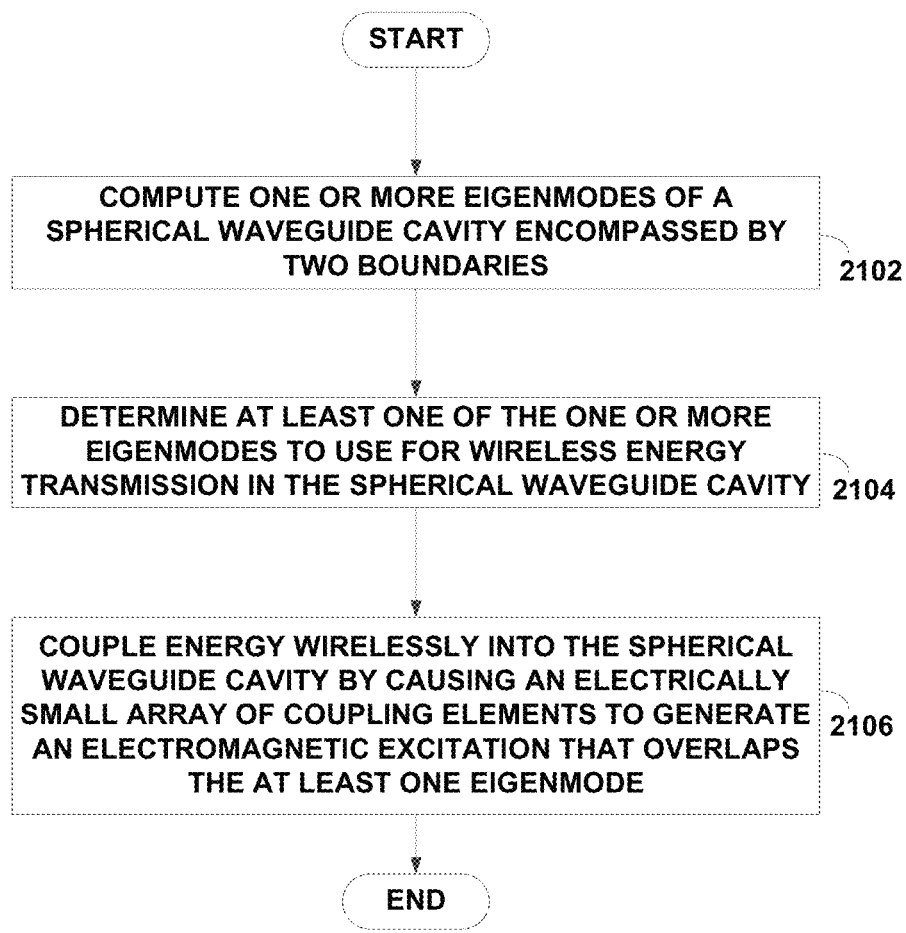
FIG. 21 is flowchart of an example method of coupling to an eigenmode using an antenna array, in accordance with example embodiments.

FIG. 21 is a flowchart illustrating an example method. As with the other example methods described above and in accordance with example embodiments, the method illustrated in FIG. 21 may be implemented using one or more transmitter apparatuses or devices, one or more receiver apparatuses or devices, and one or more computing systems configured for executing instructions for carrying out various steps and functions described herein.

At step 2102, one or more eigenmodes of a spherical waveguide cavity encompassed by two boundaries are computed. This can be one according to one or another of the techniques described above.

At step 2104, at least one of the one or more eigenmodes is chosen to be used in wireless energy transmission in the spherical waveguide cavity.

Finally, at step 2106, energy is coupled wirelessly into the spherical waveguide cavity, wherein the coupling comprises causing an electrically small array of coupling elements to generate an electromagnetic excitation that overlaps the at least one eigenmode.

In accordance with example embodiments, computing the one or more eigenmodes may be based on a mathematical model that incorporates respective properties of the two boundaries.

In accordance with example embodiments, a first one of the boundaries is a terrestrial surface and a second one of the boundaries is an ionospheric layer. For this arrangement, the respective properties of the terrestrial surface are electrical properties, and the respective properties of the ionospheric layer are properties based on plasma physics of the ionospheric layer.

III. Example Systems and Methods for Global Transmission of Power in Eigenmodes of the Earth-Ionosphere Waveguide A single antenna array having supergain properties and/or incorporating appropriate supergain antenna design aspects may serve as a single wireless power transmission (excitation) station or "launcher" for coupling into one or more low-loss eigenmodes of the Earth-ionosphere waveguide. The helical coupler described above can act as such a supergain array. By deploying multiple helical couplers and coordinating their operation, global or nearly global wireless power distribution may be achieved. In such scenarios, the entire volume of the Earth-ionosphere waveguide may support standing waves of one or more eigenmodes such that the power density at any point may be tapped at a level commensurate with a receiving antenna's electrical size and coupling efficiency.

In accordance with example embodiments, the helical coupler can be used for wireless power transmission in the Earth-ionosphere waveguide. In this embodiment, the helical coupler can operate as a transmitter to generate an electromagnetic excitation that can be guided along one or more low-loss eigenmodes of the Earth-ionosphere waveguide. Additionally, the helical coupler can operate as a receiver to receive the guided electromagnetic excitation.

Figure 22:
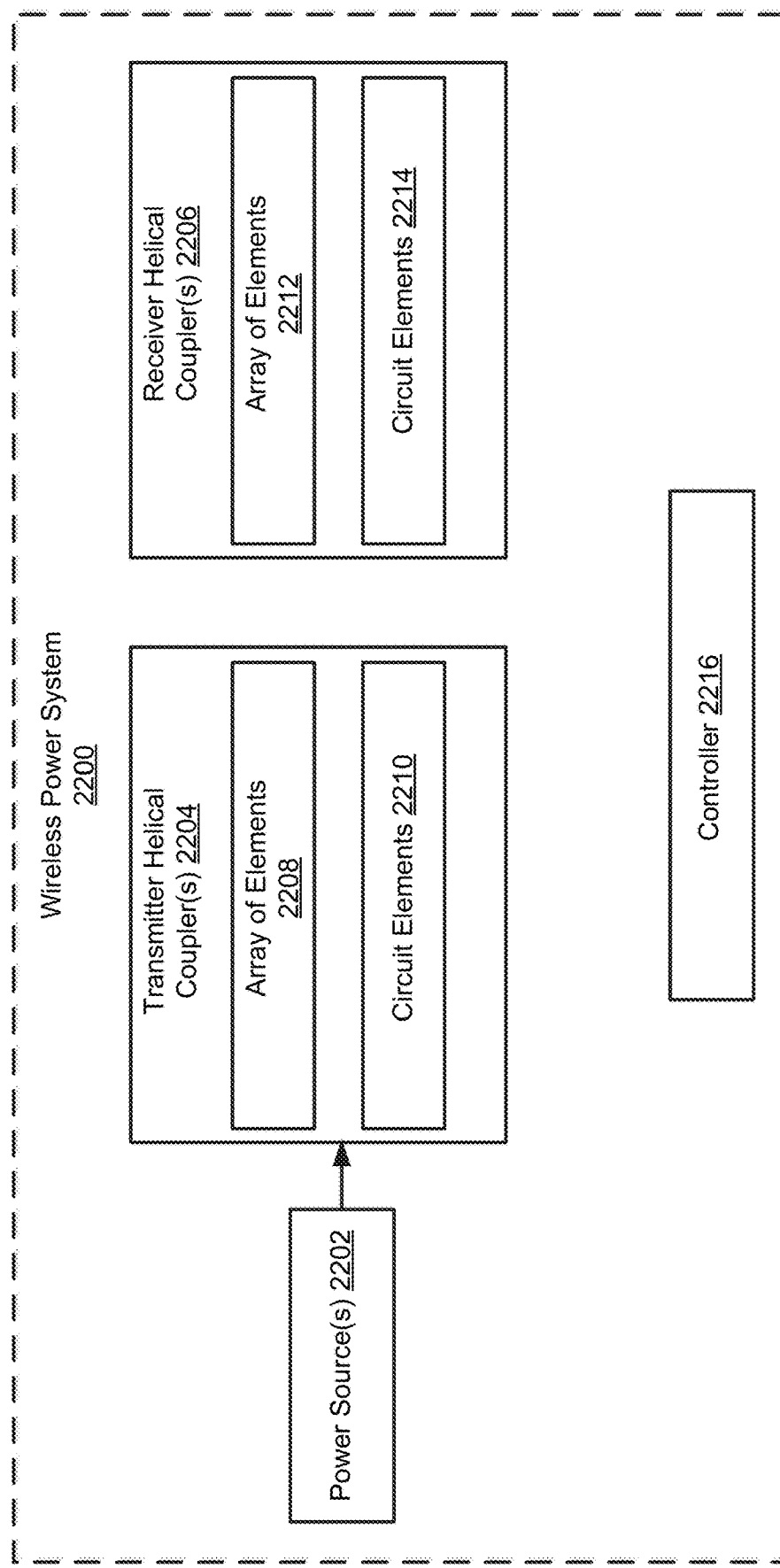
FIG. 22 is block diagram of a wireless power distribution system, in accordance with example embodiments.

FIG. 22 is a simplified block diagram illustrating a wireless power system 2200 that can be used for wireless power transmission in the Earth-ionosphere waveguide, according to an example implementation. As illustrated in FIG. 22, the wireless power system 2200 can include a power source 2202, a transmitter helical coupler 2204, a receiver helical coupler 2206, and a controller 2216.

In an embodiment, the transmitter 2204 and the receiver 2206 can be strategically disposed within the waveguide cavity in order to wirelessly transmit power between two locations. Determining a location in which to install a transmitter or receiver can be based on properties of the waveguide between the two locations. Such properties include properties of the ionosphere and the terrestrial surface, e.g., a conductivity and permittivity of the ionosphere and the terrestrial surface between the two locations. Other factors can also include locations of natural or man-made obstacles that can interfere with the operation of a helical coupler. Additional constraints on the locations can include factors such as available area to install the transmitters and receivers, etc.

In an embodiment, the transmitter helical coupler 2204 can receive instructions to transmit a certain amount of energy to the receiver helical coupler 2206. For instance, the controller 2216 can receive instructions or determine to send the certain amount of energy from the transmitter helical coupler 2204 to the receiver helical coupler 2206.

In an embodiment, to transmit the energy to the receiver helical coupler 2206, the transmitter helical coupler 2204 can generate a traveling wave that is guided along one or more low-loss eigenmodes of the Earth-ionosphere waveguide. In order to generate an electromagnetic excitation that overlaps the one or more low-loss eigenmodes, the controller 2216 can determine the one or more low-loss eigenmodes that will be used for the transmission. The low-loss eigenmodes can be known to the controller 2216, such as previously determine low-loss eigenmodes, or can be determined using the methods described herein.

Once the one or more eigenmodes are determined, the controller 2216 can determine a status of the Earth-ionosphere waveguide along the one or more eigenmodes. Determining the status of the Earth-ionosphere waveguide can include determining a status or condition of the ionosphere between the transmitter helical coupler 2204 and the receiver helical coupler 2206 at the time of generating the electromagnetic excitation. For instance, a status of the ionosphere can include a level of ionization and a height of ionosphere (e.g., the D layer). Additionally and/or alternatively, determining the status of the Earth-ionosphere waveguide can include determining a status or condition of the terrestrial surface, such as the conductivity and/or permittivity of the surface.

Based on the determined status of the Earth-ionosphere waveguide, the controller 2216 can determine one or more parameters of the transmitter helical coupler 2204. The one or more parameters of the transmitter helical coupler 2204 can include a magnitude and phase of a power provided to each element of the transmitter helical coupler 2204. Additionally and/or alternatively, if the transmitter helical coupler 2204 is a variable helical coupler, the one or more parameters can include parameters of the variable helical coupler, such as a pitch, wire diameter, wire cross-section, etc. In particular, the controller 2216 can determine the one or more parameters such that the generated electromagnetic excitation overlaps or substantially overlaps one or more low-loss modes of the Earth-ionosphere waveguide.

Once the parameters are determined, the controller 2216 can operate the transmitter helical coupler 2204 at the determined parameters to send a pulse or low energy signal to the receiver helical coupler 2206 to determine whether the overlap integral between the pulse and the eigenmodes is greater than or equal to a predetermined efficiency threshold. If the overlap integral is greater than the threshold, then the controller 2216 will proceed to operate the helical coupler 2204 at the determined parameters to send the energy to the receiver helical coupler 2206. Otherwise, the controller 2216 can determine a different set of one or more eigenmodes, and can repeat the steps described above until the overlap integral of a pulse is greater than or equal to the predetermined efficiency threshold.

By performing these steps, the controller 2216 can effectively account for the status of the Earth-ionosphere waveguide when determining how to generate and transmit the electromagnetic excitation that includes the certain amount of energy. Then, to receive the transmitted energy, the receiver helical coupler 2206 can receive the traveling wave (i.e., the electromagnetic excitation). The receiver helical coupler 2206 can then supply the received energy to a load (e.g., a grid). Within examples, the wireless power system 2200 can transmit power on the scale of kilowatts, megawatts, gigawatts, or terawatts.

In order for the wireless power system 2200 to be used for wireless power transmission, the transmitter and receiver helical couplers 2204, 2206 must be able to exchange large amounts of energy. In part due to power limitations of a single transmitter or receiver helical coupler, a single helical coupler operating as a transmitter or receiver may not be able to handle enough energy to be considered useful for power transmission.

To overcome the power limitations of a single helical coupler, the transmitter helical coupler 2204 and the receiver helical coupler 2206 can each include an array of helical couplers. By including an array of helical couplers, the transmitter helical coupler 2204 and the receiver helical coupler 2206 can handle an amount of energy suitable for power transmission. The array of helical couplers is described below in the context of the transmitter helical coupler 2204. However, the description can also be applicable to the receiver helical coupler 2206.

Figure 23A:
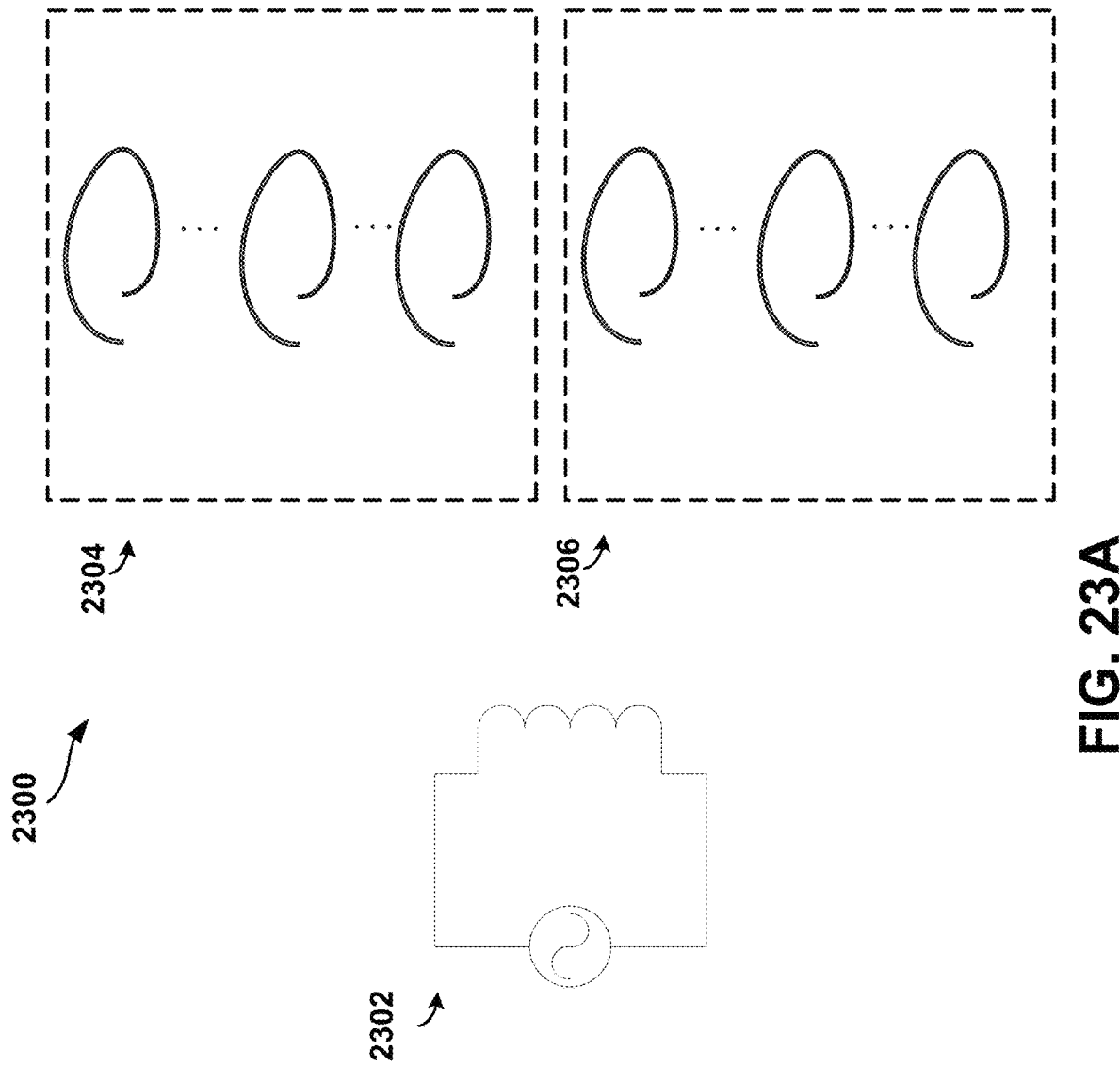
FIG. 23A illustrates a transmitter helical coupler, in accordance with example embodiments.
Figure 23B:
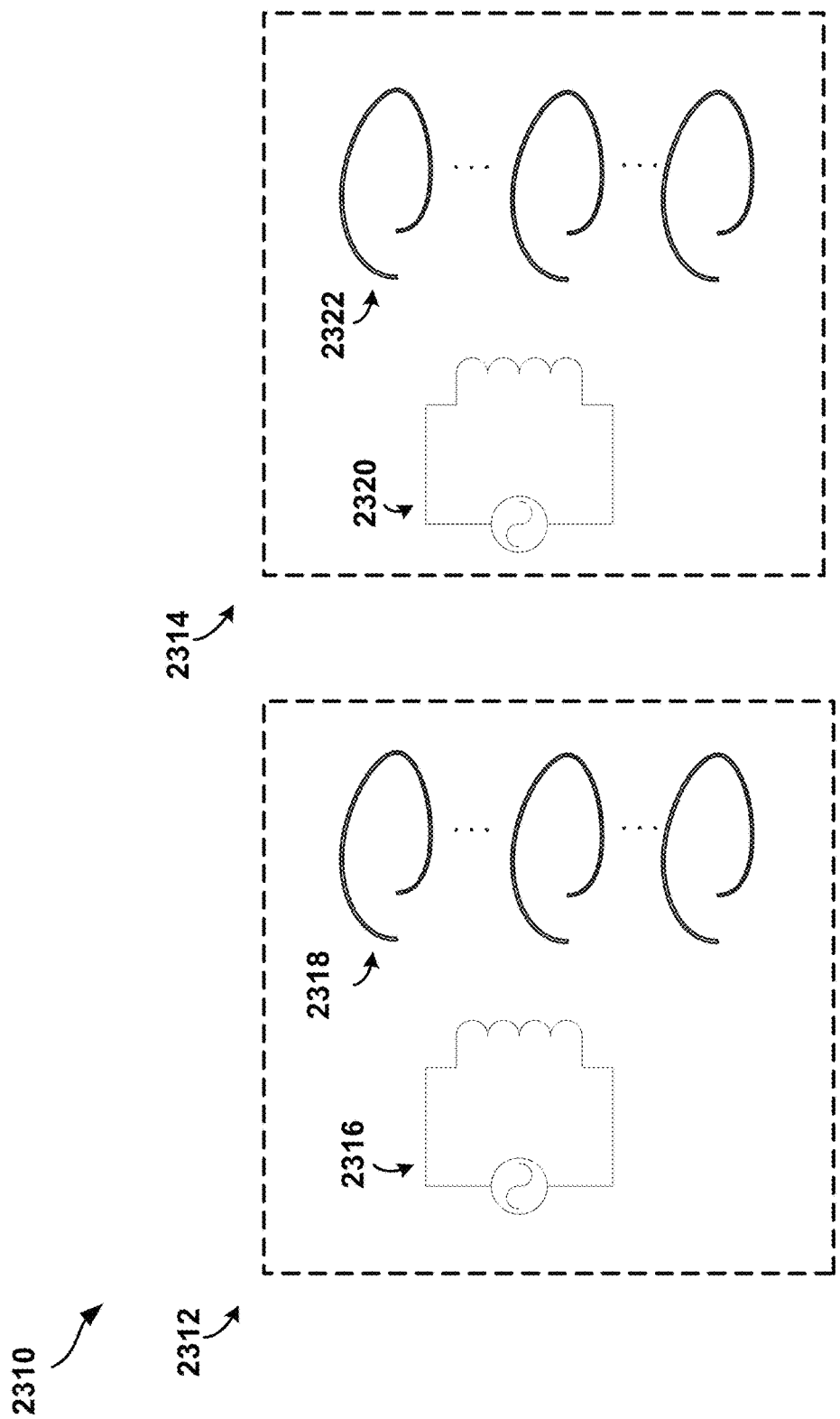
FIG. 23B illustrates another transmitter helical coupler, in accordance with example embodiments.

FIGS. 23A and 23B illustrate different configurations of a transmitter helical coupler that includes an array of helical couplers, according to an example embodiment. In the configuration illustrated in FIG. 23A, the transmitter coupler 2304 is an array of a plurality of helical couplers that are coupled to a power source 2302. For illustration purposes, the transmitter helical coupler 2304 is an array of two helical couplers 2304 and 2306. However, the transmitter helical coupler 2304 can include X helical couplers, where X is on the scale of tens or hundreds. The helical couplers of an array, e.g., array 2300, can be identical or different helical couplers.

In the configuration illustrated in FIG. 23B, a transmitter helical coupler 2310 can include an array of helical couplers each coupled to a respective power source. As illustrated in FIG. 23B, each element of the array includes a power source, e.g., power sources 2316 and 2320, and a helical coupler, e.g., helical couplers 2318 and 2322. Other example configurations of transmitter helical couplers are also possible.

In an embodiment, the description of a single transmitter helical coupler transmitting energy to a single receiver helical coupler can be expanded to a network of geographically distributed transmitter helical couplers and receiver helical couplers. In this embodiment, the network of transmitter helical couplers and receiver helical couplers can transmit power on a large scale, perhaps on a global scale.

To achieve power transmission on a global scale, the transmitter helical couplers and the receiver helical couplers can be strategically placed within the Earth-ionosphere waveguide. Similar to determining the location of a single helical coupler, determining a location for each of the helical couplers in the network can be based on one or more properties of the Earth-ionosphere waveguide and on properties of one or more low-loss eigenmodes that could be used for power transmission.

As explained above, to be able to handle an amount of energy suitable for power transmission, a transmitter can include an array of helical couplers. As such, the transmitter in a global wireless power system can be operated as a phased array in which a magnitude and phase of an electromagnetic excitation generated by each of the helical couplers can be controlled to produce a desired electromagnetic excitation of transmitter. And the electromagnetic excitation generated by a helical coupler can be controlled by adjusting one or more parameters of the helical coupler. Accordingly, the electromagnetic excitation generated by each array element (i.e., helical coupler) can be controlled in order to generate an overall electromagnetic excitation that overlaps a low-loss eigenmode of the Earth-ionosphere waveguide. Effectively, a controller of the system can control each element of each helical coupler in the array of helical couplers in order to cause the transmitter to generate a particular electromagnetic excitation.

In an embodiment, the global wireless system can transmit power from one or more transmitters to one or more receivers via one or more low-loss eigenmodes of the Earth-ionosphere waveguide. To do so, the transmitters can generate traveling waves in the Earth-ionosphere waveguide, as described above. Each traveling wave can carry a certain amount of energy and can be directed to one or more receivers.

Additionally and/or alternatively, the geographically distributed arrays can be operated with controlled inter-array magnitudes and phases so as to set up standing waves in the Earth-ionosphere. In such scenarios, the entire volume of the whole Earth-ionosphere waveguide can support the standing waves overlapping one or more low-loss eigenmodes such that the power density at any point can be tapped by a receiver. More specifically, the transmitters can be operated to electromagnetic excitations that interact to form one or more standing waves that overlap one or more low-loss eigenmodes of the Earth-ionosphere waveguide. Within examples, the locations of where the transmitters are installed in the Earth-ionosphere waveguide can depend on where the nodes or anti-nodes of a standing wave of a low-loss eigenmode are located.

Once the standing waves are formed, each standing wave oscillates between a node and an anti-node. The transmitters can increase or decrease the amount of power in a standing wave by continually or periodically adjusting the amount of energy coupled into the Earth-ionosphere waveguide. Furthermore, once the standing waves are formed, each standing wave can be tapped by a receiver in order to extract energy from the electromagnetic excitation at a level commensurate with a receiver's electrical size and couple efficiency. The receivers can be disposed at particular locations with respect to the nodes or anti-nodes of the established standing waves at locations. For example, some receivers can be disposed at locations where the standing the standing waves peak.

Figure 24:
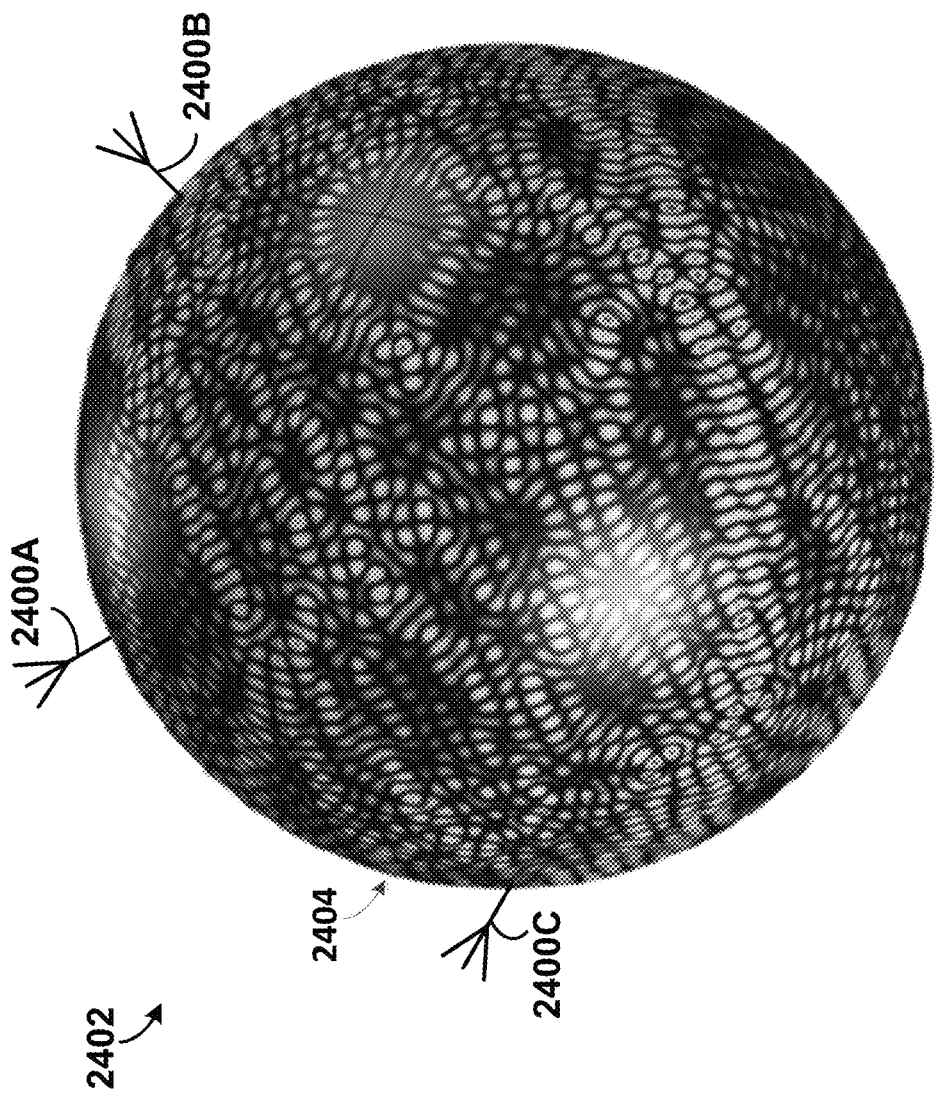
FIG. 24 is a conceptual illustration of standing waves in an Earth-ionosphere waveguide, in accordance with example embodiments.

FIG. 24 illustrates example transmitters 2400A, 2400B, and 2400C generating standing waves in the Earth-ionosphere waveguide 2402, according to an example embodiment. As illustrated, each of the transmitters feeds the standing waves, conceptually represented as wave patterns (e.g., pattern 2404), at different locations. In an embodiment, the transmitters can generate the standing waves such that the waves can follow a specific path in the Earth-ionosphere waveguide 2402. One or more receivers that are also located in the Earth-ionosphere waveguide 2402 can tap into the standing waves to extract energy.

Figure 25:
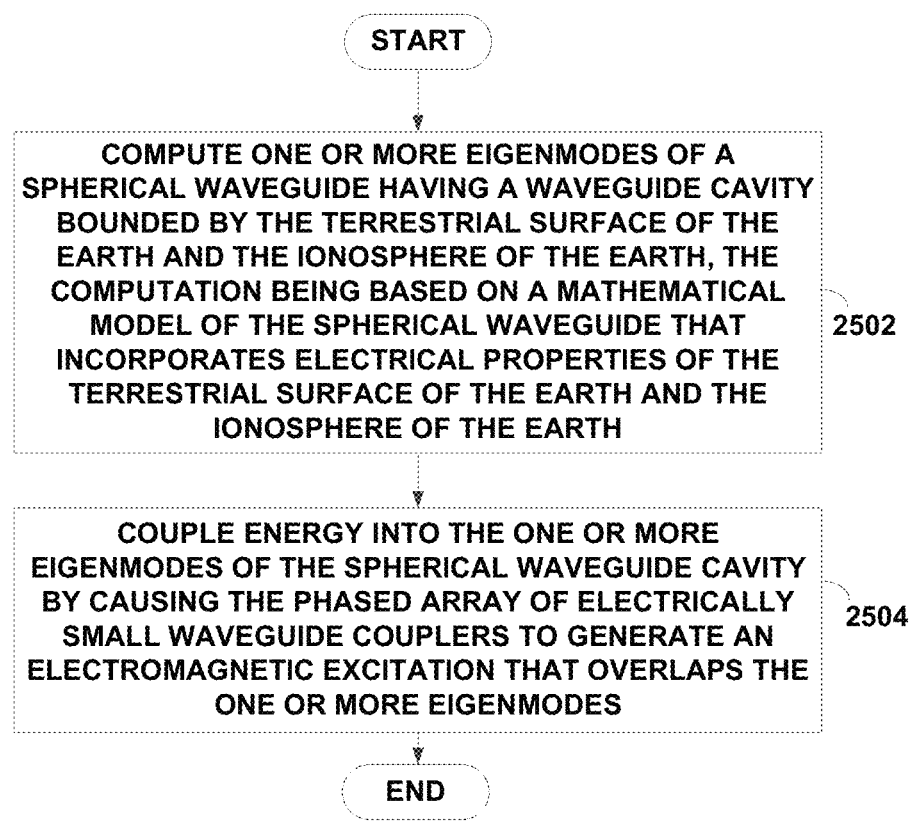
FIG. 25 is flowchart of an example method of coupling to an eigenmode using an array of antenna arrays, in accordance with example embodiments.

FIG. 25 is a flowchart illustrating an example method. Again, as with the other example methods described above and in accordance with example embodiments, the method illustrated in FIG. 25 may be implemented using one or more transmitter apparatuses or devices, one or more receiver apparatuses or devices, and one or more computing systems configured for executing instructions for carrying out various steps and functions described herein.

At step 2502, a computation is made of one or more eigenmodes of a spherical waveguide having a waveguide cavity bounded by the terrestrial surface of the Earth and the ionosphere of the Earth, the computation being based on a mathematical model of the spherical waveguide that incorporates electrical properties of the terrestrial surface of the Earth and the ionosphere of the Earth.

And at step 2504, coupling energy into the one or more eigenmodes of the spherical waveguide cavity, including causing the phased array of electrically small waveguide couplers to generate an electromagnetic excitation that overlaps the one or more eigenmodes.

In accordance with example embodiments, the electromagnetic excitation may be a composite electromagnetic excitation, and coupling energy into the spherical waveguide cavity (in step 2504) may entail determining at least one of a desired amplitude, frequency, and phase of respective electromagnetic excitations generated by two or more of the electrically small waveguide couplers, and determining respective operational configurations for the two or more electrically small waveguide couplers based on the at least one of the desired amplitude, frequency, and phase. Then, the two or more electrically small waveguide couplers may be operated at the respective operational configurations to generate the respective electromagnetic excitations.

In further accordance with example embodiments, a phase relation between the respective electromagnetic excitations of any two of the two or more waveguide couplers may be based on relative geographic locations of the two waveguide couplers.

In accordance with example embodiments, each of the electrically small waveguide couplers may include a respective array of helical waveguide couplers. In further accordance with example embodiments, the electromagnetic excitation may be a composite electromagnetic excitation. With this arrangement, coupling energy into the spherical waveguide cavity (in step 2504) may entail causing two or more of the helical waveguide couplers of two or more of the respective arrays of the helical waveguide couplers to generate respective electromagnetic excitations. In particular, the respective electromagnetic excitations may combine to form the composite electromagnetic excitation.

In further accordance with example embodiments, causing two or more of the helical waveguide couplers of two or more of the respective arrays of the helical waveguide couplers to generate respective electromagnetic excitations may entail determining at least one of a desired amplitude, frequency, and phase of the respective electromagnetic excitations and determining respective operational configurations for the two or more of the helical waveguide couplers based on the at least one of the desired amplitude, frequency, and phase. Then, the two or more of the helical waveguide couplers may be operated at the respective operational configurations to generate the respective electromagnetic excitations.

In accordance with example embodiments, the method in FIG. 25 may further entail receiving information indicative of a reflected signal from a load that is extracting energy from the electromagnetic excitation, and based on the information indicative of the signal, detecting a presence of the load in the spherical waveguide.

IV. Example Systems and Methods for Detection and Determining Location of Loads in the Earth-Ionosphere Waveguide In accordance with example embodiments, the relative phases of arrays of antennas may be dynamically adjusted in order to detect locations at which power is being extracted, and to measure how much is being extracted. That is, detecting the presence and locations of receiver loads.

In an embodiment, a particular transmitter can generate a traveling wave that could be transmitted to a particular receiver. Alternatively, the transmitter can feed into or establish a standing wave in the waveguide. In some examples, the transmitter can periodically switch between contributing a standing wave and sending a traveling wave to a particular receiver.

In an embodiment, controlling each of the transmitters to generate an electromagnetic excitation travels in a particular direction allows the wireless power system to steer power in the Earth-ionosphere waveguide. Specifically, the controller of the system can cause the transmitters to generate electromagnetic excitations that overlap to form an overall electromagnetic excitation that travels in a particular direction. That is, the controller of the system can generate electromagnetic excitations (e.g., standing and traveling) waves with nodes and antinodes (also called nulls) at specific locations. As such, the controller has the ability to steer the overall electromagnetic excitation, and thus the power, towards or away from any location.

In an embodiment, the ability to steer power allows the wireless power system to detect the location of a load that is coupled to the system (whether a stationary or moving load). Within examples, various methods to detect the presence of a load could be based on transmission line theory. Transmission line theory is applicable here because waveguides are a special form of transmission lines, and could be modeled as such. In this analogy, the low-loss eigenmodes along which an electromagnetic excitation is guided is analogous to a transmission line.

In an embodiment, the system could detect the presence of a load by detecting a reflected signal from the load. For instance, the system could transmit a signal (e.g., a pulse) along a low-loss eigenmode. If there is a load coupled to the eigenmode, the load will receive the pulse. Due to impedance mismatches, a reflected signal will be transmitted from the load to the transmitter, and the system can detect the reflected signal. By detecting the reflected signal, the system can detect the presence of the load that is coupled to the eigenmode.

Additionally, the system could determine a location of the detected load. In an embodiment, the system can determine the location based on the reflected signal from the load. Using the transmission line analogy, determining a location of the load is similar to finding a location of a load in a network of transmission lines. For example, after detecting a load, the system can steer power towards the load until the steered power reaches a steady state and a higher "standing wave ratio" (SWR) will be present. Once the power reaches a steady state, the SWR data can be plotted as a function of distance based on the reflection return time. Analyzing the SWR data can indicate approximately the location of the load. Additionally and/or alternatively, the magnitudes and phases and locations of the resulting standing waves can be analyzed to determine the location of the load.

The accuracy of this method of detection increases the more sources and different starting locations from which the pulse signals are sent. Essentially, this method is a linear algebra problem where the unknown is the location of the receiver, and the known values are the characteristics of the pulse and return signals. With enough signals, a best fit of the data can be taken and an accurate measurement can be made.

Figure 26:
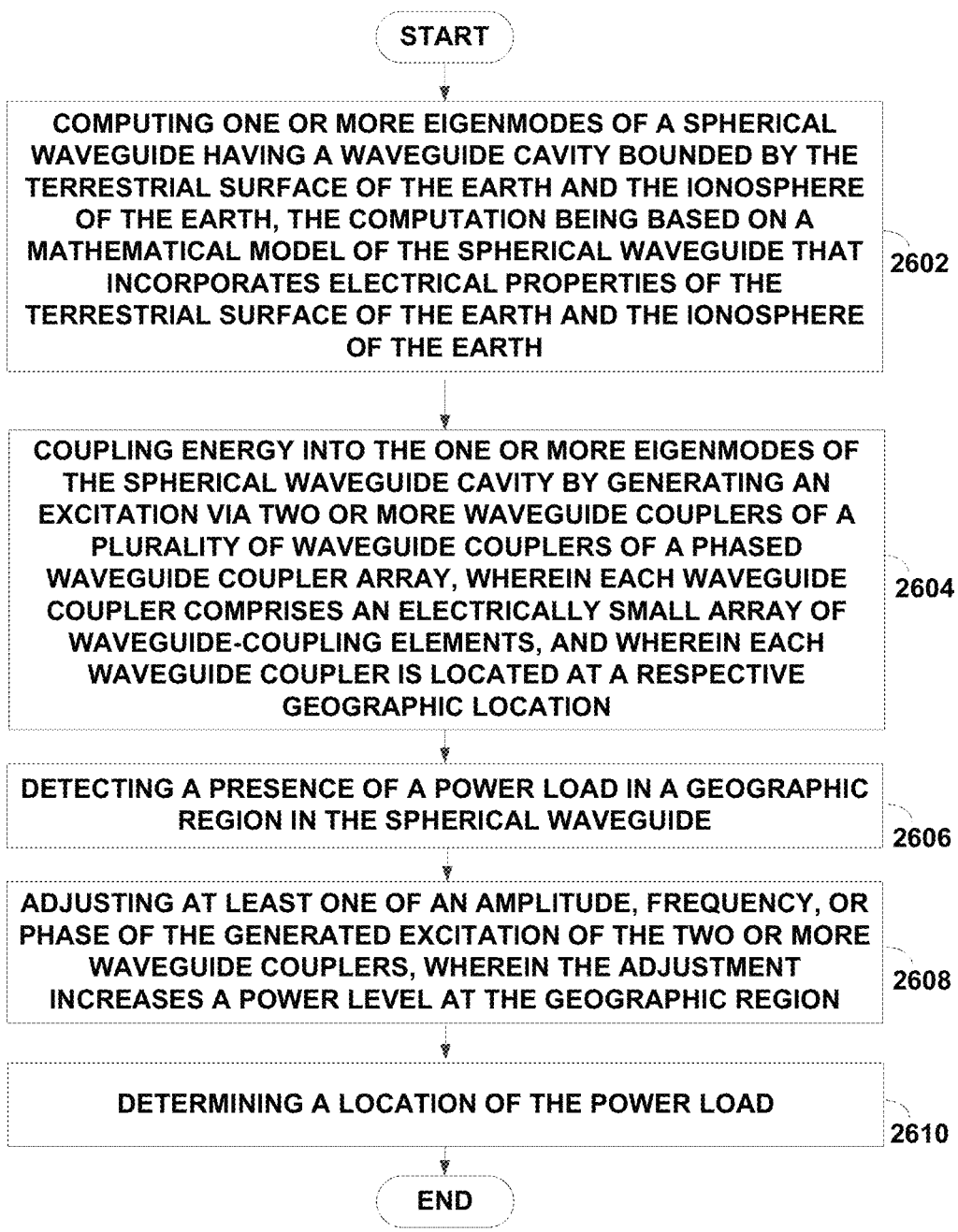
FIG. 26 is flowchart of an example method of detecting the presence of a load, in accordance with example embodiments.

FIG. 26 is a flowchart illustrating an example method. Again, as with the other example methods described above and in accordance with example embodiments, the method illustrated in FIG. 26 could be implemented out using one or more transmitter apparatuses or devices, one or more receiver apparatuses or devices, and one or more computing systems configured for executing instructions for carrying out various steps and functions described herein.

FIG. 26 is a flowchart illustrating an example method, according to an example embodiment. As step 2602, the method can involve computing one or more eigenmodes of a spherical waveguide having a waveguide cavity bounded by the terrestrial surface of the Earth and the ionosphere of the Earth, the computation being based on a mathematical model of the spherical waveguide that incorporates electrical properties of the terrestrial surface of the Earth and the ionosphere of the Earth.

At step 2604, the method can involve coupling energy into the one or more eigenmodes of the spherical waveguide cavity by generating an excitation via two or more waveguide couplers of a plurality of waveguide couplers of a phased waveguide coupler array, wherein each waveguide coupler comprises an electrically small array of waveguide-coupling elements, and wherein each waveguide coupler is located at a respective geographic location;

At step 2606, the method can involve detecting a presence of a power load in a geographic region in the spherical waveguide. In particular, the wireless power system can detect the presence of a power load that is coupled to the waveguide coupler and that is extracting energy from the electromagnetic excitation generated by the wireless power system. In one example, detecting a presence of the power load in the waveguide could involve receiving information indicative of a reflected signal from the load that is extracting energy from the electromagnetic excitation. Then, based on the information indicative of the signal, the wireless power system can detect the presence of the load. For instance, the reflected signal could be at least a threshold different from an expected reflected signal. In another example, detecting a presence of the power load in the waveguide could involve receiving, from at least one strategically placed field probe, information indicative of a field strength of the electromagnetic excitation at one or more given locations. Then, based on the information, the system could detect a presence of a load in the spherical waveguide. In yet another example, the system could analyze the received signals at different receivers, perhaps to determine information indicative of at least one of a magnitude and phase of a respective received signal. Then based on the information, the system could detect a presence of a load in the spherical waveguide. For instance, there could be a threshold difference between the received signals and expected received signals.

At step 2606, the method can involve adjusting at least one of an amplitude, frequency, or phase of the generated excitation of the two or more waveguide couplers so as to increase a power level at the geographic region. That is, the wireless power system can steer power towards a particular location. For instance, the wireless power system can steer power towards the particular location in order to provide power to an authorized receiver. More specifically, the authorized receiver could requesting additional power. Additionally and/or alternatively, the system could detect that the power is below a threshold level in a particular area.

At step 2608, the method then involves determining a location of the power load. In an example, determining the location of the load could involve determining that the power level has reached a steady state, and based on at least one of a magnitude, phase, and location of standing waves that result in the steady state power level, determining a precise location of the load. In another example, determining the location of the load could involve detecting one or more respective reflected signals at the two or more waveguide couplers of the plurality of waveguide couplers, and based on the one or more respective reflected signals, using triangulation to determine the precise location of the load. In yet another example, determining the location of the load could involve determining a magnitude and phase of the electromagnetic excitation at one or more locations; and based at least on (i) the magnitude and phase of the electromagnetic excitation, and (ii) one or more or reflected signals received at the two or more waveguide couplers of the plurality of waveguide couplers, precisely determining the location of the power load.

V. Example Systems and Methods for Controlling Power Levels at Designated Locations in Eigenmodes of Earth-Ionosphere Waveguide In accordance with example embodiments, the relative phases of arrays of antennas may be dynamically adjusted in order to control a level of power that is available at any given geographic location. This can be done by controlling the location of nulls in standing waves, for example. Doing so may allow wireless power delivery to be denied at a particular location (e.g., where illegitimate or unauthorized tapping is occurring) and/or to be enhanced (e.g., where particular legitimate needs are deemed underserved).

In some examples, before determining a location of a load, the system can determine whether the load is an authorized user or a parasitic load. In such scenarios, the system can determine the location of the parasitic loads in order to steer power away from the parasitic loads. In one example, determining whether the load is parasitic can involve detecting unexpected reflection signals from particular loads indicating that either an authorized load is using an unexpected amount of power or that a parasitic load is coupled to the system.

Once the detection occurs, the system or an operator of the system can communicate with known (e.g., authorized) users to determine whether they have been using the unexpected amount of power. If the authorized user can account for the unexpected use, then it is likely that a parasitic load does not exist. Conversely, if the authorized user does not account for the unexpected use, then a parasitic load could exist and further actions could be taken.

In an embodiment, if a parasitic load is detected, the system can respond by steering power away from the location of the parasitic load. For example, the system can adjust the location of the nulls in the standing and/or traveling waves from which the parasitic load is receiving power. As explained above, adjusting the location of the nulls can involve adjusting the electromagnetic excitation generated by one or more of the transmitters using methods described herein.

In an embodiment, the system can actively monitor for parasitic loads using an active feedback loop. The feedback loop can continuously or periodically measure the reflected signals to detect any unexpected use, which can be indicative of unauthorized use. Once the system detects the unexpected use, the system can adjust the standing and/or traveling waves until the feedback loop indicates that the reflected signals have returned to expected levels. Within examples, the feedback loop can rely on additional electric and/or magnetic field measurements outside of those inherent in the transmitters themselves in order to detect unexpected use.

Figure 27:
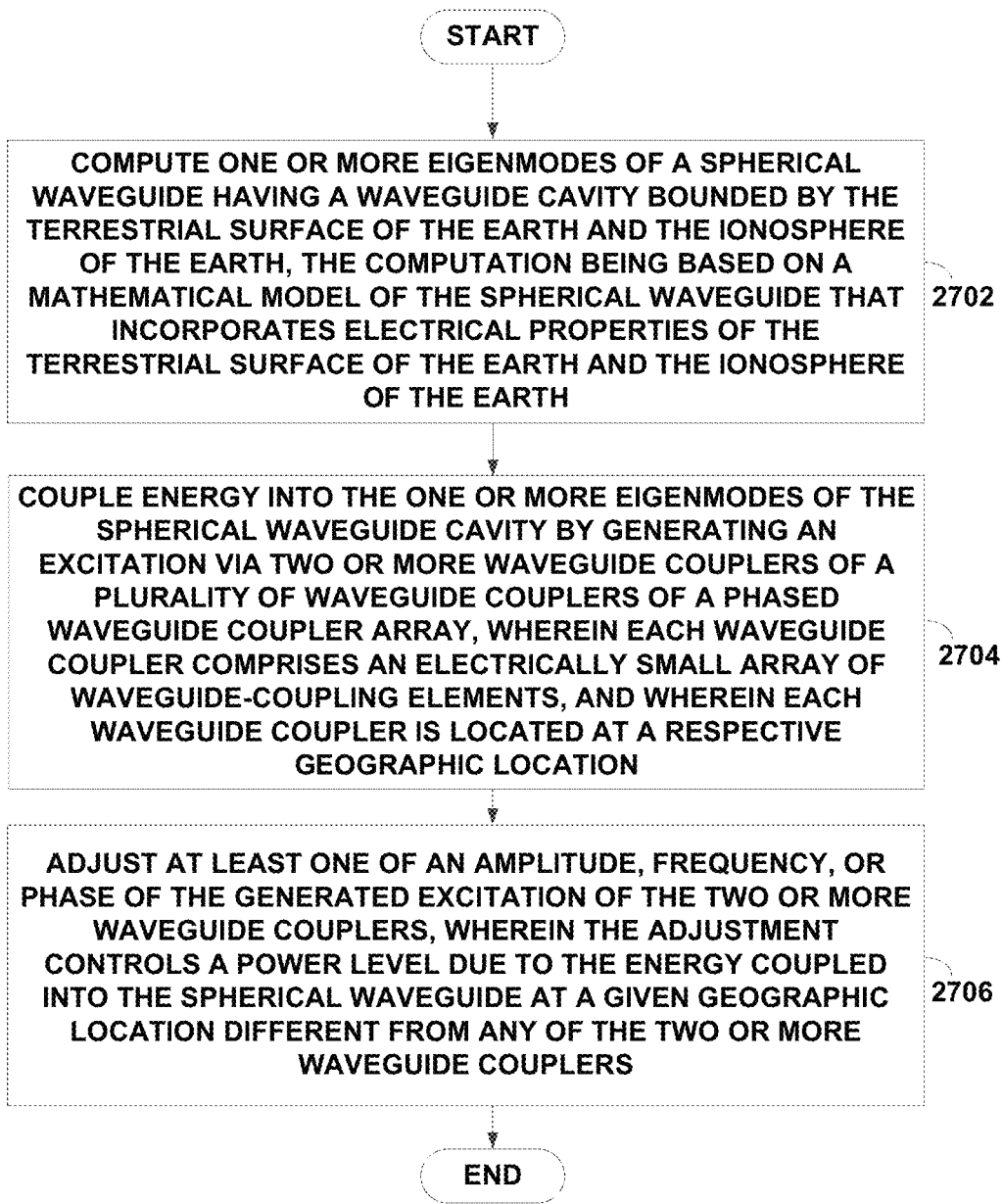
FIG. 27 is flowchart of an example method adjusting the power level at a specific location, in accordance with example embodiments.

FIG. 27 is a flowchart illustrating an example method. As with the other example methods described above and in accordance with example embodiments, the method illustrated in FIG. 27 could be implemented out using one or more transmitter apparatuses or devices, one or more receiver apparatuses or devices, and one or more computing systems configured for executing instructions for carrying out various steps and functions described herein. The computing system 100 illustrated in FIG. 1 is an example of a computing system that could carry out steps and functions of the example methods. Instructions for execution by one or more processors of the computing system could be stored as software, hardware, and/or firmware in a non-transitory computer-readable medium. Thus, steps, operations, and/or functions described herein may be carried out by the computing system when the instructions are executed by one or more processors of the one or more computing systems.

More particularly, the method illustrated in FIG. 27 may involve a phased waveguide coupler array that includes a plurality of waveguide couplers, where each waveguide coupler includes an electrically small array of waveguide-coupling elements, such as electric dipole and/or magnetic (helical) dipole antennas. Each of the plurality of waveguide couplers may be located at different geographic locations. The phased waveguide coupler array—i.e., the plurality of waveguide couplers—may act as described above to wirelessly transmit power in the Earth-ionosphere waveguide by coupling to one or more low-loss eigenmodes.

As step 2701, one or more eigenmodes of the Earth-ionosphere waveguide are compute, where the computation is based on a mathematical model of the spherical waveguide that incorporates electrical properties of the terrestrial surface of the Earth and the ionosphere of the Earth.

At step 2704, energy is coupled into the one or more eigenmodes of the spherical waveguide cavity by generating an excitation via two or more waveguide couplers of a plurality of waveguide couplers of a phased waveguide coupler array. As described above, each waveguide coupler may include an electrically small array of waveguide-coupling elements.

Finally, at step 2706, at least one of an amplitude, frequency, or phase of the generated excitation of the two or more waveguide couplers adjusted in such was as to control a power level at a given geographic location due to the energy coupled into the spherical waveguide. The given geographic location is taken to be different from any of the two or more waveguide couplers.

In accordance with example embodiments, the one or more eigenmodes may form standing waves of an electric and magnetic vector field. In this case, adjusting the at least one of the amplitude, frequency, or phase of the generated excitation of the two or more waveguide couplers may entail determining a relative change in location of at least one power null of the standing waves with respect to the given geographic location such that the power level at the given geographic location will change by a specified amount. Then the at least one of the amplitude, frequency, or phase of the generated excitation of the two or more waveguide couplers may be adjusted to cause the relative change in location of the at least one power null of the standing waves.

In further accordance with example embodiments, adjusting the at least one of the amplitude, frequency, or phase of the generated excitation of the two or more waveguide couplers may entail determining locations of the at least one power null of the standing waves as a function of relative phases between the two or more waveguide couplers, and determining power levels at the given geographic location as a function of position of the at least one power null with respect to the given geographic location.

In accordance with example embodiments, the one or more eigenmodes may form standing waves of an electric and magnetic vector field, and the method of FIG. 27 may further entail detecting an unauthorized power load at the given geographic location. With this arrangement, adjusting the at least one of the amplitude, frequency, or phase of the generated excitation of the two or more waveguide couplers may entail adjusting the at least one of the amplitude, frequency, or phase of the generated excitation of the two or more waveguide couplers to steer at least one power null of the standing waves from a first location to a second location, where the second location is closer to the given geographic location than the first location.

In further accordance with example embodiments, detecting the unauthorized power load at the given geographic location may entail detecting a power load at the given geographic location, and determining that there is no authorized power load at the given geographic location. For example the system detecting the power load and location may consult a database of authorized loads at various locations.

In accordance with example embodiments, the one or more eigenmodes form standing waves of an electric and magnetic vector field, and the method of FIG. 27 may further entail determining that the power level at the given geographic location due to the energy coupled into the spherical waveguide is below a threshold level. With this arrangement, adjusting the at least one of the amplitude, frequency, or phase of the generated excitation of the two or more waveguide couplers may entail adjusting the at least one of the amplitude, frequency, or phase of the generated excitation of the two or more waveguide couplers to steer at least one power null of the standing waves from a first location to a second location, where the second location is further away from the given geographic location than the first location.

In further accordance with example embodiments, determining that the power level at the given geographic location due to the energy coupled into the spherical waveguide is below a threshold level may entail detecting a power load at the given geographic location, and receiving an indication from the power load of the power level at the given geographic location. For example, the power load may communicate with the transmitting system by way of a communications network.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The illustrative embodiments described in the detailed description, figures, and claims are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the ladder diagrams, scenarios, and flow charts in the figures and as discussed herein, each block and/or communication may represent a processing of information and/or a transmission of information in accordance with example embodiments. Alternative embodiments are included within the scope of these example embodiments. In these alternative embodiments, for example, functions described as blocks, transmissions, communications, requests, responses, and/or messages may be executed out of order from that shown or discussed, including substantially concurrent or in reverse order, depending on the functionality involved. Further, more or fewer blocks and/or functions may be used with any of the ladder diagrams, scenarios, and flow charts discussed herein, and these ladder diagrams, scenarios, and flow charts may be combined with one another, in part or in whole.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as non-transitory computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

While various aspects and embodiments have been disclosed herein, other aspects and embodiments will be apparent to those skilled in the art. The various aspects and embodiments disclosed herein are for provided for explanatory purposes and are not intended to be limiting, with the true scope being indicated by the following claims.

What is claimed:
1. A system comprising:
a phased waveguide coupler array comprising a plurality of waveguide couplers, wherein each waveguide coupler comprises an electrically small array of waveguide-coupling elements configured for coupling to a spherical waveguide cavity bounded by the terrestrial surface of the Earth and the ionosphere of the Earth, wherein each waveguide coupler is located at a respective geographic location; and
a computer apparatus having one or more processors and memory storing instructions that, when executed by the one or more processors, cause the system to carry out operations including:
determining one or more eigenmodes of the spherical waveguide;
generating an excitation via two or more waveguide couplers of the plurality of waveguide couplers of the phased waveguide coupler array, wherein said generating causes coupling of energy into the one or more eigenmodes of the spherical waveguide cavity;
detecting a presence of a power load in a geographic region in the spherical waveguide by receiving at least one of: information indicative of a reflected signal from the excitation, or information indicative of measurements of the excitation at one or more known locations; and determining a location of the power load by steering power towards the geographic region by measuring at least one of: one or more reflected signals from the excitation detected by the two or more waveguide couplers of the plurality, standing waves from the excitation at the one or more locations.

2. The system of claim 1, wherein determining the location of the power load further comprises:
detecting one or more respective reflected signals at the two or more waveguide couplers of the plurality of waveguide couplers; and
based on the one or more respective reflected signals, using triangulation to determine the location of the load.

3. The system of claim 1, wherein determining the location of the power load further comprises:
determining a magnitude and phase of the electromagnetic excitation at one or more locations; and
based at least on (i) the magnitude and phase of the electromagnetic excitation, and (ii) one or more or reflected signals received at the two or more waveguide couplers of the plurality of waveguide couplers, determining the location of the power load.

4. The system of claim 1, wherein steering power towards the geographic region comprises:
adjusting at least one of an amplitude, frequency, or phase of the generated excitation of the two or more waveguide couplers, wherein said adjusting steers the power towards the geographic region.

5. The system of claim 4, wherein the one or more eigenmodes form standing waves of an electric and magnetic vector field,
and wherein adjusting the at least one of the amplitude, frequency, or phase of the generated excitation of the two or more waveguide couplers comprises:
determining a relative change in location of at least one power peak of the standing waves with respect to the geographic region such that the power level at the geographic region will increase by a specified amount; and
adjusting the at least one of the amplitude, frequency, or phase of the generated excitation of the two or more waveguide couplers, wherein said adjusting causes the relative change in location of the at least one power peak of the standing waves.

6. The system of claim 5, wherein adjusting the at least one of the amplitude, frequency, or phase of the generated excitation of the two or more waveguide couplers, wherein said adjusting causes the relative change in location of the at least one power peak of the standing waves, comprises:
determining locations of the at least one power peak of the standing waves as a function of relative magnitudes and phases between the two or more waveguide couplers; and
determining power levels at the geographic region as a function of position of the at least one power peak with respect to the geographic region.

7. The system of claim 4, wherein the one or more eigenmodes form standing waves of an electric and magnetic vector field,
and wherein adjusting the at least one of the amplitude, frequency, or phase of the generated excitation of the two or more waveguide couplers, wherein said adjusting steers the power towards the geographic region, comprises:
adjusting the at least one of the amplitude, frequency, or phase of the generated excitation of the two or more waveguide couplers, wherein said adjusting steers at least one power peak of the standing waves from a first location to a second location, wherein the second location is closer to the geographic region than the first location.

8. The system of claim 1, wherein the one or more eigenmodes form standing waves of an electric and magnetic vector field, and wherein the operations further include detecting a power load.

9. The system of claim 8, wherein the geographic region is an estimated location of the power load, and wherein steering the power towards the geographic region comprises:
responsive to detecting the power load, steering the power towards the power load;
determining that the steered power has reached a steady state; and
based on at least one of a magnitude, phase, and location of the standing waves that result in the steady state power, determine a precise location of the load.

10. A system comprising:
a phased waveguide coupler array comprising a plurality of waveguide couplers, wherein each waveguide coupler comprises an electrically small array of waveguide-coupling elements configured for coupling to a spherical waveguide having a waveguide cavity bounded by the terrestrial surface of the Earth and the ionosphere of the Earth, wherein each waveguide coupler is located at a respective geographic location; and
a computer apparatus having one or more processors and memory storing instructions that, when executed by the one or more processors, cause the system to carry out operations including:
computing one or more eigenmodes of the spherical waveguide based on a mathematical model of the spherical waveguide that incorporates electrical properties of the terrestrial surface of the Earth and the ionosphere of the Earth;
coupling power into the one or more eigenmodes via generated excitations of two or more waveguide couplers of the plurality of waveguide couplers of the phased waveguide coupler array, the one or more eigenmodes forming standing waves of an electric and magnetic vector field in the spherical waveguide; and
detecting a presence of a power load in a geographic region in the spherical waveguide by receiving at least one of: information indicative of a reflected signal from the excitation, or information indicative of measurements of the excitation at one or more known locations; and
determining a location of the power load by increasing a power level at the geographic region by measuring at least one of: one or more reflected signals from the excitation detected by the two or more waveguide couplers of the plurality, standing waves from the excitation at the one or more locations.

11. The system of claim 10, wherein determining the location of the power load further comprises:
determining that the power level has reached a steady state; and
based on at least one of a magnitude, phase, and location of standing waves that result in the steady state power level, determine a location of the load.

12. The system of claim 11, wherein steering the location of at least one power peak of the standing waves with respect to the geographic region comprises:

adjusting at least one of an amplitude, frequency, or phase of the generated excitations of the two or more waveguide couplers, wherein said adjusting causes a change in the location of the at least one power peak of the standing waves.

13. The system of claim 12, wherein adjusting the at least one of the amplitude, frequency, or phase of the generated excitation of the two or more waveguide couplers, wherein said adjusting causes the change in location of the at least one power peak of the standing waves, comprises:
   determining locations of the at least one power peak of the standing waves as a function of relative magnitudes and phases between the two or more waveguide couplers; and
   determining power levels at the geographic region as a function of position of the at least one power peak with respect to the geographic region.

14. The system of claim 10, wherein increasing the power level at the geographic region due to the coupled power comprises steering a location of at least one power peak of the standing waves with respect to the geographic region.

15. The system of claim 10, wherein detecting a presence of a power load further comprises:
   receiving, at least one of the two waveguide couplers, information indicative of a reflected signal from a load that is extracting energy from the electromagnetic excitation; and
   based on the information indicative of the signal, detecting the power load.

16. A method comprising:
   computing one or more eigenmodes of a spherical waveguide having a waveguide cavity bounded by the terrestrial surface of the Earth and the ionosphere of the Earth, the computation being based on a mathematical model of the spherical waveguide that incorporates electrical properties of the terrestrial surface of the Earth and the ionosphere of the Earth;
   generating an excitation via two or more waveguide couplers of a plurality of waveguide couplers of a phased waveguide coupler array, wherein each waveguide coupler comprises an electrically small array of waveguide-coupling elements, wherein each waveguide coupler is located at a respective geographic location, and wherein said generating causes coupling of energy into the one or more eigenmodes of the spherical waveguide cavity;
   detecting a presence of a power load in a geographic region in the spherical waveguide; and
   adjusting at least one of an amplitude, frequency, or phase of the generated excitation of the two or more waveguide couplers, wherein said adjusting increases a power level at the geographic region; and
   determining a location of the power load by measuring at least one of: one or more reflected signals from the excitation detected by the two or more waveguide couplers of the plurality, standing waves from the excitation at the one or more locations.

17. The method of claim 16, wherein method determining a location of the power load further comprises:
   determining that the power level has reached a steady state; and
   based on at least one of a magnitude, phase, and location of standing waves that result in the steady state power level, determining a location of the load.

18. The method of claim 16, wherein method determining a location of the power load further comprises:
   detecting one or more respective reflected signals at the two or more waveguide couplers of the plurality of waveguide couplers; and
   based on the one or more respective reflected signals, using triangulation to determine the location of the load.

19. The method of claim 16, wherein the one or more eigenmodes form standing waves of an electric and magnetic vector field,
   and wherein adjusting the at least one of the amplitude, frequency, or phase of the generated excitation of the two or more waveguide couplers, wherein said adjusting increases the power level at the geographic region, comprises:
   determining a relative change in location of at least one power peak of the standing waves with respect to the geographic region such that the power level at the geographic region will increase by a specified amount; and
   adjusting the at least one of the amplitude, frequency, or phase of the generated excitation of the two or more waveguide couplers, wherein said adjusting causes the relative change in location of the at least one power peak of the standing waves.

20. The method of claim 19, wherein adjusting the at least one of the amplitude, frequency, or phase of the generated excitation of the two or more waveguide couplers, wherein said adjusting causes the relative change in location of the at least one power peak of the standing waves, comprises:
   determining locations of the at least one power peak of the standing waves as a function of relative magnitudes and phases between the two or more waveguide couplers; and
   determining power levels at the given geographic location as a function of position of the at least one power peak with respect to the given geographic location.

* * * * *